(12) United States Patent
Sano et al.

(10) Patent No.: US 12,211,557 B2
(45) Date of Patent: Jan. 28, 2025

(54) SEMICONDUCTOR MEMORY DEVICE

(71) Applicant: Kioxia Corporation, Tokyo (JP)

(72) Inventors: Kyosuke Sano, Kamakura (JP);
Kazutaka Ikegami, Inagi (JP); Takashi Maeda, Kamakura (JP)

(73) Assignee: Kioxia Corporation, Tokyo (JP)

( * ) Notice: Subject to any disclaimer, the term of this patent is extended or adjusted under 35 U.S.C. 154(b) by 153 days.

(21) Appl. No.: 18/176,507

(22) Filed: Mar. 1, 2023

(65) Prior Publication Data
US 2024/0046995 A1 Feb. 8, 2024

(30) Foreign Application Priority Data
Aug. 2, 2022 (JP) .................... 2022-123623

(51) Int. Cl.
| | |
|---|---|
| *G11C 16/14* | (2006.01) |
| *G11C 16/08* | (2006.01) |
| *G11C 16/26* | (2006.01) |
| *G11C 16/34* | (2006.01) |
| *G11C 16/04* | (2006.01) |

(Continued)

(52) U.S. Cl.
CPC .............. *G11C 16/14* (2013.01); *G11C 16/08* (2013.01); *G11C 16/26* (2013.01); *G11C 16/3459* (2013.01); *G11C 16/0483* (2013.01); *H10B 41/35* (2023.02); *H10B 41/41* (2023.02)

(58) Field of Classification Search
CPC ......... G11C 16/14; G11C 16/18; G11C 16/26; G11C 6/3459; H10B 41/35; H10B 41/41
See application file for complete search history.

(56) References Cited

U.S. PATENT DOCUMENTS

| | | | |
|---|---|---|---|
| 2007/0158736 A1* | 7/2007 | Arai | H10B 43/20 257/E21.679 |
| 2015/0340369 A1* | 11/2015 | Lue | G11C 16/10 365/185.17 |
| 2017/0271021 A1 | 9/2017 | Futatsuyama et al. | |

(Continued)

FOREIGN PATENT DOCUMENTS

| | | |
|---|---|---|
| JP | 2017-168163 A | 9/2017 |
| JP | 2018-164070 A | 10/2018 |
| JP | 2020-198141 A | 12/2020 |

OTHER PUBLICATIONS

U.S. Appl. No. 17/816,836, filed Aug. 2, 2022, Ikegami et al.

*Primary Examiner* — Han Yang
(74) *Attorney, Agent, or Firm* — Oblon, McClelland, Maier & Neustadt, L.L.P.

(57) ABSTRACT

A semiconductor memory device includes a first memory pillar and a sequencer. The first memory pillar is sandwiched between a first word line and a second word line, sandwiched between a third word line and a fourth word line, sandwiched between a fifth word line and a sixth word line, includes a first memory cell facing the first word line, a second memory cell facing the second word line, a third memory cell facing the third word line, a fourth memory cell facing the fourth word line, a fifth memory cell facing the fifth word line and a sixth memory cell facing the sixth word line. The sequencer executes an erase operation on the first to sixth memory cells to enable execution of a primary write operation for the first memory cell and a primary write operation for the second memory cell at different timings.

13 Claims, 58 Drawing Sheets

(51) Int. Cl.
  *H10B 41/35* (2023.01)
  *H10B 41/41* (2023.01)

(56) References Cited

U.S. PATENT DOCUMENTS

| | | |
|---|---|---|
| 2018/0277565 A1 | 9/2018 | Futatsuyama et al. |
| 2020/0381067 A1 | 12/2020 | Maeda |
| 2022/0084608 A1 | 3/2022 | Nakazawa et al. |
| 2022/0284962 A1 | 9/2022 | Ikegami et al. |

* cited by examiner

PRIOR ART

PRIOR ART

1st write operation

FIG. 22

| Name of operation | | STEP1 | | | | STEP2 | | | | STEP3 | | | |
|---|---|---|---|---|---|---|---|---|---|---|---|---|---|
| | | STEP1A | STEP1B | STEP1C | STEP1D | STEP2A | STEP2B | STEP2C | STEP2D | STEP3A | STEP3B | STEP3C | STEP3D |
| | | EPV | EPP | EPV | EPP | EPV | EPP | EPV | EPP | EPV | EPP | EPV | EPP |
| Number of times | | N | | | | N | | | | N | | | |
| SGD0 | | VFY | VSG | VSS | VSS | VSS | VSS | VSS | VSS | VSS | VSS | VSS | VSS |
| SGD1 | | VSS | VSS | VFY | VSG | VSS | VSS | VSS | VSS | VSS | VSS | VSS | VSS |
| SGD2 | | VSS | VSS | VSS | VSS | VFY | VSG | VSS | VSS | VSS | VSS | VSS | VSS |
| SGD3 | | VSS | VSS | VSS | VSS | VSS | VSS | VFY | VSG | VSS | VSS | VSS | VSS |
| SGD4 | | VSS | VSS | VSS | VSS | VSS | VSS | VSS | VSS | VFY | VSG | VSS | VSS |
| SGD5 | | VSS | VSS | VSS | VSS | VSS | VSS | VSS | VSS | VSS | VSS | VFY | VSG |
| WLe | | V | US | V | US | V | US | V | US | V | US | V | US |
| WLo | | US | P | US | P | US | P | US | P | US | P | US | P |
| GR1 | | S | S | S | S | S | S | S | S | S | S | S | S |
| GR2 | | US | US | US | US | US | US | US | US | US | US | US | US |

| EPV | EP Verify | P | | VPRG | |
|---|---|---|---|---|---|
| EPP | EP Program | S | | SELECT | |
| VFY | VSGVFY | US | | UNSELECT | |
| V | VVFY | | | | |

FIG. 29

|  |  | SGD0 | SGD1 | SGD2 | SGD3 | SDG4 | SGD5 |
|---|---|---|---|---|---|---|---|
| WL7 | 1st | 1 | (1,2) | 2 | (2,3) | 3 | (1,3) |
|  | 2nd | 5 | 10 | 7 | 11 | 9 | 12 |
|  | 3rd | 22 | 25 | 23 | 26 | 24 | 27 |
| WL6 | 1st | 4 | (4,6) | 6 | (6,8) | 8 | (4,8) |
|  | 2nd | 14 | 19 | 16 | 20 | 18 | 21 |
|  | 3rd | 37 | 40 | 38 | 41 | 39 | 42 |
| WL5 | 1st | 13 | (13,15) | 15 | (15,17) | 17 | (13,17) |
|  | 2nd | 29 | 34 | 31 | 35 | 33 | 36 |
|  | 3rd | 52 | 55 | 53 | 56 | 54 | 57 |
| WL4 | 1st | 28 | (28,30) | 30 | (30,32) | 32 | (28,32) |
|  | 2nd | 44 | 49 | 46 | 50 | 48 | 51 |
|  | 3rd |  |  |  |  |  |  |
| WL3 | 1st | 43 | (43,45) | 45 | (45,47) | 47 | (43,47) |
|  | 2nd |  |  |  |  |  |  |
|  | 3rd |  |  |  |  |  |  |
| ⋮ |  |  |  |  |  |  |  |
|  |  |  |  |  |  |  |  |
|  |  |  |  |  |  |  |  |
| WL0 | 1st |  |  |  |  |  |  |
|  | 2nd |  |  |  |  |  |  |
|  | 3rd |  |  |  |  |  |  |

FIG. 32

| Name of operation | | Number of times | Select gate line | Select word line | Select bit line |
|---|---|---|---|---|---|
| Primary write operation (1st write operation) | EP Veraion | N | SGDn (for example, SGD0) | WLe | GR2 (for example, BL1 to 3) |
| | EP Program | | SGDn (for example, SGD0) | WLe | GR2 (for example, L1 to 3) |
| | EP Verify | N | SGDn+1 (for example, SGD1) | WLo | GR2 (for example, BL1 to 3) |
| | EP Program | | SGDn+1 (for example, SGD1) | WLo | GR2 (for example, BL1 to 3) |
| | EP Verify | N | SGDn (for example, SGD0) | WLe | GR1 (for example, BL0) |
| | EP Program | | SGDn (for example, SGD0) | WLe | GR1 (for example, BL0) |
| | EP Verify | N | SGDn+1 (for example, SGD1) | WLo | GR1 (for example, BL0) |
| | EP Program | | SGDn+1 (for example, SGD1) | WLo | GR1 (for example, BL0) |
| Secondary write operation (2nd write operation) | Program | | SGDn (for example, SGD0) | WLe | GR1+GR2 (for example, BL0 to 3) |
| | Verify | | SGDn (for example, SGD0) | WLe | GR1+GR2 (for example, BL0 to 3) |
| Tertiary write operation (3rd write operation) | Program | | SGDn (for example, SGD0) | WLe | GR1+GR2 (for example, BL0 to 3) |
| | Verify | | SGDn (for example, SGD0) | WLe | GR1+GR2 (for example, BL0 to 3) |

Order of operation →

FIG. 33A

| Number of times | | Name of operation | Select gate line | Select word line | Select bit line | Order of operation |
|---|---|---|---|---|---|---|
| Primary write operation (1st write operation) | | EP Program | SGDn (for example, SGD0) | WLe | GR2 (for example, BL1 to 3) | ⇩ |
| | N | EP Verify | SGDn (for example, SGD0) | WLe | GR2 (for example, BL1 to 3) | |
| | | EP Program | SGDn+1 (for example, SGD1) | WLo | GR2 (for example, BL1 to 3) | |
| | N | EP Verify | SGDn+1 (for example, SGD1) | WLo | GR2 (for example, BL1 to 3) | |
| | | EP Program | SGDn (for example, SGD0) | WLe | GR1 (for example, BL0) | |
| | N | EP Verify | SGDn (for example, SGD0) | WLe | GR1 (for example, BL0) | |
| | | EP Program | SGDn+1 (for example, SGD1) | WLo | GR1 (for example, BL0) | |
| | N | EP Verify | SGDn+1 (for example, SGD1) | WLo | GR1 (for example, BL0) | |

FIG. 33B

| Number of times | | Name of operation | Select gate line | Select word line | Select bit line | Order of operation |
|---|---|---|---|---|---|---|
| Primary write operation (1st write operation) | N | EP Verify | SGDn (for example, SGD0) | WLe | GR2 (for example, BL1 to 3) | ↓ |
| | | EP Verify | SGDn+1 (for example, SGD1) | WLo | GR2 (for example, BL1 to 3) | |
| | N | EP Program | SGDn (for example, SGD0) | WLe | GR2 (for example, BL1 to 3) | |
| | | EP Program | SGDn+1 (for example, SGD1) | WLo | GR2 (for example, BL1 to 3) | |
| | N | EP Verify | SGDn (for example, SGD0) | WLe | GR1 (for example, BL0) | |
| | | EP Verify | SGDn+1 (for example, SGD1) | WLo | GR1 (for example, BL0) | |
| | N | EP Program | SGDn (for example, SGD0) | WLe | GR1 (for example, BL0) | |
| | | EP Program | SGDn+1 (for example, SGD1) | WLo | GR1 (for example, BL0) | |

FIG. 33C

| Number of times | | Name of operation | Select gate line | Select word line | Select bit line | Order of operation |
|---|---|---|---|---|---|---|
| Primary write operation (1st write operation) | N | EP Program | SGDn (for example, SGD0) | WLe | GR2 (for example, BL1 to 3) | ↓ |
| | | EP Program | SGDn+1 (for example, SGD1) | WLo | GR2 (for example, BL1 to 3) | |
| | N | EP Verify | SGDn (for example, SGD0) | WLe | GR2 (for example, BL1 to 3) | |
| | | EP Verify | SGDn+1 (for example, SGD1) | WLo | GR2 (for example, BL1 to 3) | |
| | N | EP Program | SGDn (for example, SGD0) | WLe | GR1 (for example, BL0) | |
| | | EP Program | SGDn+1 (for example, SGD1) | WLo | GR1 (for example, BL0) | |
| | N | EP Verify | SGDn (for example, SGD0) | WLe | GR1 (for example, BL0) | |
| | | EP Verify | SGDn+1 (for example, SGD1) | WLo | GR1 (for example, BL0) | |

FIG. 35

|  |  | SGD0 | SGD1 | SGD2 | SGD3 | SDG4 | SGD5 |
|---|---|---|---|---|---|---|---|
| WL7 | 1st | 1 | (1,3) | 3 | (3,5) | 5 | (1,5) |
|  | 2nd | 2 | 7 | 4 | 8 | 6 | 9 |
|  | 3rd | 19 | 22 | 20 | 23 | 21 | 24 |
| WL6 | 1st | 10 | (10,12) | 12 | (12,14) | 14 | (10,14) |
|  | 2nd | 11 | 16 | 13 | 17 | 15 | 18 |
|  | 3rd | 34 | 37 | 35 | 38 | 36 | 39 |
| WL5 | 1st | 25 | (25,27) | 27 | (27,29) | 29 | (25,29) |
|  | 2nd | 26 | 31 | 28 | 32 | 30 | 33 |
|  | 3rd |  |  |  |  |  |  |
| WL4 | 1st |  |  |  |  |  |  |
|  | 2nd |  |  |  |  |  |  |
|  | 3rd |  |  |  |  |  |  |
| WL3 | 1st |  |  |  |  |  |  |
|  | 2nd |  |  |  |  |  |  |
|  | 3rd |  |  |  |  |  |  |
| ⋮ |  |  |  |  |  |  |  |
|  |  |  |  |  |  |  |  |
|  |  |  |  |  |  |  |  |
| WL0 | 1st |  |  |  |  |  |  |
|  | 2nd |  |  |  |  |  |  |
|  | 3rd |  |  |  |  |  |  |

FIG. 37

| Name of operation | STEP1 (STEP1A+ STEP1C) | | STEP2 (STEP2A+ STEP2C) | | STEP3 (STEP3A+ STEP3C) | | STEP4 (STEP1B+ STEP2D) | | STEP5 (STEP2B+ STEP3D) | | STEP6 (STEP1D+ STEP3B) | |
|---|---|---|---|---|---|---|---|---|---|---|---|---|
| | EPV | EPP | EPV | EPP | EPV | EPP | EPV | EPP | EPV | EPP | EPV | EPP |
| Number of times | N | | N | | N | | N | | N | | N | |
| SGD0 | VFY | VSG | VSS | VSS | VSS | VSS | VSS | VSS | VSS | VSS | VSS | VSS |
| SGD1 | VSS | VSS | VSS | VSS | VSS | VSS | VFY | VSG | VSS | VSS | VSS | VSS |
| SGD2 | VSS | VSS | VFY | VSG | VSS | VSS | VSS | VSS | VSS | VSS | VSS | VSS |
| SGD3 | VSS | VSS | VSS | VSS | VSS | VSS | VSS | VSS | VFY | VSG | VSS | VSS |
| SGD4 | VSS | VSS | VSS | VSS | VFY | VSG | VSS | VSS | VSS | VSS | VSS | VSS |
| SGD5 | VSS | VSS | VSS | VSS | VSS | VSS | VSS | VSS | VSS | VSS | VFY | VSG |
| WLe | V | P | V | P | V | P | US | US | US | US | US | US |
| WLo | US | US | US | US | US | US | V | P | V | P | V | P |
| GR1 | S | S | S | S | S | S | S | S | S | S | S | S |
| GR2 | | | | | | | | | | | | |

| EPV | EP Verify | P | VPRG |
|---|---|---|---|
| EPP | EP Program | S | SELECT |
| VFY | VSGVFY | US | UNSELECT |
| V | VVFY | | |

FIG. 38

|  |  | SGD0 | SGD1 | SGD2 | SGD3 | SDG4 | SGD5 |
|---|---|---|---|---|---|---|---|
| WL7 | 1st | 1 | 4 | 2 | 5 | 3 | 6 |
|  | 2nd | 9 | 15 | 11 | 17 | 12 | 18 |
|  | 3rd | 31 | 34 | 32 | 35 | 33 | 36 |
| WL6 | 1st | 13 | 7 | 14 | 10 | 16 | 8 |
|  | 2nd | 21 | 27 | 23 | 29 | 24 | 30 |
|  | 3rd | 49 | 52 | 50 | 53 | 51 | 54 |
| WL5 | 1st | 25 | 19 | 26 | 22 | 28 | 20 |
|  | 2nd | 39 | 45 | 41 | 47 | 42 ● | 48 ● |
|  | 3rd | 67 | 70 | 68 | 71 | 69 | 72 |
| WL4 | 1st | 43 | 37 | 44 | 40 | 46 | 38 |
|  | 2nd | 57 | 63 | 59 | 65 | 60 | 66 |
|  | 3rd |  |  |  |  |  |  |
| WL3 | 1st | 61 | 55 | 62 | 58 | 64 | 56 |
|  | 2nd |  |  |  |  |  |  |
|  | 3rd |  |  |  |  |  |  |
| ⋮ |  |  |  |  |  |  |  |
|  |  |  |  |  |  |  |  |
|  |  |  |  |  |  |  |  |
| WL0 | 1st |  |  |  |  |  |  |
|  | 2nd |  |  |  |  |  |  |
|  | 3rd |  |  |  |  |  |  |

FIG. 45

| Name of operation | STEP1 | | | | STEP2 | | | | STEP3 | | | |
|---|---|---|---|---|---|---|---|---|---|---|---|---|
| | STEP1E (STEP1A+ STEP1C) | | STEP1F | | STEP2E (STEP2A+ STEP2C) | | STEP2F | | STEP3E (STEP3A+ STEP3C) | | STEP3F | |
| | EPV | EPP | EPV | EPP | EPV | EPP | EPV | EPP | EPV | EPP | EPV | EPP |
| Number of times | N | N | N | | N | N | N | | N | N | N | |
| SGD0 | VFY | VSG | VFY | VSG | VSS | VSS | VSS | VSS | VSS | VSS | VSS | VSS |
| SGD1 | VSS | VSS | VSS | VSS | VSS | VSS | VSS | VSS | VSS | VSS | VSS | VSS |
| SGD2 | VSS | VSS | VSS | VSS | VFY | VSG | VFY | VSG | VSS | VSS | VSS | VSS |
| SGD3 | VSS | VSS | VSS | VSS | VSS | VSS | VSS | VSS | VSS | VSS | VSS | VSS |
| SGD4 | VSS | VSS | VSS | VSS | VSS | VSS | VSS | VSS | VFY | VSG | VFY | VSG |
| SGD5 | VSS | VSS | VSS | VSS | VSS | VSS | VSS | VSS | VSS | VSS | VSS | VSS |
| WLe | V | P | US | US | V | P | US | US | V | P | US | US |
| WLo | US | US | V | P | US | US | V | P | US | US | V | P |
| GR1 | S | | | | S | | | | S | | | |
| GR2 | | | | | | | | | | | | |

| EPV | EP Verify | P | VPRG |
|---|---|---|---|
| EPP | EP Program | S | SELECT |
| VFY | VSGVFY | US | UNSELECT |
| V | VVFY | | |

FIG. 46

|  |  | SGD0 | SGD1 | SGD2 | SGD3 | SDG4 | SGD5 |
|---|---|---|---|---|---|---|---|
| WL7 | 1st | 1 | (1,2) | 2 | (2,3) | 3 | (1,3) |
|  | 2nd | 5 | 10 | 7 | 11 | 9 | 12 |
|  | 3rd | 22 | 25 | 23 | 26 | 24 | 27 |
| WL6 | 1st | 4 | (4,6) | 6 | (6,8) | 8 | (4,8) |
|  | 2nd | 14 | 19 | 16 | 20 | 18 | 21 |
|  | 3rd | 37 | 40 | 38 | 41 | 39 | 42 |
| WL5 | 1st | 13 | (13,15) | 15 | (15,17) | 17 | (13,17) |
|  | 2nd | 29 | 34 | 31 | 35 | 33 | 36 |
|  | 3rd | 52 | 55 | 53 | 56 | 54 | 57 |
| WL4 | 1st | 28 | (28,30) | 30 | (30,32) | 32 | (28,32) |
|  | 2nd | 44 | 49 | 46 | 50 | 48 | 51 |
|  | 3rd |  |  |  |  |  |  |
| WL3 | 1st | 43 | (43,45) | 45 | (45,47) | 47 | (43,47) |
|  | 2nd |  |  |  |  |  |  |
|  | 3rd |  |  |  |  |  |  |
| ⋮ |  |  |  |  |  |  |  |
|  |  |  |  |  |  |  |  |
|  |  |  |  |  |  |  |  |
| WL0 | 1st |  |  |  |  |  |  |
|  | 2nd |  |  |  |  |  |  |
|  | 3rd |  |  |  |  |  |  |

FIG. 53

| Name of operaion | | Number of times | Select gate line | Select word line | Select bit line |
|---|---|---|---|---|---|
| Primary write operartion (1st write operation) | EP Verify | N | SGDn (for example, SGD0) | WLe | GR1+GR2 (for example, BL0 to 3) |
| | EP Program | | SGDn (for example, SGD0) | WLe | GR1+GR2 (for example, BL0 to 3) |
| | EP Verify | | SGDn (for example, SGD0) | WLo | GR1+GR2 (for example, BL0 to 3) |
| | EP Program | | SGDn (for example, SGD0) | WLo | GR1+GR2 (for example, BL0 to 3) |
| Secondary write operation (2nd write operation) | Program | N | SGDn (for example, SGD0) | WLe | GR1+GR2 (for example, BL0 to 3) |
| | Verify | | SGDn (for example, SGD0) | WLe | GR1+GR2 (for example, BL0 to 3) |
| Tertiary write operation (3rd write operation) | Program | N | SGDn (for example, SGD0) | WLe | GR1+GR2 (for example, BL0 to 3) |
| | Verify | | SGDn (for example, SGD0) | WLe | GR1+GR2 (for example, BL0 to 3) |

Order of operation →

FIG. 54

| Name of operation | STEP1E (STEP1A+ STEP1C) | | STEP2E (STEP2A+ STEP2C) | | STEP3E (STEP3A+ STEP3C) | | STEP4E (STEP1B+ STEP2D) | | STEP5E (STEP2B+ STEP3D) | | STEP6E (STEP1D+ STEP3B) | |
|---|---|---|---|---|---|---|---|---|---|---|---|---|
| | EPV | EPP | EPV | EPP | EPV | EPP | EPV | EPP | EPV | EPP | EPV | EPP |
| Number of times | N | | | | | | | | | | | |
| SGD0 | VFY | VSG | VSS | VSS | VSS | VSS | VSS | VSS | VSS | VSS | VSS | VSS |
| SGD1 | VSS | VSS | VSS | VSS | VSS | VSS | VFY | VSG | VSS | VSS | VSS | VSS |
| SGD2 | VSS | VSS | VFY | VSG | VSS | VSS | VSS | VSS | VSS | VSS | VSS | VSS |
| SGD3 | VSS | VSS | VSS | VSS | VSS | VSS | VSS | VSS | VFY | VSG | VSS | VSS |
| SGD4 | VSS | VSS | VSS | VSS | VFY | VSG | VSS | VSS | VSS | VSS | VSS | VSS |
| SGD5 | VSS | VSS | VSS | VSS | VSS | VSS | VSS | VSS | VSS | VSS | VFY | VSG |
| WLe | V | P | V | P | V | P | US | US | US | US | US | US |
| WLo | US | US | US | US | US | US | V | P | V | P | V | P |
| GR1 | S | S | S | S | S | S | S | S | S | S | S | S |
| GR2 | S | S | S | S | S | S | S | S | S | S | S | S |

| EPV | EP Verify | P | VPRG |
|---|---|---|---|
| EPP | EP Program | S | SELECT |
| VFY | VSGVFY | US | UNSELECT |
| V | VVFY | | |

FIG. 55

|     |     | SGD0 | SGD1 | SGD2 | SGD3 | SDG4 | SGD5 |
|---|---|---|---|---|---|---|---|
| WL7 | 1st | 1 | (1) | (1) | (1) | (1) | (1) |
|     | 2nd | 3 | 6 | 4 | 7 | 5 | 8 |
|     | 3rd | 16 | 19 | 17 | 20 | 18 | 21 |
| WL6 | 1st | 2 | (2) | (2) | (2) | (2) | (2) |
|     | 2nd | 10 | 13 | 11 | 14 | 12 | 15 |
|     | 3rd | 29 | 32 | 30 | 33 | 31 | 34 |
| WL5 | 1st | 9 | (9) | (9) | (9) | (9) | (9) |
|     | 2nd | 23 | 26 | 24 | 27 | 25 | 28 |
|     | 3rd | 42 | 45 | 43 | 46 | 44 | 47 |
| WL4 | 1st | 22 | (22) | (22) | (22) | (22) | (22) |
|     | 2nd | 36 | 39 | 37 | 40 | 38 | 41 |
|     | 3rd |   |   |   |   |   |   |
| WL3 | 1st | 35 | (35) | (35) | (35) | (35) | (35) |
|     | 2nd |   |   |   |   |   |   |
|     | 3rd |   |   |   |   |   |   |
| ⋮   |     |   |   |   |   |   |   |
|     |     |   |   |   |   |   |   |
|     |     |   |   |   |   |   |   |
| WL0 | 1st |   |   |   |   |   |   |
|     | 2nd |   |   |   |   |   |   |
|     | 3rd |   |   |   |   |   |   |

SEMICONDUCTOR MEMORY DEVICE

CROSS-REFERENCE TO RELATED APPLICATION(S)

This application is based upon and claims the benefit of priority from the prior Japanese Patent Application No. 2022-123623, filed on Aug. 2, 2022, the entire contents of which are incorporated herein by reference.

FIELD

Embodiments described herein relate generally to a semiconductor memory device.

BACKGROUND

A NAND flash memory is known as a non-volatile semiconductor memory device.

BRIEF DESCRIPTION OF THE DRAWINGS

FIG. 22 is a diagram for explaining a primary write operation of the semiconductor memory device according to the first embodiment.

FIG. 29 is a diagram illustrating a write order of the semiconductor memory device according to the first embodiment.

FIG. 32 is a diagram illustrating a write sequence of the semiconductor memory device according to the first embodiment.

FIG. 33A shows a sequence of the primary write operation of the semiconductor memory device according to the first embodiment.

FIG. 33B shows the sequence of the primary write operation of the semiconductor memory device according to the first embodiment.

FIG. 33C shows the sequence of the primary write operation of the semiconductor memory device according to the first embodiment.

FIG. 35 is a diagram illustrating a write order of the semiconductor memory device according to the second embodiment.

FIG. 37 is a diagram for explaining a primary write operation of the semiconductor memory device according to a third embodiment.

FIG. 38 is a diagram illustrating a write order of the semiconductor memory device according to the third embodiment.

FIG. 45 is a diagram for explaining a primary write operation of the semiconductor memory device according to a fourth embodiment.

FIG. 46 is a diagram illustrating a write order of the semiconductor memory device according to the fourth embodiment.

FIG. 53 is a diagram illustrating a write sequence of the semiconductor memory device according to the fourth embodiment.

FIG. 54 is a diagram for explaining a primary write operation of the semiconductor memory device according to a fifth embodiment.

FIG. 55 is a diagram illustrating a write order of the semiconductor memory device according to the fifth embodiment.

DETAILED DESCRIPTION

Figure 1:
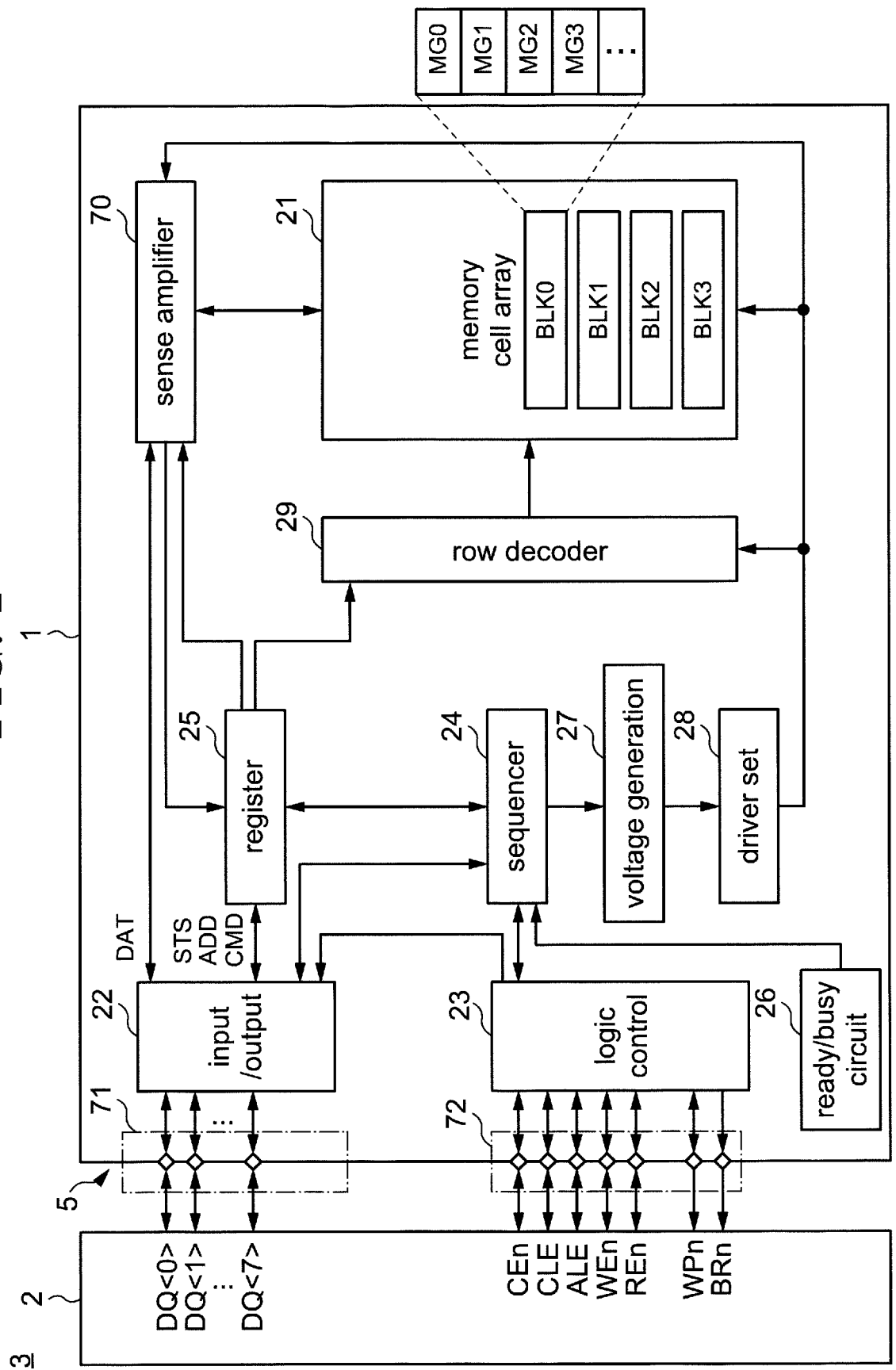
FIG. 1 is a block diagram illustrating a configuration of a memory system including a semiconductor memory device according to a first embodiment.

An object of the present disclosure is to provide a semiconductor memory device capable of suppressing the spread of a threshold distribution after a write operation to a memory cell.

A semiconductor memory device according to one embodiment includes a first bit line arranged in a first direction and extending in a second direction crossing the first direction, a first word line provided in a first layer extending in the first direction and the second direction, a second word line provided in the first layer and controlled independently of the first word line, a third word line extending in the first direction and the second direction and provided in a second layer adjacent to the first layer, a fourth word line provided in the second layer and controlled independently of the third word line, a fifth word line extending in the first direction and the second direction and provided in a third layer adjacent to the first layer on a side opposite to a side adjacent to the second layer, a sixth word line provided in the third layer and controlled independently of the fifth word line, a first memory cell facing one word line, a second memory cell facing the second word line, a third memory cell facing the third word line, a fourth memory cell facing the fourth word line, a fifth memory cell facing the fifth word line, a sixth memory cell facing the sixth word line, a first memory pillar sandwiched between the first word line and the second word line, sandwiched between the third word line and the fourth word line, sandwiched between the fifth word line and the sixth word line, including the first memory cell, the second memory cell, the third memory cell, the fourth memory cell, the fifth memory cell and the sixth memory cell, electrically connected to the first bit line and extending in a third direction crossing the first direction and the second direction, a first selection transistor electrically connected in series to the third memory cell, the first memory cell, and the fifth memory cell, a second select transistor electrically connected in series to the fourth memory cell, the second memory cell, and the sixth memory cell, a first select gate line stacked in the third direction, extending in the first direction, and electrically connected to a first select transistor, a second select gate line stacked in the third direction, extending in the first direction, and electrically connected to the second select transistor, and a sequencer configured to execute an erase operation to set a threshold voltage in an erased state to be equal to or higher than a minimum voltage supplied during a reading operation for the first to sixth memory cells, a primary write operation after the erase operation, a secondary write operation after the primary write operation and a tertiary write operation after the secondary write operation, wherein the sequencer executes the erase operation on the first to sixth memory cells, to enable execution of the primary write operation for the first memory cell and the primary write operation for the second memory cell at different timings, to enable execution of the primary write operation for the third memory cell and the primary write operation for the fourth memory cell at different timings, and to enable execution of the primary write operation for the fifth memory cell and the primary write operation for the sixth memory cell at different timings.

Hereinafter, a semiconductor memory device according to an embodiment will be described with reference to drawings. In the following descriptions, components having the same or similar functions and configurations are denoted by common reference numerals. In the case a plurality of components having common reference numerals need to be distinguished, the common reference numerals are distinguished by subscripts (for example, uppercase letters, lowercase letters, numbers, and a hyphen, or uppercase letters and numbers).

In the following descriptions, the signal $X<p:0>$ (p is a natural number) means a set of signals $X<0>$, $X<1>$ . . . $X<p>$, each of which is a 1-bit signal (p+1). A component $Y<p:0>$ means a set of components $Y<0>$, $Y<1>$ . . . $Y<p>$ corresponding one-to-one to an input or output of a signal $X<p:0>$.

First Embodiment

Hereinafter, a semiconductor memory device 1 according to a first embodiment will be described.
<1-1. Configuration Example>
<1-1-1. Memory System>

FIG. 1 is a block diagram illustrating an example of a configuration of a memory system 3 including the semiconductor memory device 1. As shown in FIG. 1, the memory system 3 includes the semiconductor memory device 1 and a memory controller 2. The memory system 3 is, for example, an SSD (solid state drive), or a memory card such as a SD™ card, and the like. The memory system 3 may include a host device (not shown).

The semiconductor memory device 1 is connected to, for example, the memory controller 2. The semiconductor memory device 1 is controlled using the memory controller 2. For example, the memory controller 2 receives a command necessary for an operation of the semiconductor memory device 1 from the host device, and transmits the command to the semiconductor memory device 1. The memory controller 2 transmits an instruction to the semiconductor memory device 1, and controls a data read operation from the semiconductor memory device 1, a data write operation to the semiconductor memory device 1, and a data erase operation of the semiconductor memory device 1. In the first embodiment, the memory device 1 is, for example, a NAND flash memory.
<1-1-2. Configuration of Semiconductor Memory Device>

As shown in FIG. 1, the semiconductor memory device 1 includes a memory cell array 21, an input/output circuit 22, a logic control circuit 23, a sequencer 24, a register 25, a ready/busy circuit 26, a voltage generation circuit 27, a driver set 28, a row decoder 29, a sense amplifier module 70, an input/output pad group 71, and a logic control pad group 72. In the semiconductor memory device 1, various operations such as the write operation for storing write data DAT in the memory cell array 21 and a read operation for reading read data DAT from the memory cell array 21 are executed.

The memory cell array 21 is connected to, for example, the sense amplifier module 70, the row decoder 29, and the driver set 28. The memory cell array 21 includes a block BLK0, BLK1 . . . BLKn (n is an integer of 1 or more). As will be described later, each block BLK includes a plurality of memory groups MG (MG0, MG1, MG2 . . . ). Each memory group MG includes a plurality of non-volatile memory cells associated with the bit line and the word line. The block BLK is, for example, a data erasing unit. Data held by memory cell transistors MTe0 to MTe7, MTo0 to MTo7 (FIG. 2) included in the same block BLK are collectively erased. In the semiconductor memory device 1, a memory cell transistor MT may be simply referred to as a memory cell.

For example, a QLC (Quadruple Level Cell) method can be applied to the semiconductor memory device 1. In the QLC method, 4-bit data is held in the memory cells. Note that 3-bits (eight values) of data may be held in each memory cell, 2-bits (four values) or less of data may be held, and five bits or more of data may be held.

The input/output circuit 22 is connected to, for example, the register 25, the logic control circuit 23, and the sense amplifier module 70. The input/output circuit 22 controls transmission and reception of a data signal $DQ<7:0>$ between the memory controller 2 and the semiconductor memory device 1.

The data signal $DQ<7:0>$ is an 8-bit signal. The data signal $DQ<7:0>$ is an entity of data transmitted and received between the semiconductor memory device 1 and the memory controller 2. The data signal $DQ<7:0>$ includes a command CMD, data DAT, address information ADD, and status information STS, and the like. The command CMD includes, for example, instructions for executing the instructions transmitted from the host device to the semiconductor memory device 1 via the memory controller 2. The data DAT includes the write data DAT to the semiconductor memory device 1 or the read data DAT from the semiconductor memory device 1. The address information ADD includes, for example, a column address and a row address for selecting the plurality of non-volatile memory cells associated with the bit line and the word line. The status information STS includes, for example, information related to a status of the memory device 1 related to the write operation and the read operation.

Specifically, the input/output circuit 22 includes an input circuit and an output circuit, and the input circuit and the output circuit execute the following processing. The memory controller 2 receives the write data DAT, the address information ADD, and the command CMD. The input circuit transmits the received write data DAT to the sense amplifier module 70, and transmits the received address information ADD and the received command CMD to the register 25. On the other hand, the output circuit receives the status information STS from the register 25 and the read data DAT from the sense amplifier module 70. The output circuit transmits the received status information STS and read data DAT to the memory controller 2.

The logic control circuit 23 is connected to, for example, the memory controller 2 and the sequencer 24. The logic control circuit 23 receives, for example, a chip enable signal CEn, a command latch enable signal CLE, an address latch enable signal ALE, a write enable signal WEn, a read enable signal REn, and a write protect signal WPn from the memory controller 2. The logic control circuit 23 controls the input/output circuit 22 and the sequencer 24 based on the received signal.

The chip enable signal CEn is a signal for enabling the semiconductor memory device 1. The command latch enable signal CLE is a signal for notifying the input/output circuit 22 that the signal DQ input to the semiconductor memory device 1 is the command CMD. The address latch enable signal ALE is a signal for notifying the input/output circuit 22 that the signal DQ input to the semiconductor memory device 1 is the address information ADD. The write enable signal WEn and the read enable signal REn are signals for instructing the input/output circuit 22 to input and output the data signal DQ, respectively. The write protect signal WPn is a signal for instructing the memory device 1 to prohibit writing and erasing.

The sequencer 24 is connected to, for example, the ready/busy circuit 26, the sense amplifier module 70, and the driver set 28. The sequencer 24 controls the operation of the entire semiconductor memory device 1 based on the command CMD held in a command register. For example, the sequencer 24 controls the sense amplifier module 70, the row decoder 29, the voltage generation circuit 27, the driver set 28, and the like to execute various operations such as the write operation, the read operation, and the erase operation.

The register 25 includes, for example, a status register (not shown), an address register (not shown), and a command register (not shown), and the like. The status register receives and holds the status information STS from the sequencer 24, and transmits the status information STS to the input/output circuit 22 based on an instruction from the sequencer 24. The address register receives and holds the address data ADD from the input/output circuit 22. The address register transmits the column address in the address information ADD to the sense amplifier module 70, and transmits the row address in the address information ADD to the row decoder 29. The command register receives and holds the command CMD from the input/output circuit 22, and transmits the command CMD to the sequencer 24.

The ready/busy circuit 26 generates a ready/busy signal R/Bn under the control of the sequencer 24, and transmits the generated ready/busy signal R/Bn to the memory controller 2. The ready/busy signal R/Bn is a signal for notifying whether the semiconductor memory device 1 is in a ready state for receiving the instruction from the memory controller 2 or in a busy state for not receiving the instruction.

The voltage generation circuit 27 is connected to, for example, the driver set 28. The voltage generation circuit 27 generates a voltage used for the write operation, the read operation, and the like under the control of the sequencer 24, and supplies the generated voltage to the driver set 28.

Figure 7:
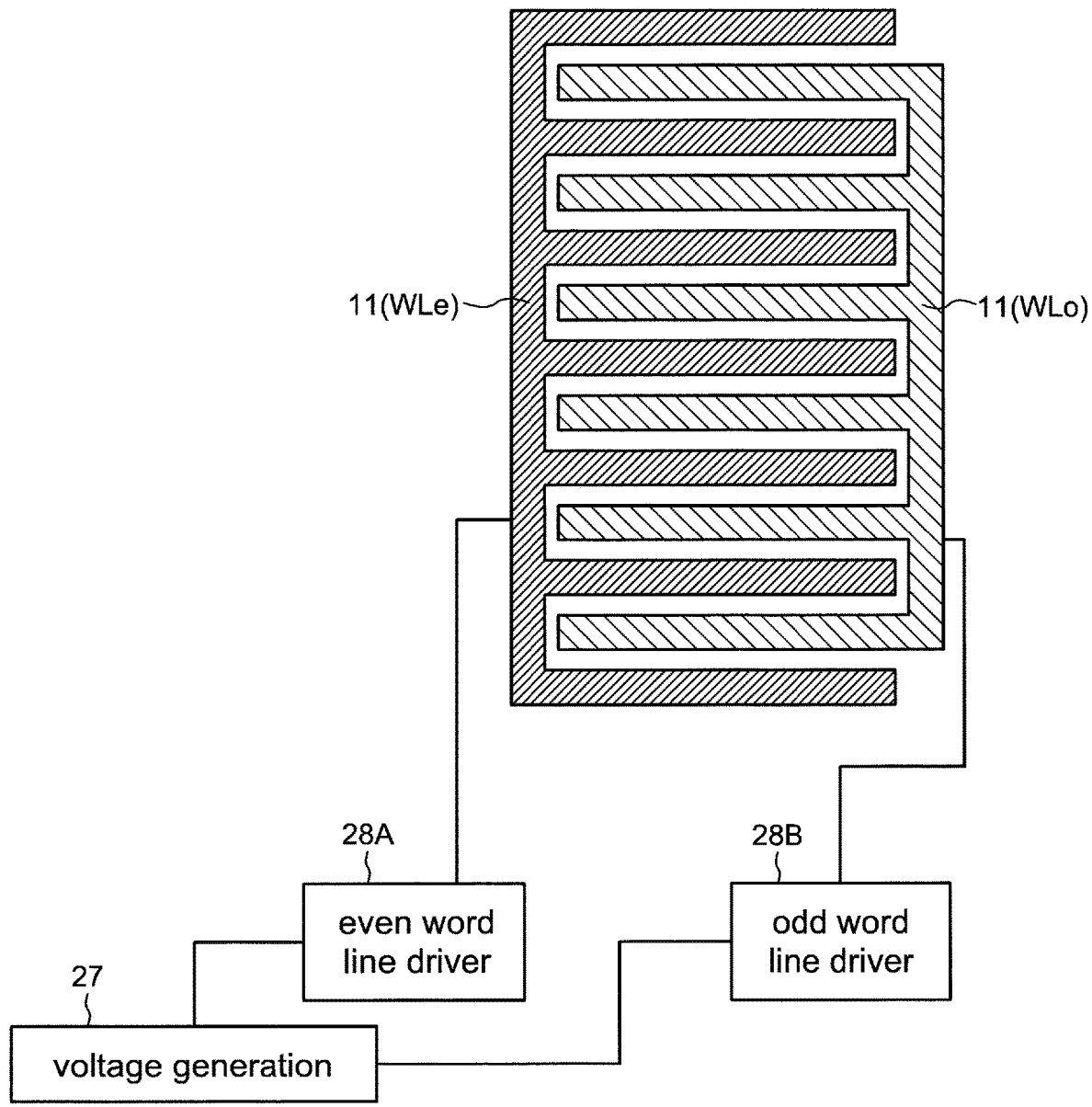
FIG. 7 is a diagram for explaining electrical connection between a voltage generation circuit, a driver set, a select gate line, or the word line according to the first embodiment.

The driver set 28 includes, for example, an even word line driver 28A (FIG. 7) and an odd word line driver 28B (FIG. 7). The driver set 28 is connected to the memory cell array 21, the sense amplifier module 70, and the row decoder 29. The driver set 28 generates various voltages or various control signals to be supplied to, for example, select gate lines SGD (FIG. 2), word lines WL (FIG. 2), source lines SL (FIG. 2), and bit lines BL (FIG. 2) in various operations such as the read operation and the write operation, based on the voltage supplied from the voltage generation circuit 27 or the control signal supplied from the sequencer 24. The driver set 28 supplies the generated voltage or control signal to the sense amplifier module 70, the row decoder 29, and the source lines SL, and the like.

The row decoder 29 receives the row address from the address register and decodes the received row address. The row decoder 29 selects a target BLK to be subjected to various operations, such as the read operation and the write operation, based on a result of the decoding. The row decoder 29 is capable of supplying the voltage supplied from the driver set 28 to the selected block BLK.

For example, the sense amplifier module 70 receives the column address from the address register, and executes a transmission/reception operation of the data DAT between the memory controller 2 and the memory cell array 21 based on the column address. The sense amplifier module 70 includes a sense amplifier unit SAU (FIG. 56) provided for each of the bit lines BL (BL0 to BL(L−1), but (L−1) is a natural number of two or more), for example. The sense amplifier unit SAU is electrically connected to the bit lines BL so as to be capable of supplying a voltage. In addition, the sense amplifier module 70 can sense data (the threshold voltage) read from the memory cell array 21 and temporarily hold the read data (the threshold voltage) based on the command related to the read operation. In addition, the sense amplifier module 70 can execute logical operations based on the temporarily held data. The sense amplifier module 70 transmits the read data DAT to the memory controller 2 via the input/output circuit 22. Further, the sense amplifier module 70 receives the write data DAT from the memory controller 2 via the input/output circuit 22 based on the command related to the write operation. The sense amplifier 70 transmits the write data DAT to the memory cell array 21.

The input/output pad group 71 transmits the data signal DQ<7:0> received from the memory controller 2 to the input/output circuit 22. The input/output pad group 71 transmits the data-signal DQ<7:0> received from the input/output circuit 22 to the memory controller 2.

The logic control pad group 72 transfers the chip enable signal CEn, the command latch enable signal CLE, the address latch enable signal ALE, the write enable signal WEn, and the read enable signal REn received from the memory controller 2 to the logic control circuit 23. The logic control pad group 72 transfers the ready/busy signal R/Bn received from the ready/busy circuit 26 to the memory controller 2.

<1-1-3. Memory Cell Array>

Figure 2:
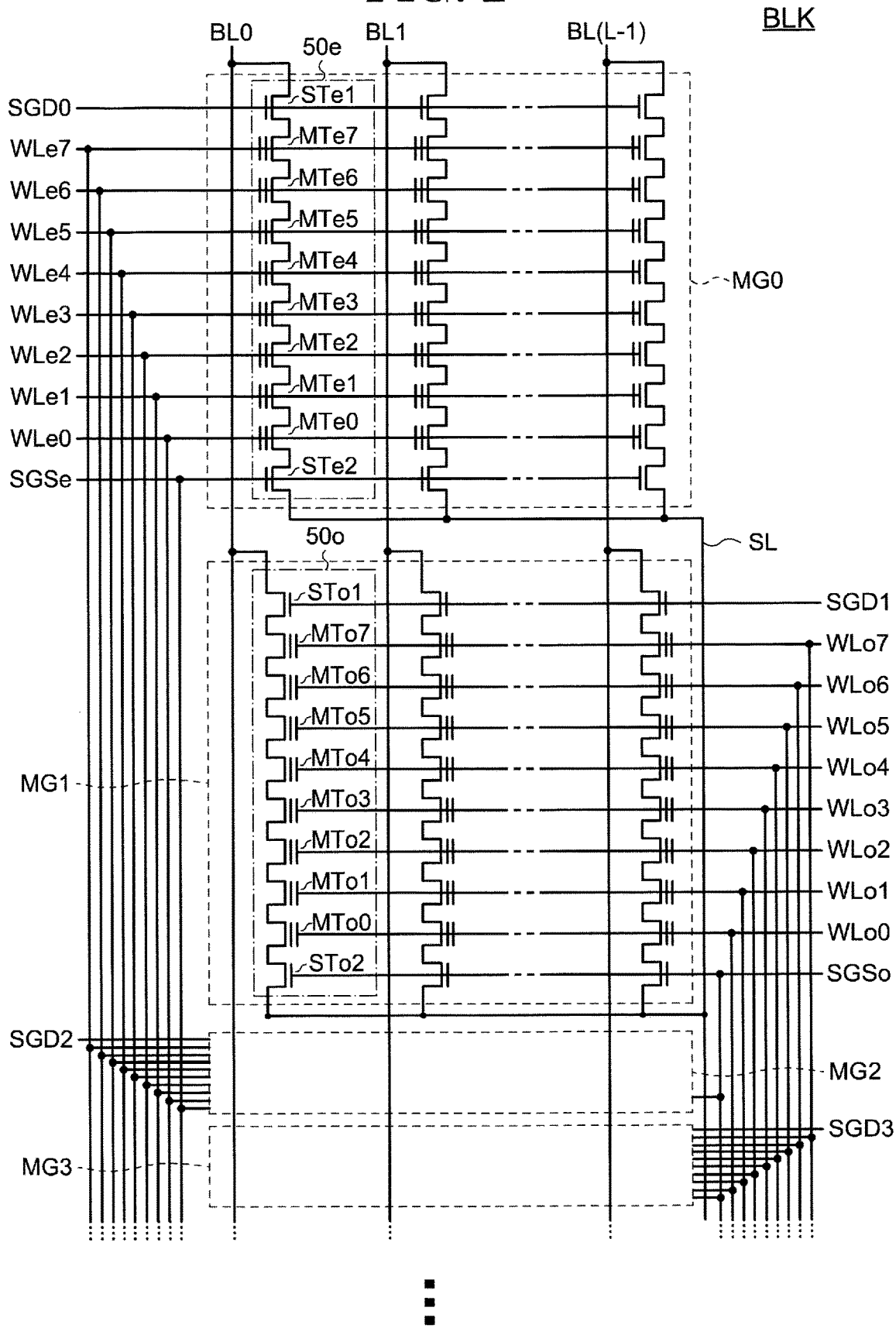
FIG. 2 is a diagram illustrating a circuit configuration of a memory cell array in the semiconductor memory device according to the first embodiment.

FIG. 2 is an example of a circuit configuration of the memory cell array 21 shown in FIG. 1. FIG. 2 is a diagram showing a circuit configuration of one block BLK among a plurality of blocks included in the memory cell array 21. For example, each of the plurality of blocks BLK included in the memory cell array 21 has the circuit configuration shown in FIG. 2. In descriptions of FIG. 2, descriptions of the same or similar configuration as the configuration of FIG. 1 may be omitted.

As shown in FIG. 2, the block BLK includes the plurality of memory groups MG (MG0, MG1, MG2, MG3 . . . ). In the present embodiment, each memory group MG includes a plurality of memory strings 50. For example, the memory groups MG0 and MG2 include a plurality of memory strings 50$e$, and the memory groups MG1 and MG3 include a plurality of memory strings 50$o$.

Each of the memory strings 50 includes, for example, eight memory cell transistors MT (MT0 to MT7) and select transistors ST1 and ST2. The memory cell transistor MT includes a control gate and a charge storage layer, and holds data in a non-volatile manner. The memory cell transistor MT is connected in series between a source of the select transistor ST1 and a drain of the select transistor ST2.

Gates of the select transistor ST1 in each of the memory groups MG are connected to select gate lines SGD (SGD0, SGD1, SGD2, SGD3, SGD4 (FIG. 3), SGD5 (FIG. 3) . . . ), respectively. The select gate lines SGD are independently controlled by the row decoder 29. Further, the gates of the select transistors ST2 in each of the even-numbered memory groups MGe (MG0, MG2 . . . ) are connected to, for example, even-numbered select gate lines SGSe. The gates of the select transistors ST2 in each of the odd-numbered memory groups MGo (MG1, MG3 . . . ) are connected to, for example, odd-numbered select gate lines SGSo. The even-numbered select gate lines SGSe and the odd-numbered select gate lines SGSo may be connected to each other and controlled in the same manner, for example. Further, the even-numbered select gate lines SGSe and the odd-numbered select gate lines SGSo may be provided independently and independently controllable, for example.

Control gates of the memory cell transistors MT (MTe0 to MTe7) included in the memory group MGe in the same block BLK are commonly connected to even-numbered word lines WLe (WLe0 to WLe7). The control gates of the memory cell transistors MT (MTo0 to MTo7) included in the memory group MGo in the same block BLK are commonly connected to odd-numbered word lines WLo (WLo0 to WLo7). The even-numbered word lines WLe and the odd-numbered word lines WLo are independently controlled by the row decoder 29.

The memory group MG includes a plurality of pages corresponding to the plurality of word lines WL. For example, in the memory group MG0 or the memory group MG2, a plurality of memory cell transistors MT having control gates commonly connected to any of the even-numbered word lines WLe0 to WLe7 correspond to the pages. In the memory group MG1 or the memory group MG3, a plurality of memory cell transistors MT having control gates commonly connected to any of the odd-numbered word lines WLo0 to WLo7 correspond to the pages.

The write operation and the read operation are executed in units of pages.

The drains of the select transistor ST1 of the memory strings 50 in the same column in the memory cell array 21 are commonly connected to the bit lines BL (BL0 to BL (L−1), but (L−1) is a natural number equal to or greater than 2.) That is, in the bit lines BL, the memory strings 50 are commonly connected among the plurality of memory groups MG. The sources of a plurality of selection transistors ST2 are commonly connected to the source lines SL. The source lines SL are electrically connected to the driver set 28, for example. Under the control of the voltage generation circuit 27 and the driver set 28 using the sequencer 24, the source lines SL are supplied with a voltage from the voltage generation circuit 27 or the driver set 28. In addition, the semiconductor memory device 1 may include a plurality of source lines SL. For example, each of the plurality of source lines SL is electrically connected to the driver set 28. Under the control of the voltage generation circuit 27 and the driver set 28 using the sequencer 24, the plurality of source lines SL may be supplied with voltages differing from each other from the electric voltage generation circuit 27 or the driver set 28.

The memory group MG includes a plurality of memory strings 50 connected to different bit lines BL and connected to the same select gate line SGD. The block BLK includes a plurality of memory groups MG that share the word lines WL. The memory cell array 21 includes a plurality of blocks BLK having the same bit line BL. In the memory cell array 21, the above-described select gate lines SGS, word lines WL, and select gate lines SGD are stacked above source line layers, and the memory cell transistors MT are three-dimensionally stacked.

<1-1-4. Plane Layout of Memory Cell Array>

Figure 3:
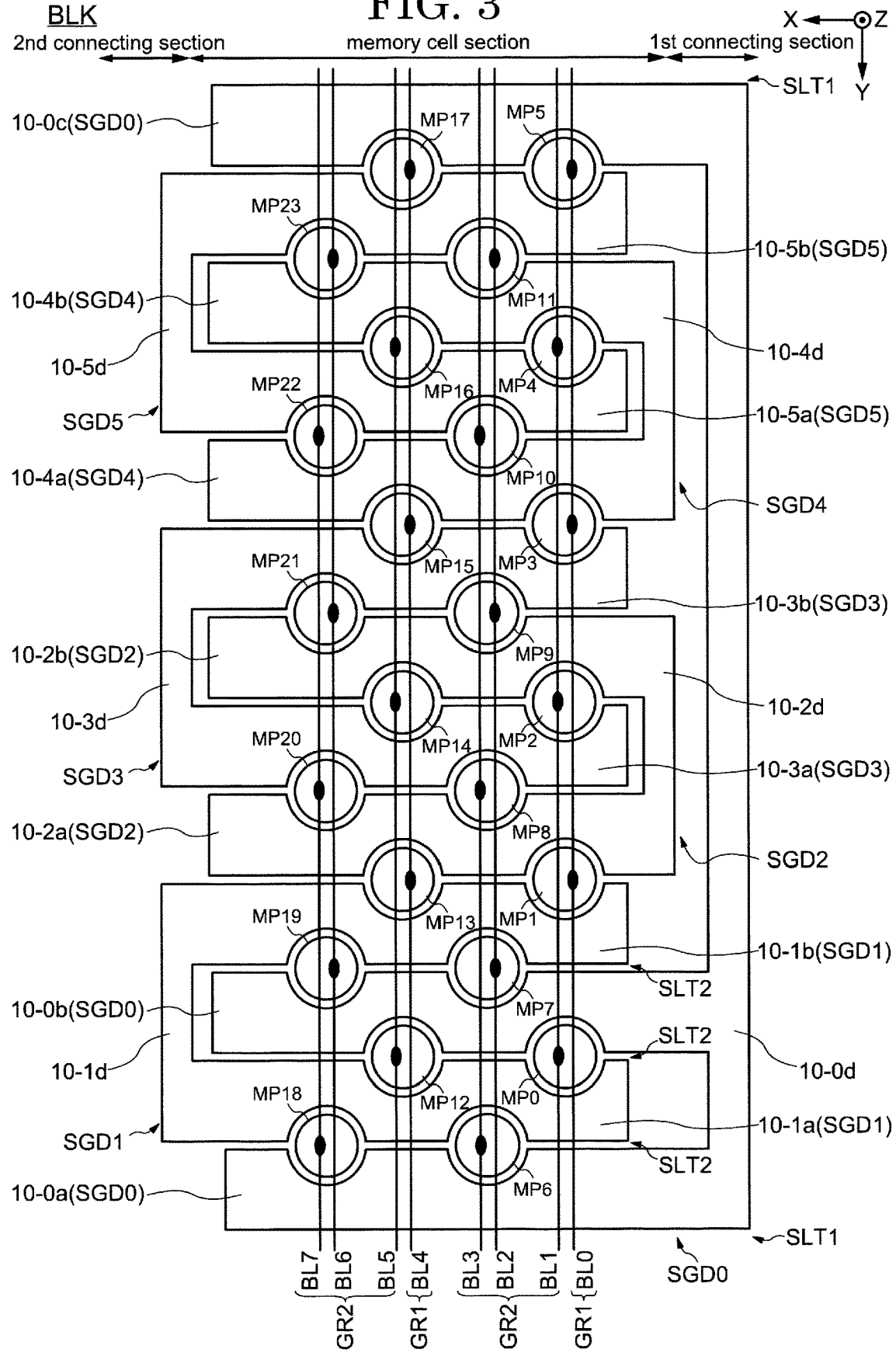
FIG. 3 is a diagram illustrating a plane layout of a select gate line, a bit line, and a memory pillar according to the first embodiment.

FIG. 3 is a plane view of the select gate line SGD, the bit lines BL, and the memory pillars MP in a plane (XY plane) parallel to a source line layer of a certain block BLK. As illustrated in FIG. 3, in the semiconductor memory device 1, for example, six select gate lines SGD are included in one block BLK. In the descriptions of FIG. 3, descriptions of the same or similar configuration as the configurations of FIG. 1 and FIG. 2 may be omitted.

As illustrated in FIG. 3, in the semiconductor memory device 1, for example, wiring layers 10-0*a*, 10-0*b*, and 10-0*c* extending in an X direction are connected to a first connecting section 10-0*d* extending in a Y direction. The wiring layers 10-0*a* and 10-0*c* are provided at both ends in the Y direction. The wiring layer 10-0*a* and the wiring layer 10-0*b* adjoin each other in the Y direction with a wiring layer 10-1*a* interposed therebetween. The first connecting section 10-0*d* is provided at one end in the X direction. Three wiring layers 10-0*a*, 10-0*b*, and 10-0*c* function as a select gate line SGD0.

Wiring layers 10-1*a* and 10-1*b* extending in the X direction are connected to each other by using a second connecting section ($2^{nd}$ connecting section) 10-1*d* extending in the Y direction. The wiring layer 10-1*a* is provided between the wiring layers 10-0*a* and 10-0*b*. The wiring layer 10-1*b* is provided between the wiring layer 10-0*b* and a wiring layer 10-2*a*. The second connecting section 10-1*d* is located at the other end of the first connecting section 10-0*d* in the X direction. The two wiring layers 10-1*a* and 10-1*b* function as a select gate line SGD1.

Wiring layers 10-2*a* and 10-2*b* extending in the X direction are connected by using a first connecting section 10-2*d* extending in the Y direction. The wiring layer 10-2*a* is provided between the wiring layer 10-1*b* and a wiring layer 10-3*a*. The wiring layer 10-2*b* is provided between the wiring layer 10-3*a* and a wiring layer 10-3*b*. The first connecting section 10-2*d* is located at one end on the same side as the first connecting section 10-0*d* in the X direction. The two wiring layers 10-2*a* and 10-2*b* function as a select gate line SGD2.

The wiring layers 10-3*a* and 10-3*b* extending in the X direction are connected by using a second connecting section 10-3*d* extending in the Y direction. The wiring layer 10-3*a* is provided between the wiring layer 10-2*a* and the wiring layer 10-2*b*. The wiring layer 10-3*b* is provided between the wiring layer 10-2*b* and the wiring layer 10-Cc. The second connecting section 10-3*d* is located at the other end of the first connecting section 10-0*d* in the X-direction. The two wiring layers 10-3*a* and 10-3*b* function as a select gate line SGD3.

Wiring layers 10-4*a* and 10-4*b* extending in the X direction are connected by using a first connecting section 10-4*d* extending in the Y direction. The wiring layer 10-4*a* is provided between the wiring layer 10-3*b* and a wiring layer 10-5*a*. The wiring layer 10-4*b* is provided between the wiring layer 10-5*a* and a wiring layer 10-5*b*. The first connecting section 10-4*d* is located at one end on the same side as the first connecting section 10-0*d* in the X direction. The two wiring layers 10-4*a* and 10-4*b* function as a select gate line SGD4.

The wiring layers 10-5*a* and 10-5*b* extending in the X direction are connected by using a second connecting section 10-5*d* extending in the Y direction. The wiring layer 10-5*a* is provided between the wiring layer 10-4*a* and the wiring layer 10-4*b*. The wiring layer 10-5*b* is provided between the wiring layer 10-4b and the wiring layer 10-0c. The second connecting section 10-5d is located at the other end of the first connecting section 10-0d in the X direction. The two wiring layers 10-5a and 10-5b function as a select gate line SGD5.

In the first embodiment, a configuration in which each wiring layer is connected using the first connecting sections 10-0d, 10-2d, and 10-4d or the second connecting sections 10-1d, 10-3d, and 10-5d are exemplified, but the configuration of each wiring layer is not limited to the configuration shown in the first embodiment. For example, each wiring layer may be independent, the same voltages may be supplied to the wiring layers 10-0a, 10-0b, and 10-0c, the same voltages may be supplied to the wiring layers 10-1a and 10-1b, the same voltages may be supplied to the wiring layers 10-2a and 10-2b, the same voltages may be supplied to the wiring layers 10-3a and 10-3b, the same voltages may be supplied to the wiring layers 10-4a and 10-4b, and the same voltages may be supplied to the wiring layers 10-5a and 10-5b.

In the block BLK, wiring layers 10 adjacent to each other in the Y direction are insulated. A region that insulates the adjacent wiring layers 10 is referred to as a slit SLT2. In the slit SLT2, for example, regions from a plane parallel to the source line layer to at least a layer in which a wiring layer 10 is provided are filled with an insulating film (not shown). In the memory cell array 21, for example, a plurality of blocks BLK shown in FIG. 3 are arranged in the Y direction. In the block BLK, as in the case of the wiring layers 10 adjacent in the Y direction, an insulating film (not shown) is used to fill between the blocks BLK adjacent in the Y direction. Adjacent blocks BLK are also insulated in the Y direction. An area that insulates the adjacent blocks BLK is referred to as a slit SLT1. As with the slit SLT2, in the slit SLT1, the insulating film fills the region from the plane parallel to the source line layer to at least the layer in which the wiring layer 10 is provided.

A plurality of memory pillars MP (MP0 to MP23) are provided between the wiring layers 10 adjacent to each other in the Y direction. The plurality of memory pillars MP are provided in a memory cell section. Each of the plurality of memory pillars MP is provided along a Z direction. In the first embodiment, for example, the Y direction is a direction orthogonal or substantially orthogonal to the X direction, and the Z direction is a direction orthogonal or substantially orthogonal to the X direction and the Y direction, and is a direction perpendicular or substantially perpendicular to a direction parallel to the source line layer. In the first embodiment, the memory pillar MP may be referred to as a "semiconductor pillar", the X direction may be referred to as a "first direction", the Y direction may be referred to as a "second direction", and the Z direction may be referred to as a "third direction".

Specifically, the memory pillars MP6 and MP18 are provided between the wiring layers 10-0a and 10-1a. The memory pillars MP0 and MP12 are provided between the wiring layers 10-1a and 10-0b. The memory pillars MP7 and MP19 are provided between the wiring layers 10-0b and 10-1b. The memory pillars MP1 and MP13 are provided between the wiring layers 10-1b and 10-2a. The memory pillars MP8 and MP20 are provided between the wiring layers 10-2a and 10-3a. The memory pillars MP2 and MP14 are provided between the wiring layers 10-3a and 10-2b. The memory pillars MP9 and MP21 are provided between the wiring layers 10-2b and 10-3b. The memory pillars MP3 and MP15 are provided between the wiring layers 10-3b and 10-4a. The memory pillars MP10 and MP22 are provided between the wiring layers 10-4a and 10-5a. The memory pillars MP4 and MP16 are provided between the wiring layers 10-5a and 10-4b. The memory pillars MP11 and MP23 are provided between the wiring layers 10-4b and 10-5b. The memory pillars MP5 and MP17 are provided between the wiring layers 10-5b and 10-0c.

The memory pillars MP form the select transistors ST1 and ST2 and the memory cell transistor MT. A detailed configuration of the memory pillar MP will be described later.

The memory pillars MP0 to MP5 are arranged along the Y direction. The memory pillars MP12 to MP17 are arranged along the Y direction at a position adjacent to the memory pillars MP0 to MP5 in the X direction. That is, the memory pillars MP0 to MP5 and the memory pillars MP12 to MP17 are arranged in parallel.

The memory pillars MP6 to MP11 and the memory pillars MP18 to MP23 are arranged along the Y direction, respectively. The memory pillars MP6 to MP11 are located between the memory pillars MP0 to MP5 and the memory pillars MP12 to MP17 in the X direction. The memory pillars MP18 to MP23 are positioned so as to sandwich the memory pillars MP12 to MP17 together with the memory pillars MP6 to MP11 in the X direction. That is, the memory pillars MP6 to MP11 and the memory pillars MP18 to MP23 are arranged in parallel.

Above the memory pillars MP0 to MP5, two bit lines BL0 and BL1 are provided. The bit line BL0 is commonly connected to the memory pillars MP1, MP3, and MP5. The bit line BL1 is commonly connected to the memory pillars MP0, MP2, and MP4. Above the memory pillars MP6 to MP11, two bit lines BL2 and BL3 are provided. The bit line BL2 is commonly connected to the memory pillars MP7, MP9, and MP11. The bit line BL3 is commonly connected to the memory pillars MP6, MP8, and MP10.

Above the memory pillars MP12 to MP17, two bit lines BL4 and BL5 are provided. The bit line BL4 is commonly connected to the memory pillars MP13, MP15, and MP17. The bit line BL5 is commonly connected to the memory pillars MP12, MP14 and MP16. Above the memory pillars MP18 to MP23, two bit lines BL6 and BL7 are provided. The bit line BL6 is commonly connected to the memory pillars MP19, MP21 and MP23. The bit line BL7 is commonly connected to the memory pillars MP18, MP20 and MP22.

In the semiconductor memory device 1, the bit line BL0 connected to the memory pillars MP1, MP3 and MP5 and the bit line BL4 connected to the memory pillars MP13, MP15 and MP17 may be referred to as a first group GR1. The bit lines BL1 to BL3 connected to the memory pillars MP0, MP2, MP4 and MP6 to 11 and the bit lines BL5 to BL7 connected to the memory pillars MP12, MP14, MP16 and MP18 to MP23 may be referred to as a second group GR2.

As described above, the memory pillars MP are provided at a position that straddles the two wiring layers 10 in the Y direction, and are provided so as to be embedded in a part of one of the slits SLT2 among the plurality of slits SL2. In addition, one slit SLT2 is provided between the memory pillars MP adjacent to each other in the Y direction.

Note that the memory pillars MP are not provided in an area between the wiring layer 10-0a and the wiring layer 10-0c adjacent to each other across the slit SLT1. However, from the viewpoint of process-stability, a dummy memory pillar MP that is not connected to the bit line BL may be provided in the area.

Figure 4:
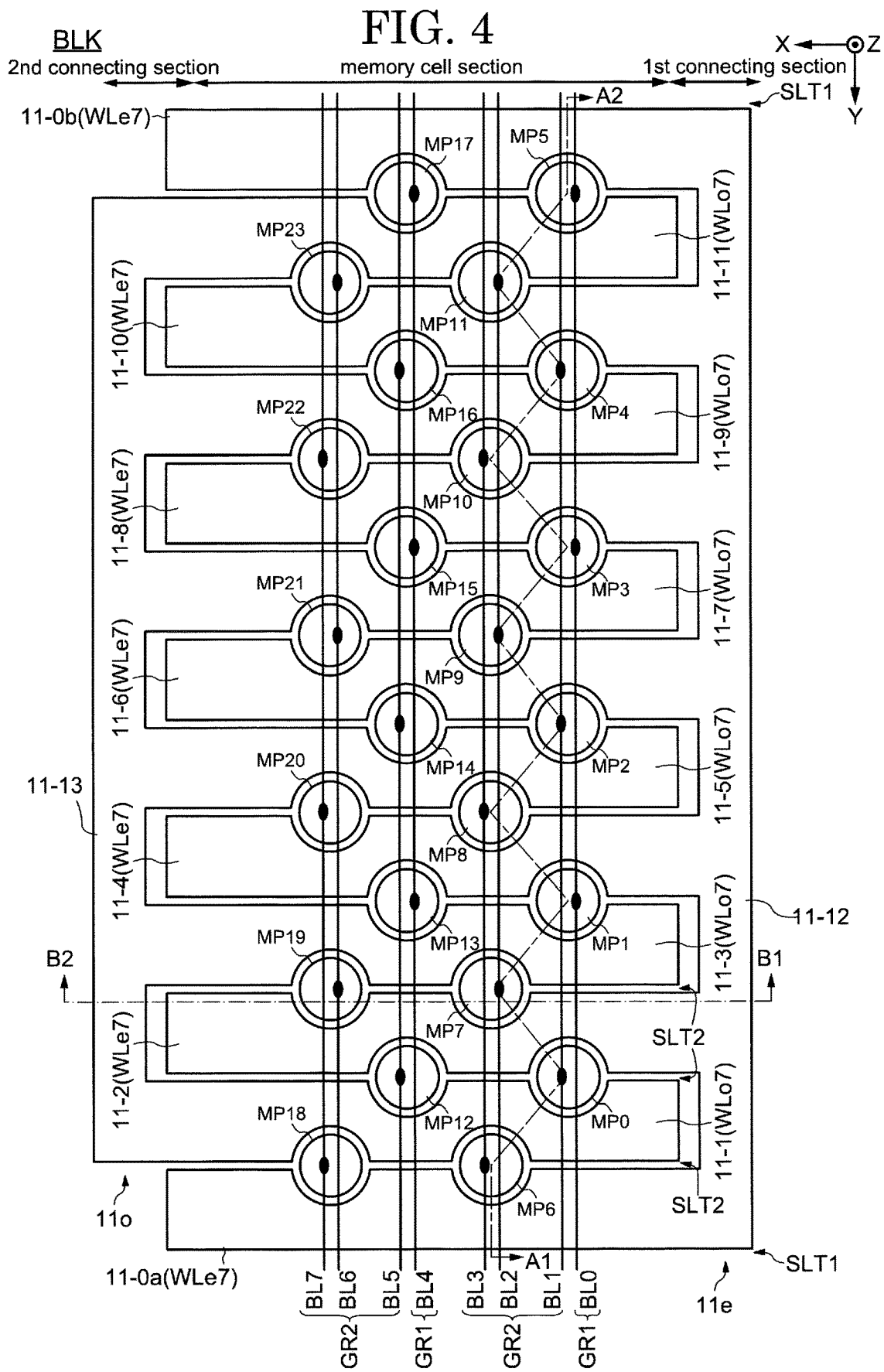
FIG. 4 is a diagram illustrating a plane layout of a word line and the memory pillar according to the first embodiment.

FIG. 4 is a plane view of the word lines WL, the bit lines BL, and the memory pillars MP in an XY plane. The layout shown in FIG. 4 corresponds to the layout of the area corresponding to one block in FIG. 3, and is a layout of a wiring layer 11 provided below the wiring layer 10 shown in FIG. 3. In the descriptions of FIG. 4, descriptions of the same or similar configurations as the configurations of FIG. 1 to FIG. 3 may be omitted.

As shown in FIG. 4, nine wiring layers 11 (wiring layers 11-0a, 11-0b and 11-1 to 11-11) extending in the X direction are arranged along the Y direction. The wiring layers 11-0a, 11-0b and 11-1 to 11-11 are disposed under the wiring layers 10-0 to 10-7 with respect to the Z direction. An insulating film is provided between the wiring layers 11-0a, 11-0b and 11-1 to 11-11 and the wiring layers 10-0 to 10-7.

Each of the wiring layers 11 functions as a word line WL7. Other word lines WL0 to WL6 have the same configurations and functions as the word line WL7. In the embodiment illustrated in FIG. 4, the wiring layers 11-0a, 11-2, 11-4, 11-6, 11-8, 11-10, and 11-0b function as even-numbered word lines WLe7. The wiring layers 11-0a, 11-2, 11-4, 11-6, 11-8, 11-10, and 11-0b are connected by using a first connecting section 11-12 extending in the Y direction. The first connecting section 11-12 is provided at one end in the X direction. The wiring layers 11-0a, 11-2, 11-4, 11-6, 11-8, 11-10, and 11-0b are connected to the row decoder 29 using the first connecting section 11-12. In the semiconductor memory device 1, the first connecting section 11-12 and the wiring layers 11-0a, 11-2, 11-4, 11-6, 11-8, and 11-10, and 11-0b may be collectively referred to as a wiring layer 11e.

In addition, the wiring layers 11-1, 11-3, 11-5, 11-7, 11-9, and 11-11 function as an odd-numbered word line WLo7. The wiring layers 11-1, 11-3, 11-5, 11-7, 11-9, and 11-11 are connected by using a second connecting section 11-13 extending in the Y direction. The second connecting section 11-13 is provided at another end on the opposite side of the first connecting section 11-12 in the X direction. The wiring layers 11-1, 11-3, 11-5, 11-7, 11-9, and 11-11 are connected to the row decoder 29 using the second connecting section 11-13. In the semiconductor memory device 1, the second connecting section 11-13 and the wiring layers 11-1, 11-3, 11-5, 11-7, 11-9, and 11-11 may be collectively referred to as a wiring layer 11o.

A memory cell section is provided between the first connecting section 11-12 and the second connecting section 11-13. In the memory cell section, the wiring layers 11 adjacent to each other in the Y direction are separated by the slit SLT2 shown in FIG. 3. In addition, the wiring layers 11 between the block BLK adjacent to each other in the Y direction are separated by the slit SLT1 in the same manner as the slit SLT2. The memory cell section includes the memory pillars MP0 to MP23 as in FIG. 3.

The select gate line SGS and the word lines WL0 to WL6 have the same configurations and functions as the word line WL7 shown in FIG. 4.

<1-1-5. Cross-Sectional Structure of Memory Cell Array>

Figure 5:
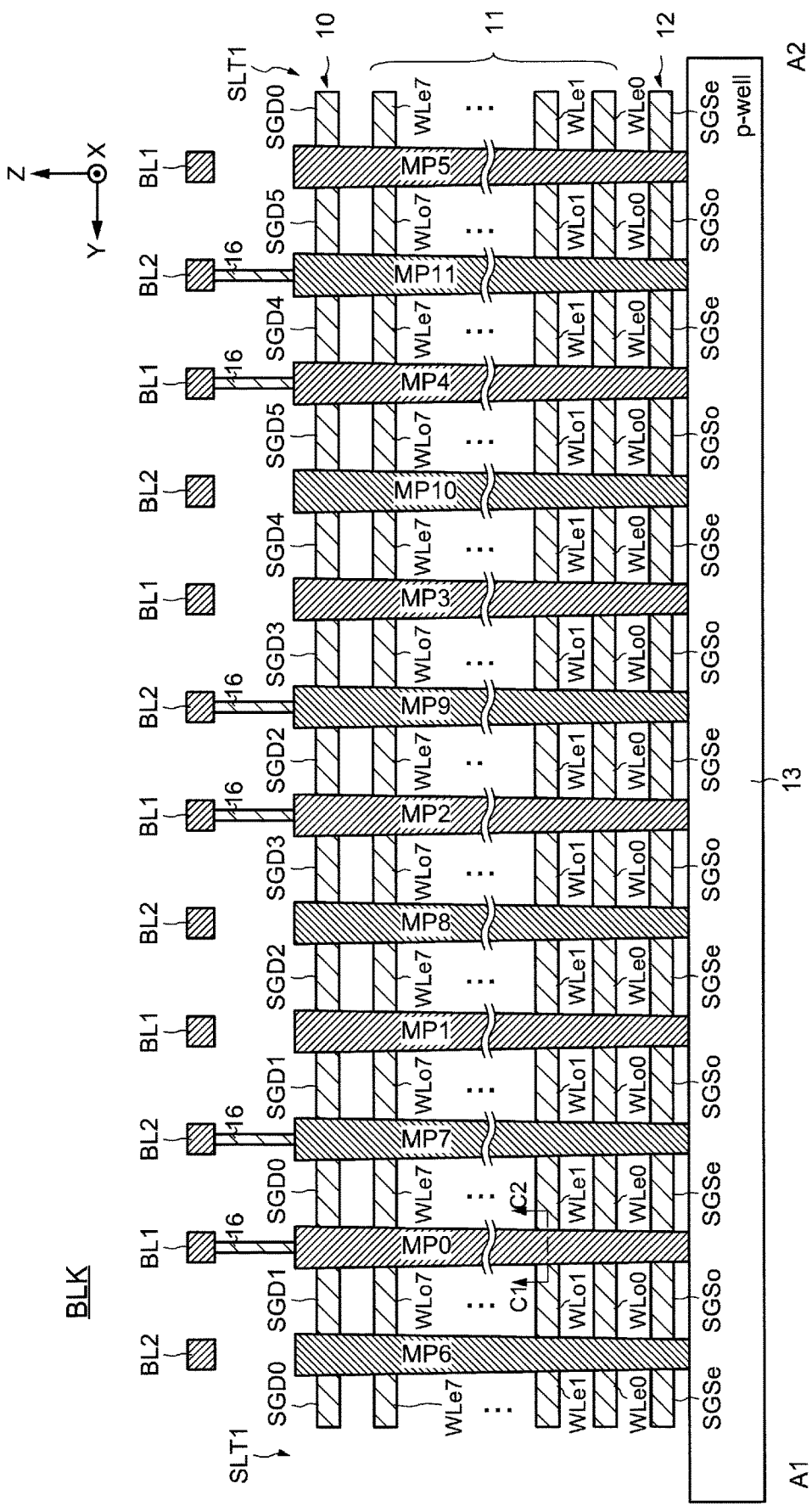
FIG. 5 is a cross-sectional view of the semiconductor memory device shown in FIG. 4 taken along A1-A2.

FIG. 5 is an A1-A2 cross section shown in FIG. 4. In the descriptions of FIG. 5, descriptions of the same or similar configurations as the configurations of FIG. 1 to FIG. 4 may be omitted.

As shown in FIG. 5, wiring layers 12 are provided above the p-type well regions (p-well) of a semiconductor substrate 13 along the Z direction. The semiconductor substrate 13 functions as, for example, the source lines SL. The wiring layers 12 function as select gate lines SGS. An eight-layer wiring layer 11 is stacked above the wiring layer 12 along the Z direction. The eight-layer wiring layer 11 corresponds to the word lines WL0 to WL7 in a one-to-one manner. FIG. 4 is a diagram showing a plane layout of the wiring layers 11 functioning as the word lines WL, and FIG. 3 is a diagram showing a plane layout of the wiring layer 10 functioning as the select gate line SGD. A plane layout of the wiring layer 12 functioning as the select gate line SGS is, for example, a layout in which the wiring layers 10 functioning as the select gate lines SGD shown in FIG. 4 are replaced with the wiring layer 12 functioning as the select gate line SGS.

The wiring layers 12 function as the even-numbered select gate lines SGSe or the odd-numbered select gate lines SGSo. The even-numbered select gate lines SGSe and the odd-numbered select gate lines SGSo are alternately arranged in the Y direction via the slits SLT2. The memory pillar MP is provided between the even-numbered select gate lines SGSe and the odd-numbered select gate lines SGSo. Note that the even-numbered select gate lines SGSe and the odd-numbered select gate lines SGSo do not need to be electrically driven independently. The even-numbered select gate lines SGSe and the odd-numbered select gate lines SGSo may be electrically connected.

The wiring layers 11 function as even-numbered word lines WLe or odd-numbered word lines WLo. The even-numbered word lines WLe and the odd-numbered word lines WLo are alternately arranged in the Y direction via the slit SLT2. The memory pillar MP is provided between the even-numbered word lines WLe and the odd-numbered word lines WLo adjoining in the Y direction. A memory cell to be described later is provided between the memory pillar MP and the even-numbered word lines WLe and between the memory pillars MP and the odd-numbered word lines WLo.

The slit SLT1 is provided between the blocks BLK adjacent to each other in the Y direction. For example, insulating layers are provided in the slit SLT1. A width of the slit SLT1 along the Y direction is substantially the same as a width of the slit SLT2 along the Y direction.

In the semiconductor memory device 1, the source lines SL are provided on a main surface of the semiconductor substrate 13. The source lines SL may have a configuration in which an unpatterned conductive layer extends to a region of the memory cell array 21, or a configuration in which a linearly patterned conductive layer extends to the region. In other words, the source lines SL extend in the X direction and the Y direction.

The bit lines BL1 and BL2 are provided on the memory pillar MP. Contact plugs 16 are provided between the respective memory pillars MP and the bit lines BL. The contact plugs 16 connect the respective memory pillars MP and the bit lines BL. For example, the memory pillar MP0, the memory pillar MP2, the memory pillar MP4, and the bit line BL1 are connected via the contact plugs 16. The memory pillar MP7, the memory pillar MP9, the memory pillar MP11, and the bit line BL2 are also connected through the contact plugs 16. The remaining memory pillars MP are connected to the bit line BL0 or the bit lines BL3 to BL7 through the contact plugs 16 in regions other than the cross section shown in FIG. 5.

Figure 6:
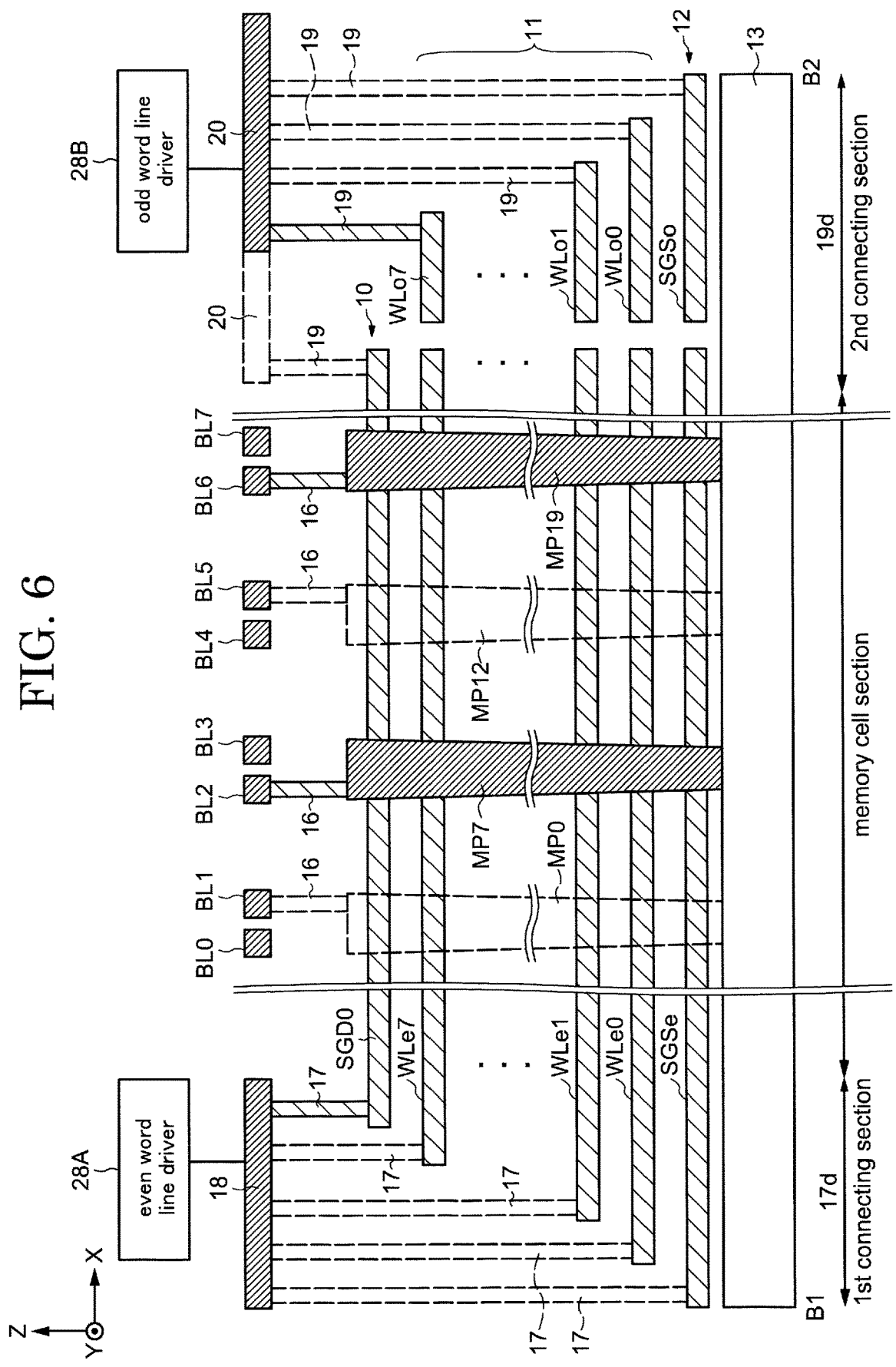
FIG. 6 is a cross-sectional view of the semiconductor memory device shown in FIG. 4 taken along B1-B2.

FIG. 6 is a B1-B2 cross section of the semiconductor memory device 1 shown in FIG. 4. In the descriptions of FIG. 6, descriptions of the same or similar configurations as the configurations in FIG. 1 to FIG. may be omitted. The stacked structures of the wiring layer 12, the wiring layer 11, and the wiring layer 10, and the configuration of the memory cell section are as described with reference to FIG. 5, and thus descriptions thereof will be omitted. In FIG. 6, a configuration existing in the depth direction of the B1-B2 cross section is depicted by a dotted line.

As shown in FIG. 6, in a first connecting section 17d, the wiring layer 10, the wiring layer 11, and the wiring layer 12 are formed in a stepped shape. That is, In the case of viewing in an XY plane, upper surfaces of the end portions of the wiring layer 10, the wiring layer 11 of the eight layers, and the wiring layer 12 are exposed at the first connecting section 17d. The contact plug 17 is provided on the upper surfaces of the end portions of the wiring layer 10, the wiring layer 11 of the eight layers, and the wiring layer 12 exposed in the first connecting section 17d. The contact plug 17 is connected to the metal wiring layer 18. For example, using the metal wiring layer 18, the wiring layer 10 functioning as the even-numbered select gate lines SGD0, SGD2 and SGD4, the wiring layer 11 functioning as the even-numbered word lines WLe, and the wiring layer 12 functioning as the even-numbered select gate lines SGSe are electrically connected to the even-numbered word line drivers 28A and via the row decoder 29 (FIG. 1).

Similar to the first connecting section 17d, in a second connecting section 19d, the wiring layer 10, the wiring layer 11, and the wiring layer 12 are formed in the stepped shape. In the case of viewing in an XY plane, the upper surfaces of the end portions of the wiring layer 10, the wiring layer 11 of the eight layers, and the wiring layer 12 are exposed at the second connecting section 19d. A contact plug 19 is provided on the upper surface of the end portion of the wiring layer 10 exposed in the second connecting section 19d, the upper surface of the end portion of each of the wiring layer 11 and the wiring layer 12 of the eight layers, and the contact plug 19 is connected to a metal wiring layer 20. For example, using the metal wiring layer 20, the odd-numbered select gate lines SGD1, SGD3 and SGD5, the wiring layer 11 functioning as the odd-numbered word lines WLo, and the wiring layer 12 functioning as the odd-numbered select gate line SGSo are electrically connected to the odd word line driver 28B via the row decoder 29 (FIG. 1).

The wiring layers 10 may be electrically connected to the row decoder 29 or the even word line driver 28A and the odd word line driver 28B via the second connecting section 19d instead of the first connecting section 17d. Further, the wiring layers 10 may be electrically connected to the row decoders 29 or the even-numbered word line driver 28A and the odd-numbered word line driver 28B via both the first connecting section 17d and the second connecting section 19d.

FIG. 7 is a diagram for explaining electrically connecting the voltage generation circuit 27, the driver set 28, the select gate line SGD, or the word lines WL according to the first embodiment. In the descriptions of FIG. 7, descriptions of the same or similar configurations as the configurations of FIG. 1 to FIG. 6 may be omitted.

As shown in FIG. 7, the wiring layer 11 functioning as the even-numbered word lines WLe may be connected to the even word line driver 28A, and the wiring layer 11 functioning as the odd-numbered word lines WLo may be electrically connected to the odd word line driver 28B. As described in "1-1-2. Configuration of Semiconductor Memory Device", the even word line driver 28A and the odd word line driver 28B are included in the driver set 28. The driver set 28 is electrically connected to the voltage generation circuit 27. The even word line driver 28A and the odd word line driver 28B may generate various voltages using voltages supplied from the voltage generation circuit 27. The even word line driver 28A may supply the generated voltage to the even-numbered word lines WLe, and the odd word line driver 28B may supply the generated voltage to the odd-numbered word lines WLo.

<1-1-6. Cross Section of Memory Pillar MP and Memory Cell Transistor MT>
<1-1-6-1. First Example>

Figure 8:
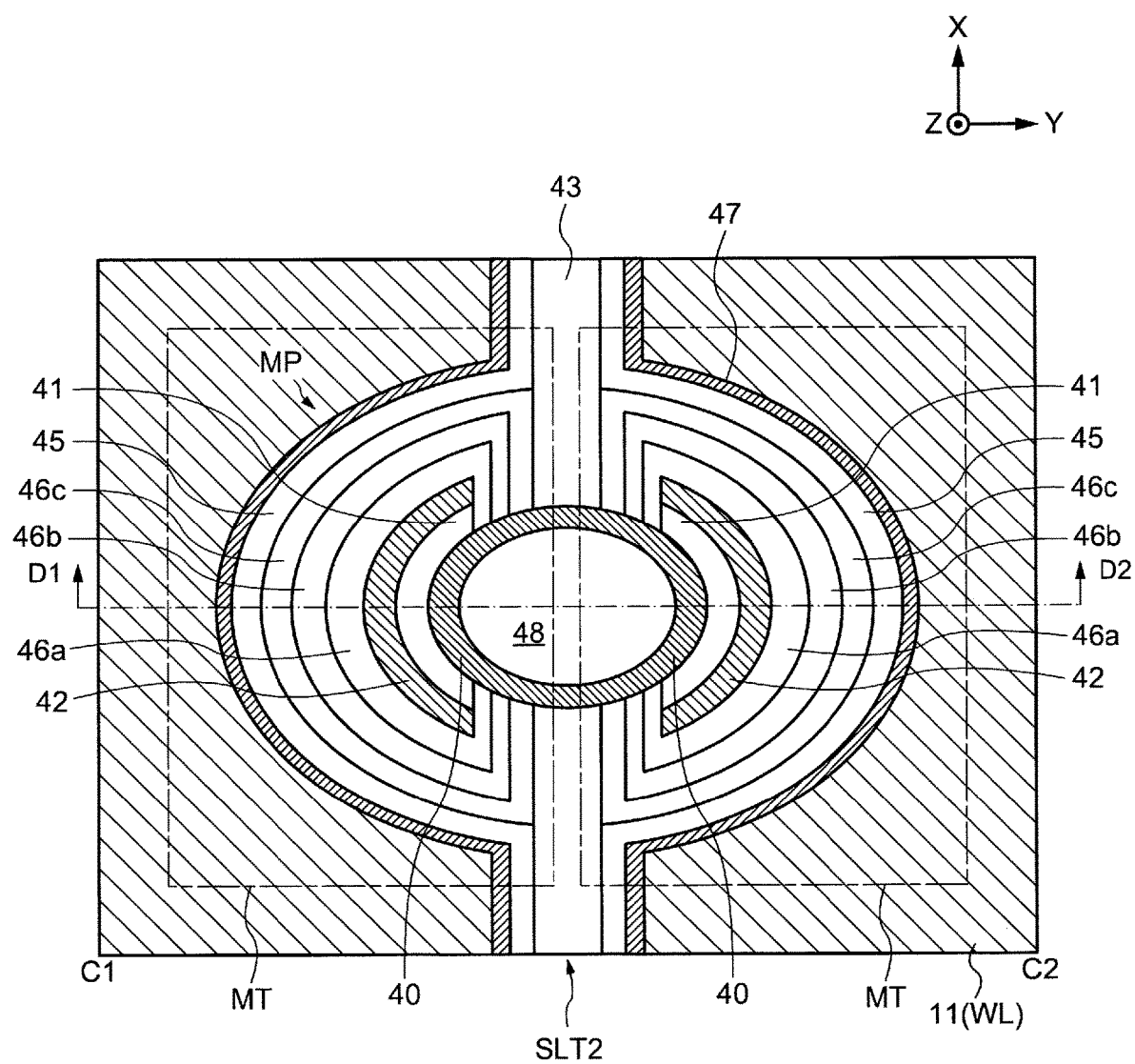
FIG. 8 is a cross-sectional view of a memory cell transistor shown in FIG. 5 taken along the line C1-C2 in the first embodiment.
Figure 9:
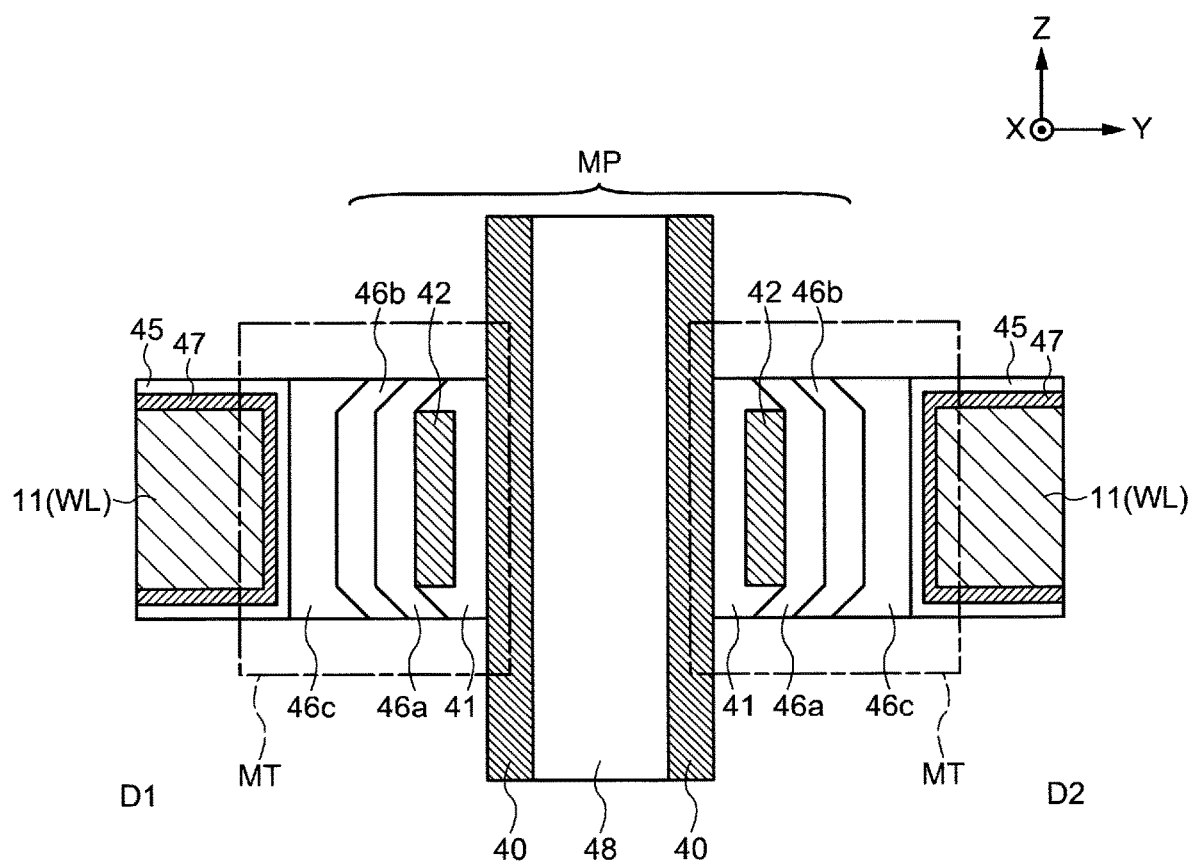
FIG. 9 is a cross-sectional view of the memory cell transistor shown in FIG. 8 taken along the line D1-D2.

A structure of the first embodiment shown in FIG. 8 and FIG. 9 is used for a structure of the memory cell transistor MT. FIG. 8 is a cross-sectional view taken along the line C1-C2 of FIG. 5, and FIG. 9 is a cross-sectional view taken along the line D1-D2 of the memory cell transistor MT shown in FIG. 8. FIG. 8 and FIG. 9 are cross-sectional views showing regions including two memory cell transistors MT. In the first embodiment, the charge storage layer included in the memory cell transistors MT is a conductive film. In the first embodiment, the memory cell transistor MT is a floating gate type memory cell transistor MT. In the descriptions of FIG. 8 and FIG. 9, the description of the same or similar configurations as the configurations of FIG. 1 to FIG. 7 may be omitted.

As shown in FIG. 8 and FIG. 9, the memory pillar MP includes an insulating layer 48 and an insulating layer 43 provided along the Z direction, a semiconductor layer 40, an insulating layer 41, a conductive layer 42, and insulating layers 46a to 46c. The insulating layer 48 is formed using, for example, a silicon oxide film. The semiconductor layer 40 is provided so as to surround the insulating layer 48. The semiconductor layer 40 functions as a region in which channels of the memory cell transistor MT are formed. The semiconductor layer 40 is formed using, for example, a polycrystalline silicon layer. The semiconductor layer 40 is successively provided between memory cell transistors MT in the same memory pillar MP and are not isolated between memory cell transistors MT. Thus, the channels formed in each of the two memory cell transistors MT share a portion of the memory pillar MP.

The semiconductor layer 40 is contiguous between two opposing memory cell transistors MT. Thus, the channels formed in each of the two memory cell transistors MT facing each other share a portion of the memory pillar MP. Specifically, in FIG. 8 and FIG. 9, in the left memory cell transistor MT (the first memory cell) and the right memory cell transistor MT (the third memory cell) facing each other, a channel formed by the first memory cell (a first channel) and a channel formed by the third memory cell (a second channel) share a part of the memory pillar MP. Here, the fact that two channels share the part of the memory pillar MP means that two channels are formed in the same memory pillar MP and two channels partially overlap. In the semiconductor memory device 1, the above-described configuration may be referred to as two memory cell transistors MT sharing channels or two memory cell transistors MT facing each other.

The insulating layer 41 is provided around the semiconductor layer 40 and functions as a gate insulating film of the memory cell transistors MT. The insulating layers 41 are separated into two regions in an XY plane shown in FIG. 8. Each of the insulating layers 41 separated into two regions functions as the gate insulating film of the two memory cell transistors MT in the same memory pillar MP. The insulating layer 41 is formed using, for example, a stacked structure of a silicon oxide film and a silicon nitride film.

The conductive layer 42 is provided around the insulating layer 41 and is separated into two regions along the Y direction by the insulating layer 43. Each of the conductive layers 42 separated into two regions functions as the charge storage layer of each of the two memory cell transistors MT. The conductive layer 42 is formed using, for example, a polycrystalline silicon layer.

The insulating layer 43 is formed using, for example, a silicon oxide film. Around the conductive layer 42, the insulating layer 46a, the insulating layer 46b, and the insulating layer 46c are sequentially provided from a side close to the conductive layer 42. The insulating layer 46a and the insulating layer 46c are formed using, for example, a silicon oxide film, and the insulating layer 46b is formed using, for example, a silicon nitride film. The insulating layer 46a, the insulating layer 46b, and the insulating layer 46c function as block insulating films of the memory cell transistor MT. The insulating layer 46a, the insulating layer 46b, and the insulating layer 46c are separated into two regions along the Y direction. The insulating layer 43 is provided between two separated regions of the insulating layer 46c. In addition, the insulating layers 43 are embedded in the slit SLT2. The insulating layer 43 is formed using, for example, a silicon oxide film.

Around the first embodiment of the memory pillar MP, for example, AlO layers 45 are provided. For example, barrier metal layers 47 are provided around the AlO layers 45. The barrier metal layers 47 are formed using, for example, a TiN film. Around the barrier metal layers 47, the wiring layers 11 functioning as the word lines WL are provided. The wiring layers 11 of the memory pillar MP according to the first embodiment are formed using, for example, a tungsten-based film.

In the configuration of the memory cell transistor MT shown in FIG. 8 and FIG. 9, two memory cell transistors MT are provided in one memory pillar MP along the Y direction. The select transistors ST1 and ST2 have the same configurations as the memory cell transistor MT. Note that, although not shown, insulating layers are provided between the memory cell transistors MT adjoining in the Z direction. The conductive layer 42 is insulated for each memory cell transistor MT by an insulating layer provided between adjacent memory cell transistors in the Z direction, the insulating layer 43 and an insulating layer 46.

<1-1-6-2. Second Example>

Figure 10:
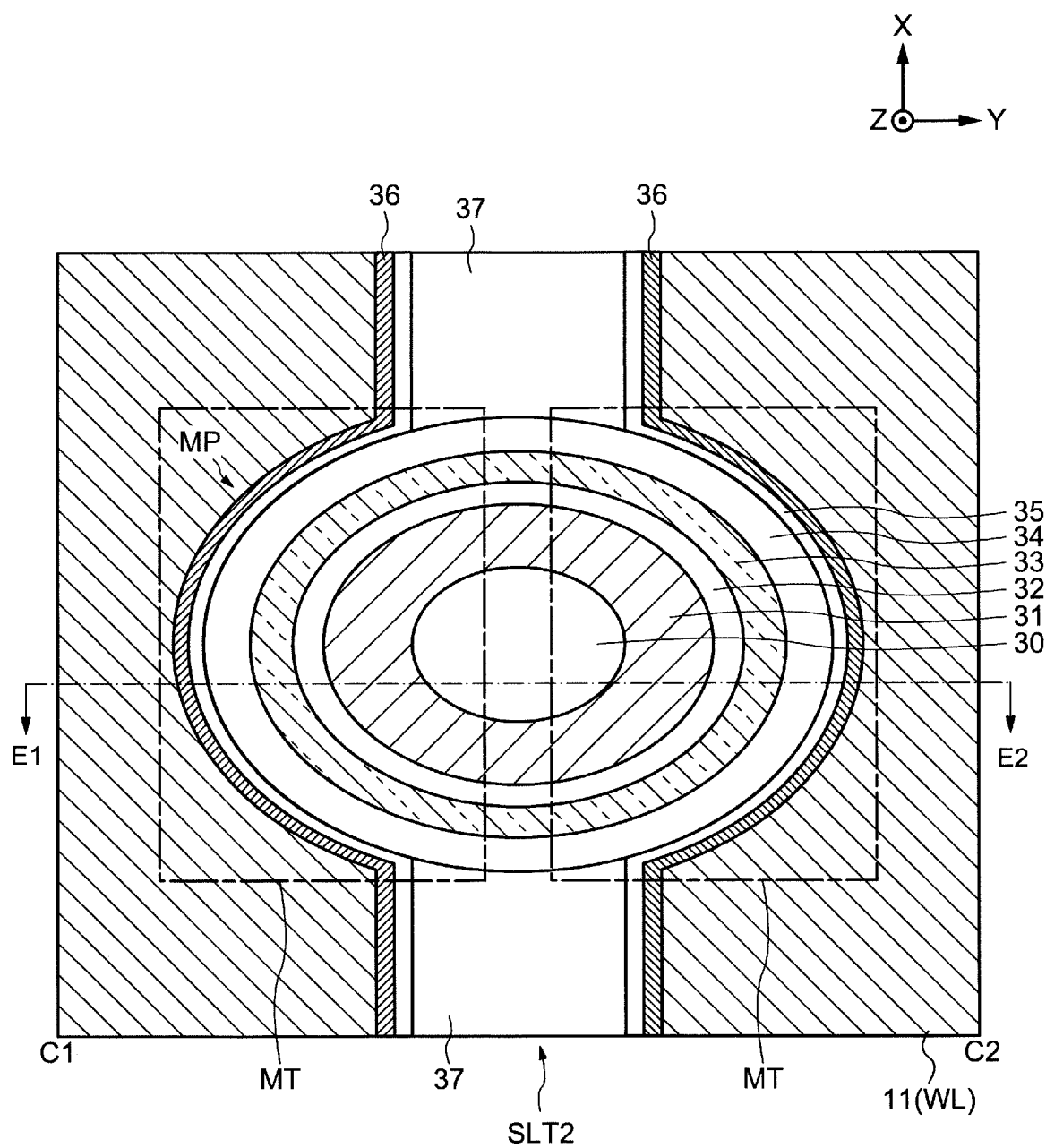
FIG. 10 is a cross-sectional view of the memory cell transistor shown in FIG. 5 taken along the line C1-C2 in a second embodiment.
Figure 11:
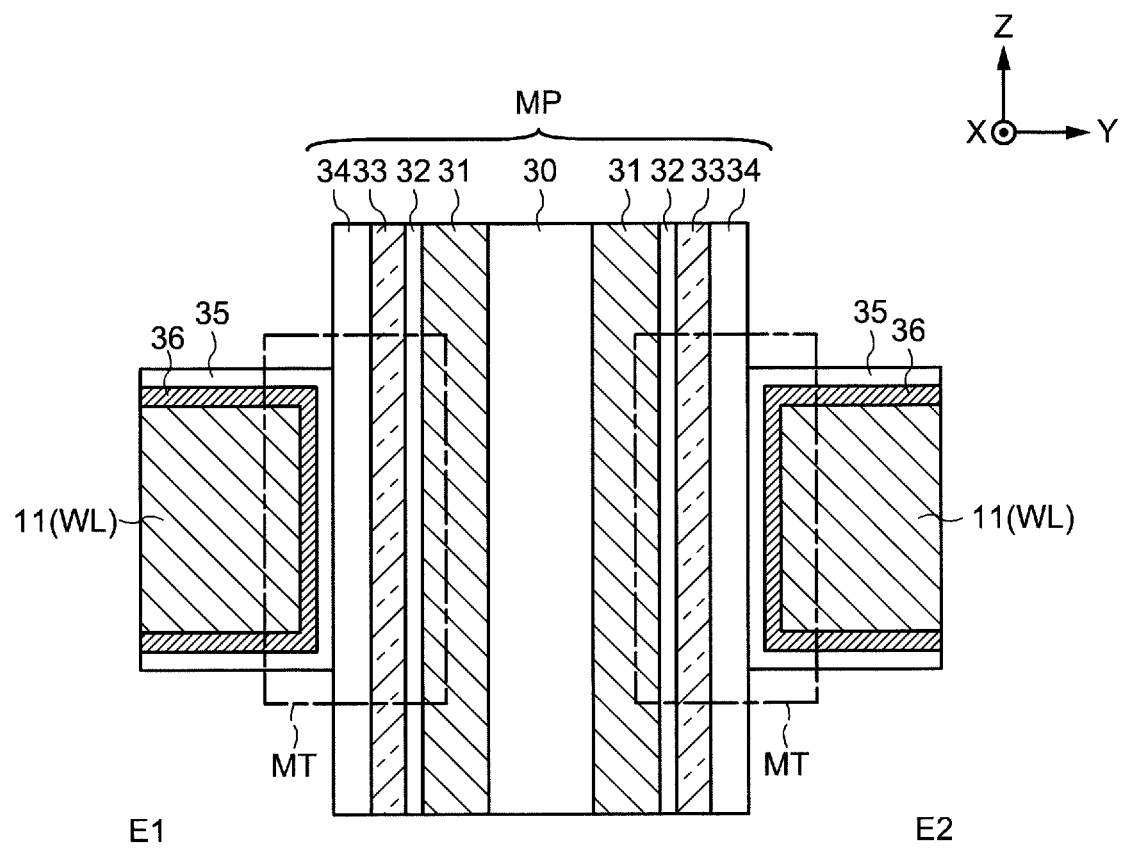
FIG. 11 is a cross-sectional view of the memory cell transistor shown in FIG. 10 taken along the line E1-E2.

As the memory cell transistor MT, the second embodiment shown in FIG. 10 and FIG. 11 may be used. FIG. 10 is a cross-sectional view taken along the line C1-C2 of FIG. 5, and FIG. 11 is a cross-sectional view showing a line E1-E2 of the memory cell transistor MT shown in FIG. 10. FIG. 10 and FIG. 11 are cross-sectional views showing regions including two memory cell transistors MT. In the second embodiment, the charge storage layers included in the memory cell transistors MT are insulating films. In the second embodiment, in the descriptions of FIG. 10 and FIG. 11 in which the memory cell transistor MT is a MONOS type memory cell transistor MT, descriptions of the same or similar configurations as in FIG. 1 to FIG. 7 may be omitted.

As illustrated in FIG. 10 and FIG. 11, the memory pillar MP includes an insulating layer 30, a semiconductor layer 31, an insulating layer 32, an insulating layer 33, and an insulating layer 34 provided along the Z direction. The insulating layer 30 is formed using, for example, a silicon oxide film. The semiconducting layer 31 is provided so as to surround a periphery of the insulating layer 30, and functions as a region in which channels of the memory cell transistor MT are formed. The semiconductor layer 31 is formed using, for example, a polycrystalline silicon layer. The semiconductor layers 31 are not separated from each other and are continuously provided between the memory cell transistors MT in the same memory pillar MP. Thus, the channels formed in each of the two memory cell transistors MT share a portion of the memory pillar MP.

The insulating layer 32 is provided so as to surround a periphery of the semiconductor layer 31, and functions as a gate insulating film of the memory cell transistor MT. The insulating layer 32 is formed using, for example, a stacked structure of a silicon oxide film and a silicon nitride film. The insulating layer 33 is provided so as to surround the periphery of the semiconductor layer 31, and functions as the charge storage layer of the memory cell transistor MT. The insulating layer 33 is formed using, for example, a silicon nitride film. The insulating layer 34 is provided so as to surround a periphery of the insulating layer 33, and functions as a block insulating film of the memory cell transistor MT. The insulating layer 34 is formed using, for example, a silicon oxide film. Insulating layers 37 are embedded in the slit SLT2 except for the memory pillar MP portion. The insulating layer 37 is formed using, for example, a silicon oxide film.

For example, AlO layers 35 are provided around the memory pillar MP according to the second embodiment. For example, a barrier metal layer 36 is provided around the AlO layer 35. The barrier metal layers 36 are formed using, for example, a TiN film. Around the barrier metal layer 36, the wire layers 11 functioning as the word lines WL are provided. The wiring layers 11 are formed using, for example, films made of tungsten.

As in the first example, one memory pillar MP according to the second example includes two memory cell transistors MT along the Y direction. Similar to one memory pillar MP, the select transistors ST1 and ST2 include two transistors along the Y direction.

<1-1-7. String Equivalent Circuit>

Figure 12:
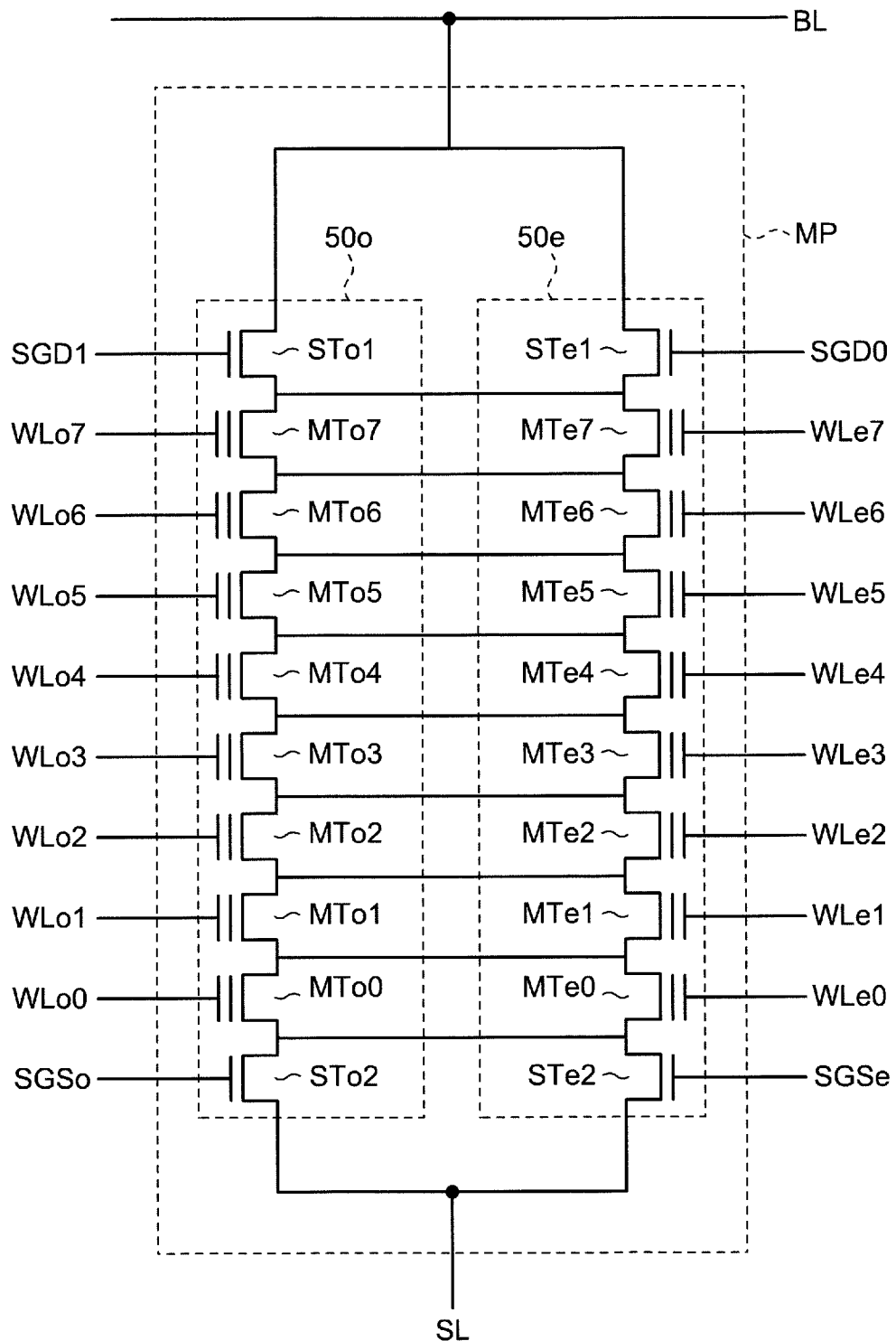
FIG. 12 is a diagram illustrating an equivalent circuit of adjacent strings in the semiconductor memory device according to the first embodiment.

FIG. 12 is an equivalent circuit diagram of adjacent strings in the semiconductor memory device 1. In the descriptions of FIG. 12, descriptions of the same or similar configurations as the configurations of FIG. 1 to FIG. 11 may be omitted.

As shown in FIG. 12, two memory strings 50e, 50o are formed in one memory pillar MP. Specifically, the memory string 50o is provided on a first side of the memory pillar MP (a third side). A memory string 50e is provided on a second side of the memory pillar MP (a fourth side).

The memory string 50o includes a selection transistor STo1, i (i is an integer of 2 or more), memory cell transistors MTo, and a selection transistor STo2 electrically connected in series. The memory string 50e includes a selection transistor STe1, i memory cell transistors MTe, and a selection transistor STe2 electrically connected in series.

The memory string 50e and the memory string 50o are provided to face each other. Therefore, the selection transistor STe1, the memory cell transistors MTe0 to MTe7, and the selection transistor STo2 included in the memory string 50e are provided to face the selection transistor STo1, memory cell transistors MTo0 to MTo7, and the selection transistor STo2 included in the memory string 50o in a one-to-one manner.

One odd-numbered select gate line SGSo, the even-numbered select gate line SGSe, the odd-numbered word lines WLo of an i-layer, the even-numbered word lines WLe of the i-layer, and select gate lines SGD0, SGD1 of one-layer are provided in the Z direction with respect to the source lines SL.

In the first embodiment, i is eight. The eight memory cell transistors MTo0 to MTo7 are electrically connected between the select transistor STo1 and the select transistor STo2, the eight memory cell transistors MTe0 to MTe7 are electrically connected between the select transistor STe1 and the select transistor STe1, and the odd-numbered word lines WLo0 to WLo7 and the even-numbered word lines WLe0 to WLe7 are provided.

In the semiconductor memory device 1, for example, in the case where the memory strings 50$o$ and 50$e$ do not need to be distinguished, they may be simply referred to as "memory strings 50". Members included in the memory string 50 and the wirings connected to the members are also expressed in the same manner as in the case where the memory strings 50$o$ and 50$e$ are distinguished. For example, in the case where the memory cell transistors MTo and MTe do not need to be distinguished, they may be simply referred to as "memory cell transistors MT".

The select transistor STo1 of the memory string 50$o$ is connected to, for example, the select gate line SGD1. The select transistor STe1 of the memory string 50$e$ is connected to, for example, the select gate line SGD0. The select transistors STo1 and STe1 are connected to one of the select gate lines SGD among 2n select gate lines SGD0 to SGD5.

The memory cell transistors MTo0 to MTo7 of the memory string 50$o$ are electrically connected in series, arranged along the Z direction, and connected to the odd-numbered word lines WLo0 to WLo7 of the i-layer, respectively. The memory cell transistors MTe0 to MTe7 of the memory string 50$e$ are electrically connected in series, arranged along the Z direction, and connected to the even-numbered word lines WLe0 to WLe7 of the i-layer, respectively. The select transistor STo2 of the memory string 50$o$ is connected to, for example, the odd-numbered select gate line SGSo. The select transistor STe2 of the memory string 50$e$ is connected to, for example, the even-numbered select gate line SGSe. In the first memory pillar MP, the i memory cell transistors MTo0 to MTo7 (the first memory cell), the i memory cell transistors MTe0 to MTe7 (the second memory cell), the selection transistors STo1 and STe1, and the selection transistors STo2 and STe2 share semiconductor layers. Similar to the first memory pillar MP, in the second memory pillar MP, the i memory cell transistors MTo0 to MTo7 (the third memory cell), the i memory cell transistors MTe0 to MTe7 (the fourth memory cell), the selection transistors STo1 and STe1, and the selection transistors STo2 and STe2 share semiconductor layers.

In the memory strings 50$e$, 50$o$, the sources and drains of the opposing selection transistors STo1 and STe1 are electrically connected to each other, the sources and drains of the memory cell transistors MTo0 to MTo7 and MTe0 to MTe7 facing each other are electrically connected to each other, and the sources and drains of the opposing selection transistors STo2 and STe2 are electrically connected to each other. The above-described electric connection is caused by the channel formed in the opposing transistors sharing a part of the memory pillar MP.

Two memory strings 50$e$, 50$o$ in the same memory pillar MP are connected to the same bit line BL and the same source line SL.

Of the eight odd-numbered word lines WLo0 to WLo7 (first word lines), a position of the first odd-numbered word line WLo0 is closest to a position of the source line SL and is farthest from a position of the bit line BL, and a position of the eighth odd-numbered word line WLo7 is farthest from the position of the source line SL and is closest to the position of the bit line BL. Similarly, the position of the first even-numbered word line WLe0 among the eight even-numbered word lines WLe0 to WLe7 (second word lines) is closest to the position of the source line SL and farthest from the position of the bit line BL, and a position of the eighth even-numbered word line WLe7 is closest to the position of the bit line BL and farthest from the position of the source line SL.

<1-1-8. Threshold Distribution of Memory Cell Transistor MT>

Triple Level Cell (TLC) will be described with reference to FIG. 13 as an exemplary threshold-voltage profile of the memory cell transistor MT. In the memory system 3, Quad Level Cell (QLC), Multi Level Cell (MLC), and Single Level Cell (SLC) may be used.

Figure 13:
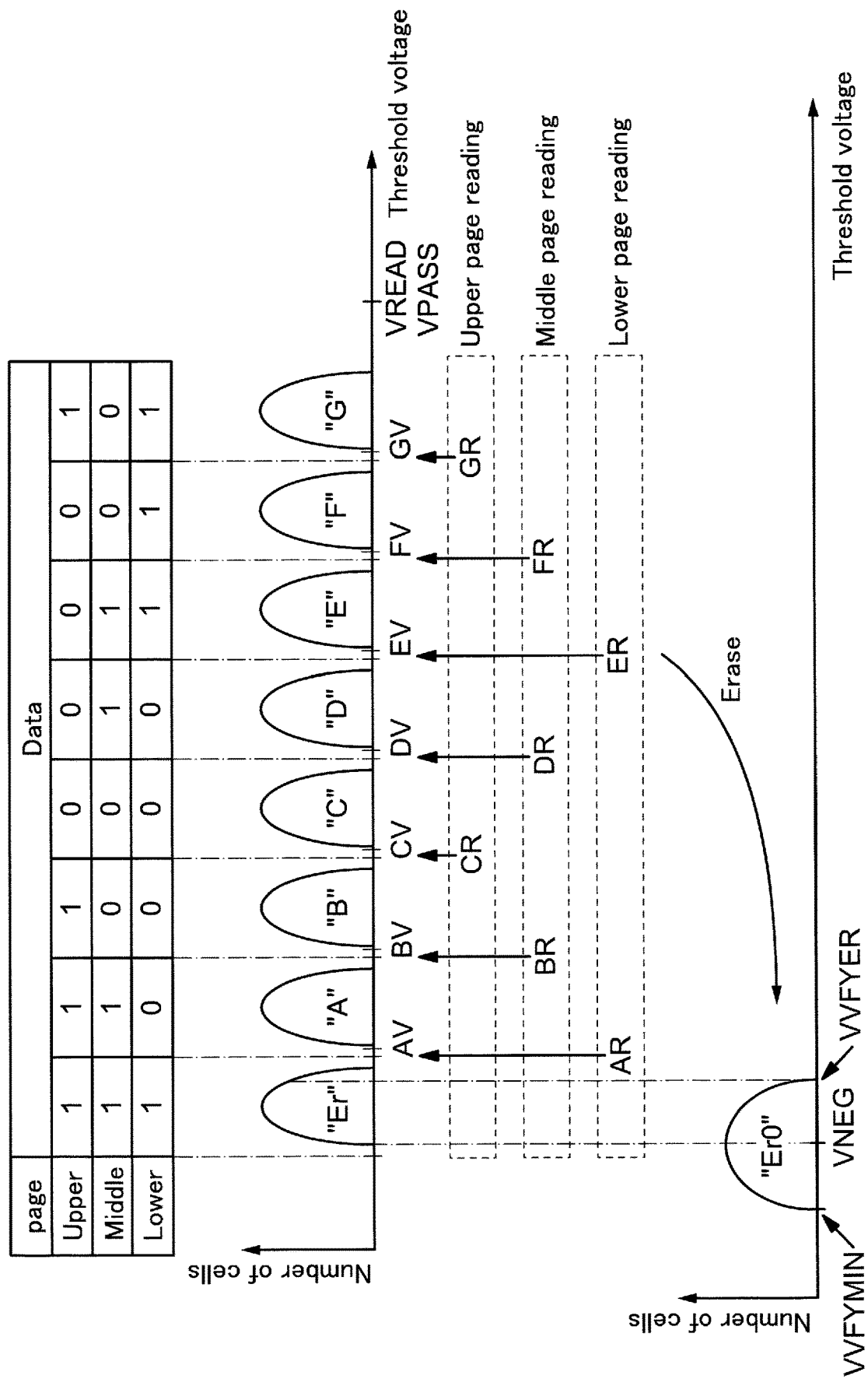
FIG. 13 is a diagram illustrating a threshold distribution of the memory cell transistor according to the first embodiment.

FIG. 13 shows an example of the threshold voltage distributions, data allocation, read voltages, and verify voltages of the memory cell transistors MT. The vertical axis of the threshold voltage distribution shown in FIG. 13 corresponds to the number of memory cell transistors MT (number of cells), and the horizontal axis corresponds to a threshold voltage Vth of the memory cell transistor MT.

As shown in FIG. 13, in the TLC method, the plurality of memory cell transistors form eight threshold voltage distributions. In the memory system 3, the eight threshold voltage distributions may be referred to as write levels. The write levels are referred to as an "Er", "A", "B", "C", "D", "E", "F", or "G" level in order from a lower threshold voltage. Different 3-bit data, for example, as shown below, is assigned to these write levels. This 3-bit data is referred to as a lower-order bit (Lower), a middle-order bit (Middle), and an upper-order bit (Upper).

"Er" level: "111" data
"A" level: "110" data
"B" level: "100" data
"C" level: "000" data
"D" level: "010" data
"E" level: "011" data
"F" level: "001" data
"G" level: "101" data It should be noted that the above-described information is expressed in an Upper, Middle, Lower order.

A set of Lower bits held by the memory cell transistors MT connected to the same word line is called a Lower page, a set of Middle bits is called a Middle page, and a set of Upper bits is called an Upper page. The write operation and the read operation of data are executed on a page-by-page basis.

In the write operation, the program operation and the verify operation are repeatedly executed. The program operation is an operation of increasing the threshold voltage of the memory cell transistor MT by a predetermined voltage. Every time the program operation is executed, the verify operation is executed, and the threshold voltage of the memory cell transistor MT after the program operation is read, and it is evaluated whether or not a desired threshold voltage has been reached. In the case where it is determined by the verify operation that the desired threshold voltage has not been reached, the program operation is executed again. In the memory system 3, a predetermined voltage is referred to as a voltage step width.

Between adjacent threshold voltage distributions, a verify voltage serving as an evaluation criteria in each verify operation is set. Specifically, verify voltages AV, BV, CV, DV, EV, FV and GV are set corresponding to the "A" level, the "B" level, the "C" level, the "D" level, the "E" level, the "F" level, and the "G" level, respectively.

For example, the verify voltage AV is set between a maximum threshold voltage at the "Er" level and a minimum threshold voltage at the "A" level. When the verify voltage AV is applied to the memory cell transistor, the memory cell transistor whose threshold voltage is included in the "Er" level is turned on, and the memory cell transistor whose threshold voltage is included in the threshold voltage distribution whose threshold voltage is equal to or higher than the "A" level is turned off.

The other verify voltages BV, CV, DV, EV, FV and GV are also set in the same manner as the verify voltage AV. The verify voltage BV is set between the "A" level and the "B" level. The verify voltage CV is set between the "B" level and the "C" level. The verify voltage DV is set between the "C" level and the "D" level. The verify voltage EV is set between the "D" level and the "E" level. The verify voltage FV is set between the "E" level and the "F" level. The verify voltage GV is set between the "F" level and the "G" level.

For example, the verify voltage AV may be set to 0.8V, the verify voltage BV may be set to 1.6V, the verify voltage CV may be set to 2.4V, the verify voltage DV may be set to 3.1V, the verify voltage EV may be set to 4.6V, and the verify voltage GV may be set to 5.6V. However, the verify voltages AV to GV are not limited to the above-described voltage. The verify voltages AV to GV may be set in stages as appropriate, for example, within 0.0V to 7.0V.

Between the adjacent threshold voltage distributions, the read voltage used in each read operation is set. For example, a read voltage AR for determining whether the threshold voltage of the memory cell transistor MT is included in the "Er" level or is included in the "A" level or higher is set between the maximum threshold voltage at the "Er" level and the minimum threshold voltage at the "A" level.

Other read voltages BR, CR, DR, ER, FR and GR are also set between adjacent levels, similar to the read voltage AR. For example, the read voltage BR is set between the "A" level and the "B" level. The read voltage CR is set between the "B" level and the "C" level. The read voltage DR is set between the "C" level and the "D" level. The read voltage ER is set between the "D" level and the "E" level. The read voltage FR is set between the "E" level and the "F" level. The read voltage GR is set between the "F" level and the "G" level.

A voltage VREAD applied to the unselected WL during the read operation is set to a voltage value that is higher than the maximum threshold voltage of the highest threshold voltage distribution (for example, the "G" level). The memory cell transistor MT having the voltage VREAD applied thereto is turned on regardless of the data to be stored.

The verify voltages AV, BV, CV, DV, EV, FV and GV are set to voltages higher than the read voltages AR, BR, CR, DR, ER, FR and GR, respectively. That is, the verification voltages AV to GV are set near the bottom of the threshold voltage distribution of the "A" level, "B" level, "C" level, "D" level, "E" level, "F" level, and "G" level, respectively.

In the case where the above-described data allocation is applied, one-page data of the lower bits (Lower page data) in the read operation is determined by the read data using the read voltages AR and ER. One-page data of the middle bits (Middle page data) is determined by the read-out voltages BR and DR and the read-out result using the read voltage FR. One-page data of the upper bits (Upper page data) is determined by the read data using the read voltages CR and GR. As described above, since the Lower page, Middle page, and Upper page data are determined by two times, three times, two times read operations, respectively, this data allocation is referred to as a "2-3-2 code".

<1-1-9. Threshold Voltage Distribution in Erase State>

Figure 14:
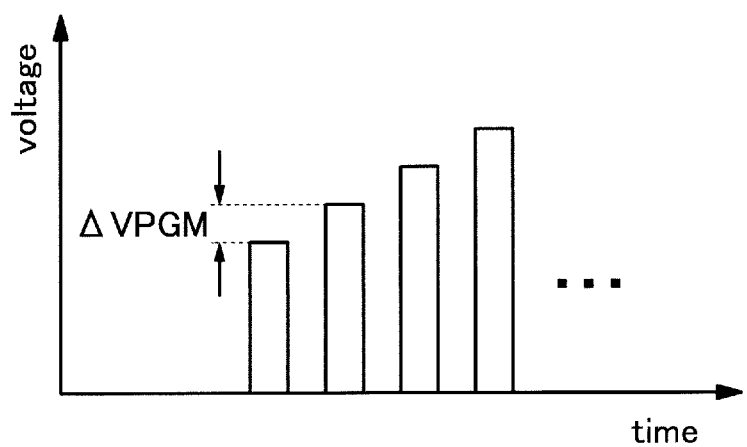
FIG. 14 is a diagram for explaining a program voltage in a program operation of the semiconductor memory device according to the first embodiment.

Referring to FIG. 13 and FIG. 14, the threshold voltage profile immediately after the erase operation is executed on the memory cell transistor MT in which the write operation is executed will be described. When the erase operation (Erase) is executed, all the memory cell transistors MT to be erased are transitioned to an "Er0" level. The threshold voltage of the memory cell transistor MT in the "Er0" level is less than a voltage VVFYER and is equal to or higher than a voltage VVFYMIN. The voltage VVFYER is a voltage (for example, 0V) that is less than or equal to the voltage AV and greater than a voltage VNEG. The voltage VVFYMIN is the lowest threshold voltage that can be taken by the memory cell transistor MT by the erase operation, and is a voltage lower than the voltage VNEG. The voltage VNEG is, for example, a negative voltage (<0V) and is the lowest voltage that can be generated in the semiconductor memory device 1. The "Er0" level shown in FIG. 13 includes a state having a threshold voltage less than a voltage Vnn. On the other hand, an "Er" level does not include a state having a threshold voltage less than the voltage Vnn. In this respect, the "Er0" level and the "Er" level are different.

The memory cell transistors MT belonging to the "ErG" level do not belong to any of the levels "A" to "G" because the threshold voltage is controlled to be equal to or lower than the voltage VVFYER. Since the memory cell transistor MT has a threshold voltage lower than the voltage VNEG, the memory cell transistor MT is turned on even in the case where the lowest voltage among the voltages that can be generated in the semiconductor memory device 1 is applied to the word lines WL.

Hereinafter, the memory cell transistor MT whose threshold voltage is lower than the voltage VNEG is referred to as an "over-erased cell". The threshold voltage of the over-erased cell is lower than the lowest voltage supplied during the read operation. In other words, even if the minimum voltage is applied to the word lines WL, the over-erased cell cannot be controlled to be in an off-state, which may lead to erroneous writing and erroneous reading. In the memory system 3, in order to reduce the number of over-erased cells, a program operation for increasing the threshold voltage of the over-erased cells is executed on the memory cell transistor MT determined to be the over-erased cell. In the memory system 3, the program operation executed to reduce the number of the over-erased cells is referred to as an "over-erased cell program operation (primary write operation)" as distinguished from the program operation in a normal write operation. In addition, in the memory system 3, in order to distinguish the program operation and the verify operation in the normal write operation, the program operation and the verify operation in the primary write operation are referred to as an "EP program operation (an EP Program)" and an "EP verify operation (an EP Verify)".

In the memory system 3, after the erase operation and the primary write operation are executed as a series of operations for all the memory cell transistors MT, the secondary write operation and the tertiary write operation may be executed. Further, after the erase operation is completed for all the memory cell transistors MT, the primary write operation, the secondary write operation, and the tertiary write operation may be executed as a series of operations. For example, the write operation of the memory system 3 according to the first embodiment includes the primary write operation, the secondary write operation, and the tertiary write operation. Further, for example, in the memory system 3 according to the first embodiment, an operation in which the erase operation and the primary write operation are executed as a series of operations for all the memory cell transistors MT and then the secondary write operation and the tertiary write operation are executed as the first operation, and an operation in which the erase operation is completed for all the memory cell transistors MT and then the primary write operation, the secondary write operation, and the tertiary write operation are executed as a series of operations is regarded as the second operation. In the first operation, since the erase operation and the primary write operation are executed as the series of operations, the time required for the erase operation of the first operation is regarded as, for example, the time obtained by adding the time of the primary write operation of all the memory cell transistors MT belonging to the select gate lines SGD0 to SGD5 to the time of the erase operation. On the other hand, in the second operation, after the erase operation is executed, the primary write operation, the secondary write operation, and the tertiary write operation are executed as the series of operations, so that the time required for the erase operation+ the write operation of the memory system 3 according to the first embodiment can be regarded as a time for each of all the memory cell transistors MT belonging to the select gate lines SGD. For example, in the second operation, the time required for the erase operation and the write operation of the memory system 3 according to the first embodiment can be regarded as the time obtained by adding the time required for the series of operations of the primary write operation, the secondary write operation, and the tertiary write operation to the time required for the erase operation of all the memory cell transistors MT belonging to the select gate line SGD0. As a result, in the memory system 3, in the case where the second operation is used, it is possible to suppress an overhead of the time required for the erase operation and the series of operations of the primary write operation, the secondary write operation, and the tertiary write operation.

In the primary write operation, the voltage applied to the memory cell transistor MT in order to increase the threshold voltage of the memory cell transistor MT is referred to as a program voltage. The EP program operation in the primary write operation is alternately executed with the EP verify operation, and the program voltage is stepwise increased at a predetermined voltage range (ΔVPGM) every time the EP program operation is executed (see FIG. 14). In FIG. 14, the horizontal axis (time) represents the number of times the program operation is executed, and the vertical axis (voltage) represents the program voltage applied to the memory cell transistor MT.

<1-1-10. Primary Write Operation>

In the case where the memory cell transistor MTo4 is the over-erased cell in the memory cell transistors MT facing each other as in the memory system 3, the memory cell transistor MTo4 cannot be turned off. For example, a current flows through the memory cell transistor MTo4 even if the EP verify operation is executed on the memory cell transistor MTo4 or the EP verify operation is executed on the memory cell transistor MTe4. Therefore, it is difficult to determine which of the memory cell transistors MT facing each other is the over-erased cell.

Figure 15:
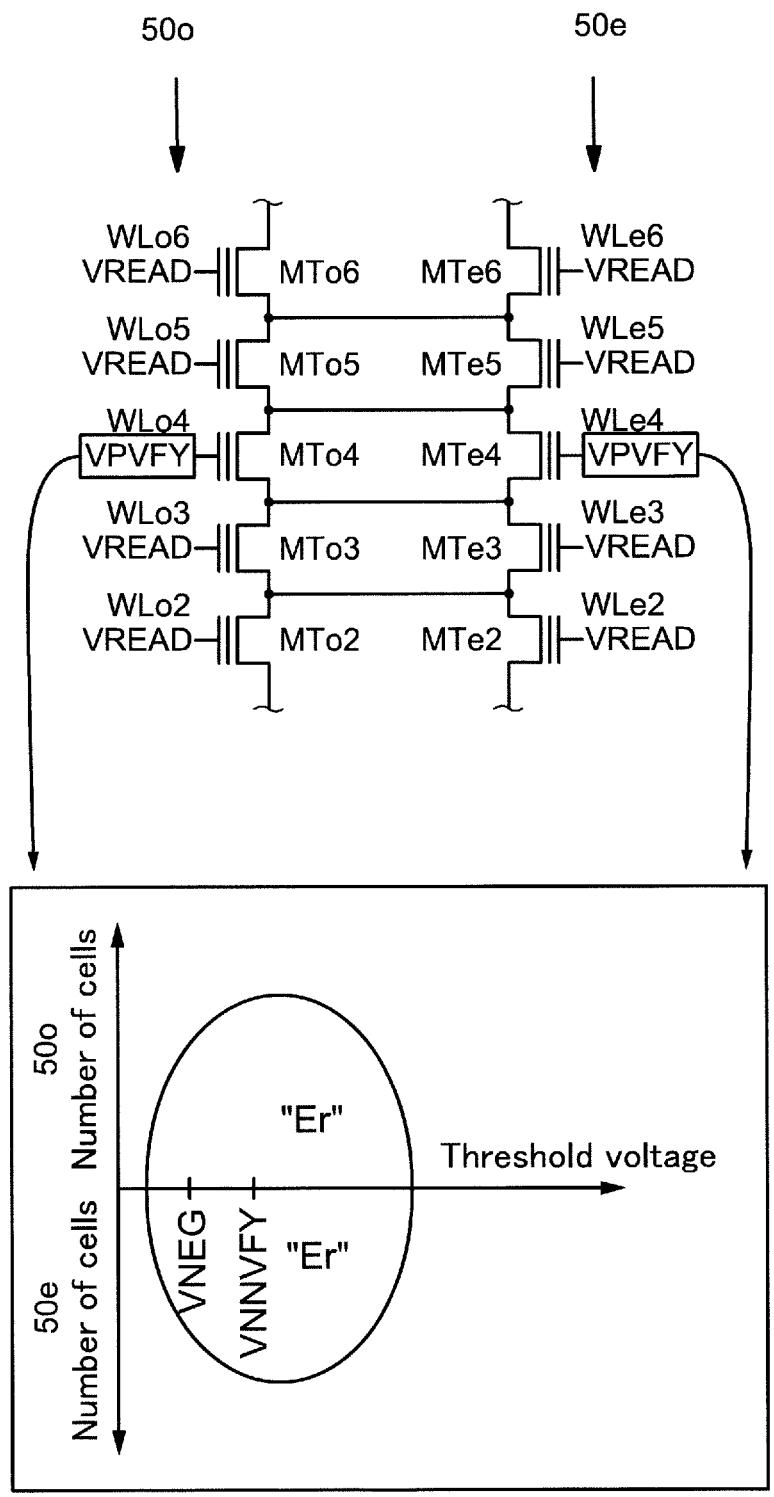
FIG. 15 is a diagram for explaining a verify operation in a semiconductor memory device according to a comparative example.
Figure 16:
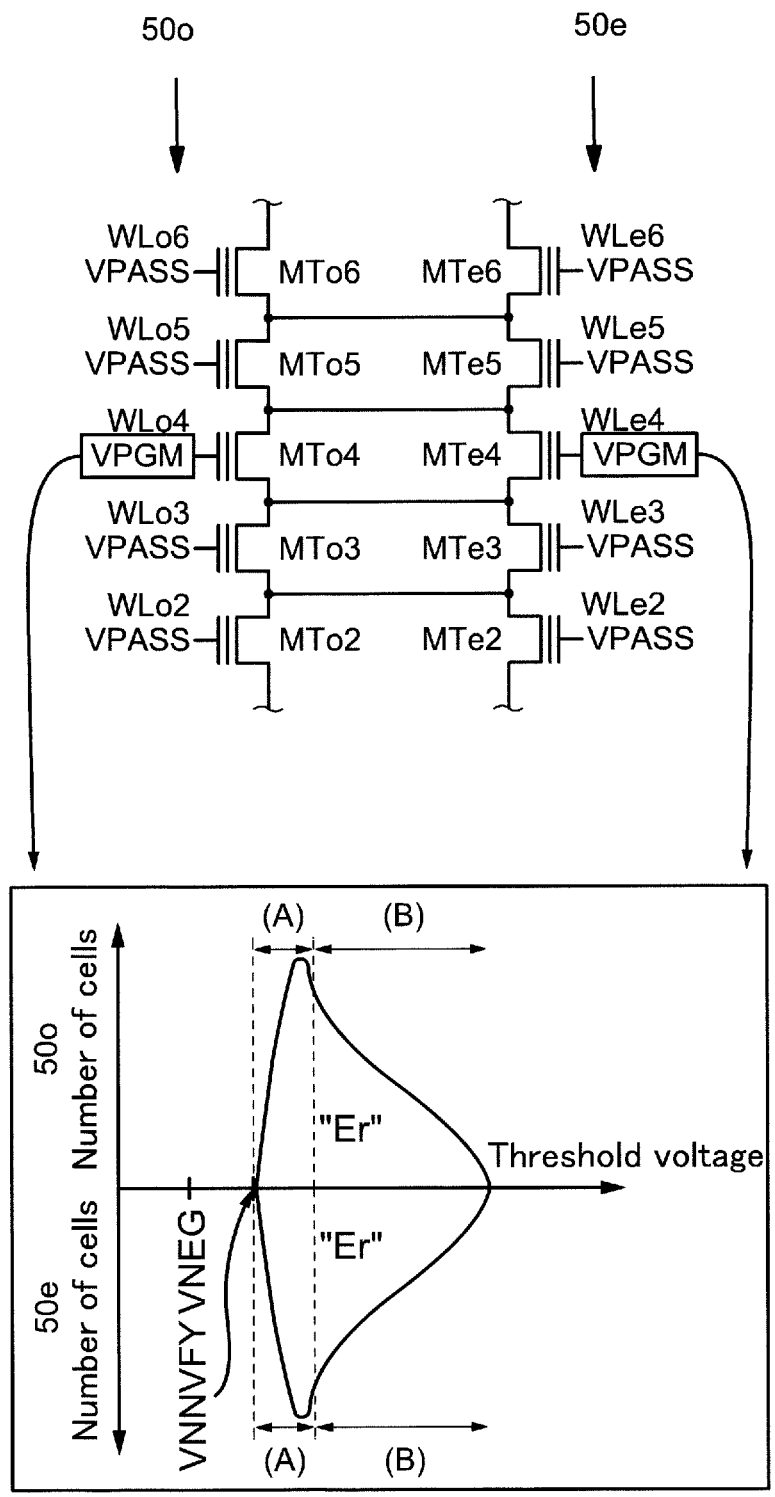
FIG. 16 is a diagram for explaining a program operation in the semiconductor memory device according to the comparative example.

First, the primary write operation (1$^{st}$ write operation) according to a comparative example will be described with reference to FIG. 15 and FIG. 16. FIG. 15 is a diagram for explaining a threshold distribution of the memory cell transistor MT after the EP verify operation and the EP verify operation according to the comparative example. FIG. 16 is a diagram for explaining the threshold distribution of the memory cell transistors MT after the EP program operation and the primary writing operation according to the comparative example. Note that upper vertical axes of the threshold voltage distributions shown in FIG. 15 and FIG. 16 correspond to the number (50o number of cells) of the memory cell transistors MTo included in the memory string 50o, the lower vertical axes of the threshold voltage distributions shown in FIG. 15 and FIG. 16 correspond to the number (50e number of cells) of the memory cell transistors MTe included in the memory string 50e, and the horizontal axes correspond to the threshold voltage Vth (Threshold voltage) of the memory cell transistor MT.

The primary write operation according to the comparative example is an operation of eliminating the over-erased cell by one primary write operation. In order to solve the problem of the over-erased cell, the EP verify operation is collectively executed on the memory cell transistors MT facing each other. Specifically, as shown in FIG. 15, a verify voltage VPVFY is supplied to both of the memory cell transistors MT facing each other (for example, MTo4 and MTe4), and the voltage VREAD is supplied to the other memory cell transistors. In the semiconductor memory device 1, the voltage VPVFY may be referred to as a "first voltage".

In the case where the over-erased cell is detected in the EP verify operation according to the above-described comparative example, the EP program operation is collectively executed on the memory cell transistors MT facing each other. Specifically, a program voltage (the EP voltage) VPGM for the over-erased cell is supplied to the memory cell transistor MT in which the EP program operation is executed, and a voltage VPASS is supplied to the other memory cell transistors MT. In the semiconductor memory device 1, the voltage VPASS may be referred to as a "second voltage".

As described above, the primary write operation is a program operation which increases the threshold voltage of the memory cell transistor MT determined to be the over-erased cell. By the primary write operation according to the comparative example, the threshold voltage of the memory cell transistor MT having the threshold voltage lower than the voltage VNEG in the threshold voltage distribution in the "Er" level illustrated in FIG. 15, for example, is increased in voltage. Consequently, as shown in FIG. 16, the threshold voltages of the memory cell transistors MT are all higher than a voltage VNNVFY.

In the EP verify operation according to the comparative example, the verify voltage VPVFY is supplied to both of the memory cell transistors MT facing each other at the same time. For example, even in the case where the memory cell transistor MTo4 is the over-erased cell and the memory cell transistor MTe4 facing the memory cell transistor MTo4 is not the over-erased cell, the verify voltages VPVFY are simultaneously supplied to the memory cell transistors MTo4 and MTe4. Therefore, the threshold voltage of the memory cell transistor MTo4 is greater than the voltage VNEG, and the over-erased state is improved. However, since the over-erased voltage is written to the memory cell transistor MTe4 which is not the over-erased cell, the threshold voltage of the memory cell transistor MTe4 is further increased.

The primary write operation (the EP program operation and the EP verify operation) is executed until both thresholds of the memory cell transistors MT facing each other exceed the voltage VNNVFY. That is, the threshold voltage distribution of the memory cell transistors MT facing each other is limited to the memory cell transistor MT having a lower threshold voltage. Therefore, a shape of the threshold voltage distribution after the primary write operation according to the comparative example depends on the threshold voltage distribution in the "Er" level in addition to a voltage width in the EP program operation. In the threshold voltage distribution shown in FIG. 16, a profile of a range (A) is a profile depending on the voltage width in the EP program operation, and is a distribution having a relatively small width. On the other hand, a profile of a range (B) is a profile that depends on the threshold voltage distribution in the "Er" level prior to executing the primary write operation according to the comparative example (see FIG. 15), and is a distribution having a relatively large width.

As described above, in the comparative example, since the primary write operation is collectively executed on the memory cell transistors MT facing each other, the primary write operation is also executed on the memory cell transistors MT that are not the over-erased cells. As a result, the profile in the range (B) is formed, and it is difficult to reduce the width of the threshold voltage distribution after the primary write operation.

Figure 17:
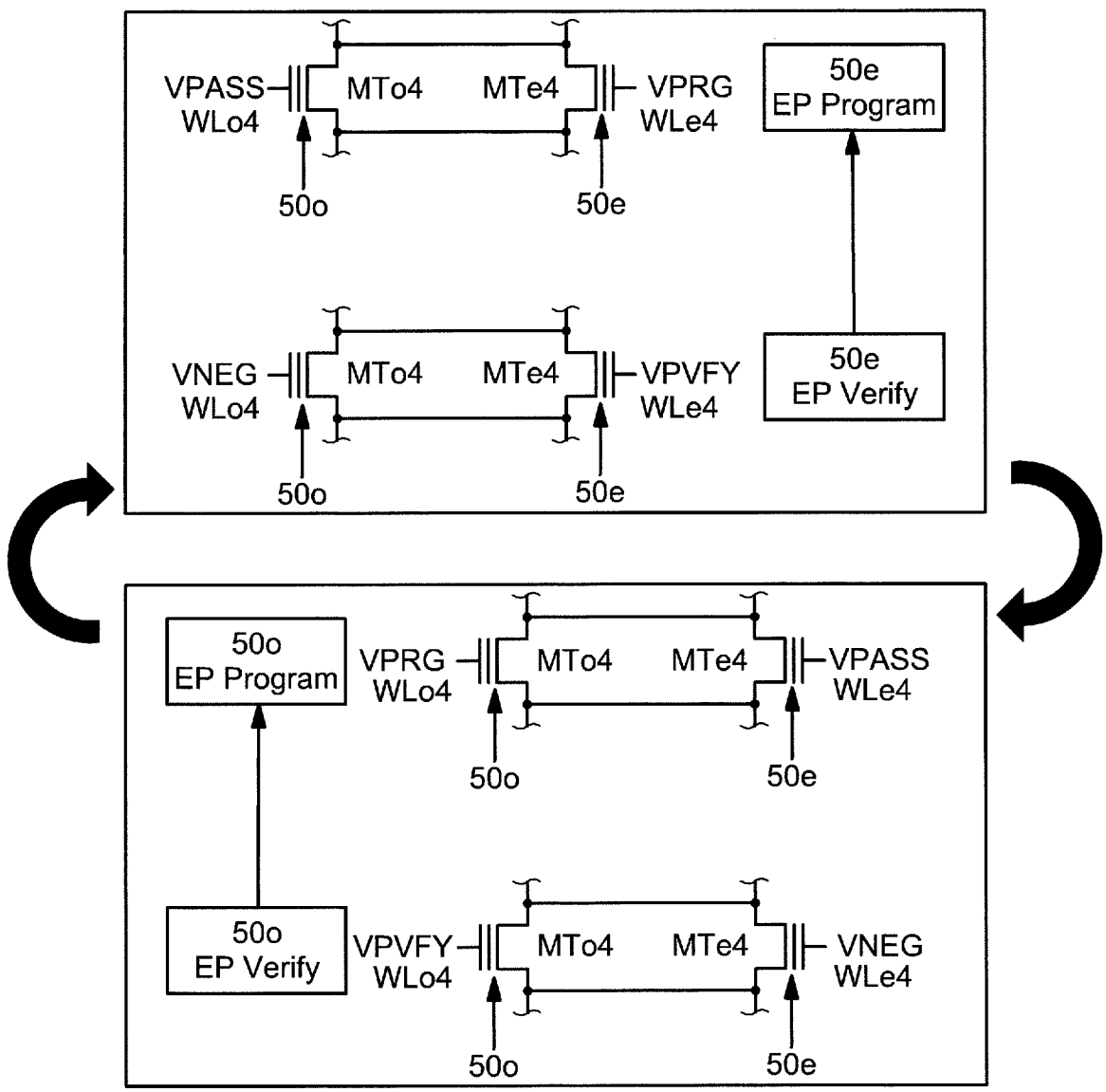
FIG. 17 is a diagram for explaining a primary write operation in the semiconductor memory device according to the first embodiment.
Figure 18:
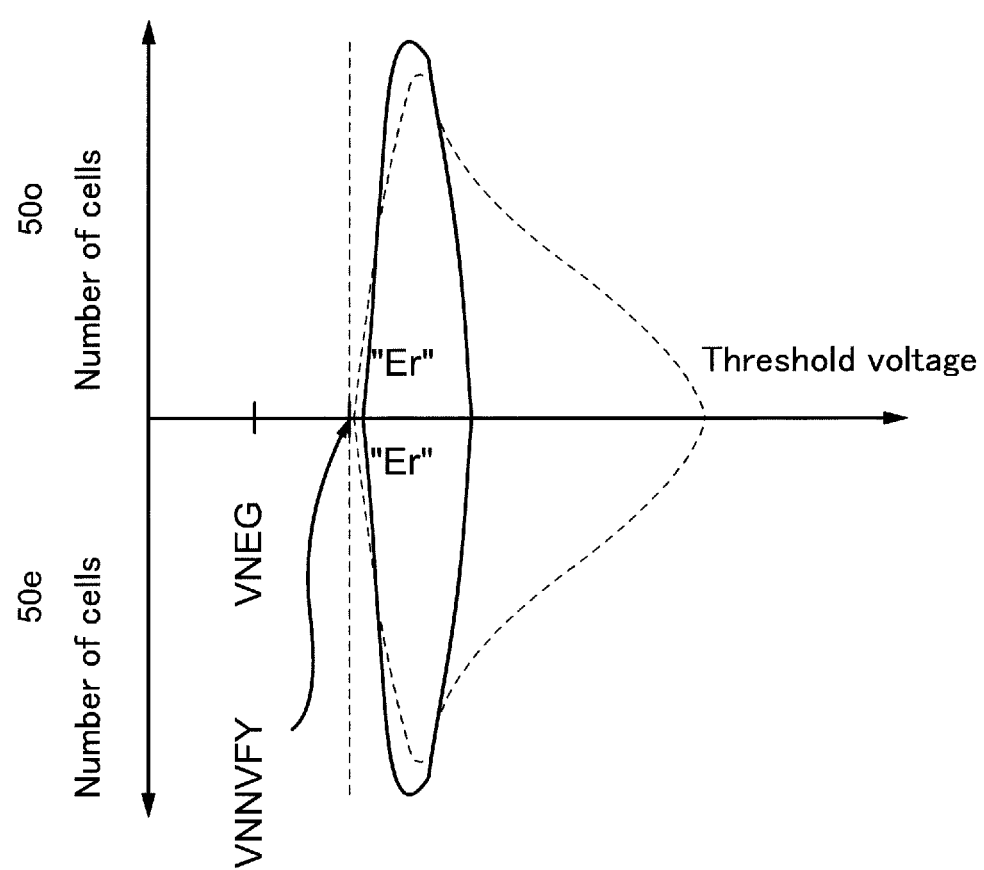
FIG. 18 is a diagram for explaining a threshold distribution of the memory cell transistor after the primary write operation in the semiconductor memory device according to the first embodiment.

The primary write operation (first write operation) according to the present embodiment will be briefly described below with reference to FIG. 17 and FIG. 18. FIG. 17 is a diagram for explaining the primary write operation in the semiconductor memory device 1. FIG. 18 is a diagram for explaining a threshold value of the memory cell transistor MT after the primary write operation in the semiconductor memory device 1. As shown in FIG. 17, in the primary write operation according to the present embodiment, the primary write operation (the EP verify operation and the EP program operation) for the memory cell transistor MT included in the memory string 50e and the primary write operation (the EP verify operation and the EP program operation) for the memory cell transistor MT included in the memory string 50o are alternately executed a plurality of times. The plurality of times is, for example, N times, and the numerical value N is an integer of 2 or more.

For example, the memory cell transistor MTe4 is supplied with the voltage VPVFY, the memory cell transistor MTo4 facing the memory cell transistor MTe4 is applied with the voltage VNEG, the EP verify operation is executed to the memory cell transistor MTe4 included in the memory string 50e, the memory cell transistor MTe4 is applied with a voltage VPRG, the memory cell transistor MTo4 is applied with the voltage VPASS, and the EP program operation is executed to the memory cell transistor MTe4 included in a memory string 50e. Subsequently, with the memory cell transistor MTo4 being applied with the voltage VPVFY, the memory cell transistor MTe4 facing the memory cell transistor MTo4 is applied with the voltage VNEG, and the memory cell transistor MTo4 included in the memory string 50o is subjected to the EP verify operation, and with the memory cell transistor MTo4 being applied with the voltage VPRG, the memory cell transistor MTe4 facing the memory cell transistor MTo4 included in the memory string 50o is applied with the voltage VPASS, and the memory cell transistor MTo4 is subjected to the EP program operation. In the semiconductor memory device 1, the voltage VPRG may be referred to as a "third voltage".

In the primary write operation according to the present embodiment, for example, even in the case where the memory cell transistor MTo4 is the over-erased cell and the memory cell transistor MTe4 facing the memory cell transistor MTo4 is not the over-erased cell, the primary write operation with respect to the memory cell transistor MTo4 and the primary write operation with respect to the memory cell transistor MTe4 are alternately executed, so that the same voltage is not applied collectively as in the comparative example. As a result, it is possible to reduce the width of the threshold voltage distribution after the primary write operation while reducing the over-erased state of the memory cell transistor MTo4.

<1-1-11. Two-Stage Write Operation>

Figure 19:
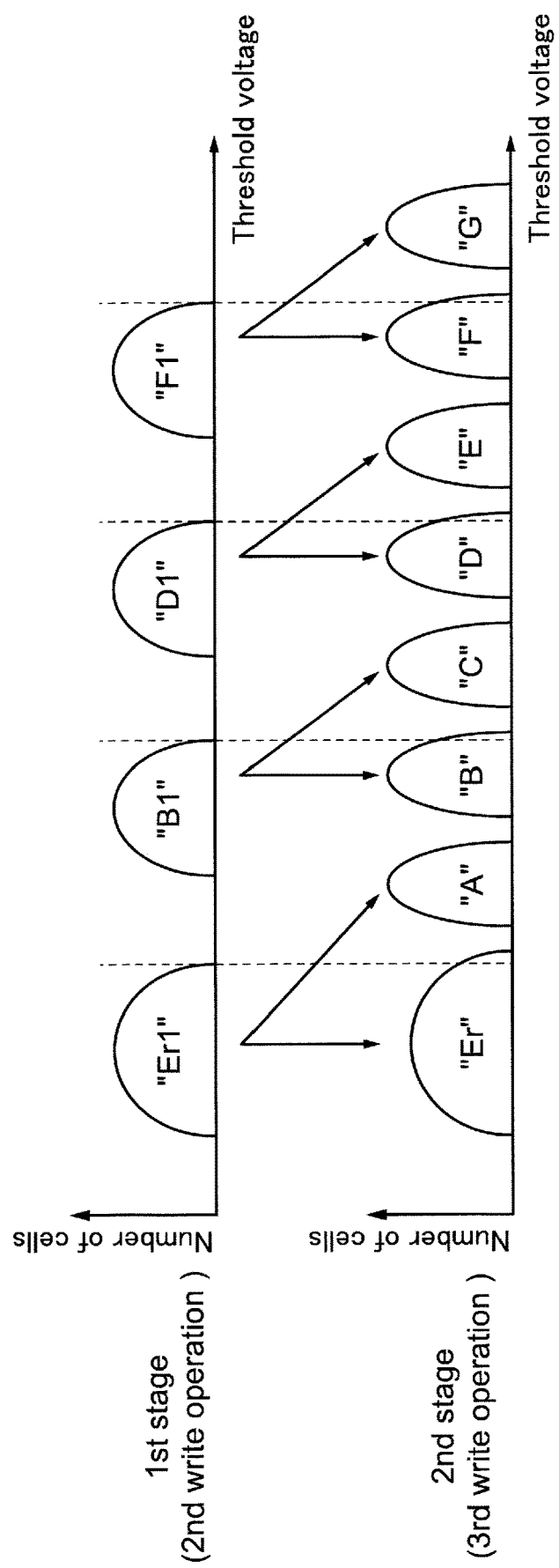
FIG. 19 is a diagram for explaining a two-stage write operation in the semiconductor memory device according to the first embodiment.

A two-stage write operation of the semiconductor memory device 1 will be described with reference to FIG. 19. In the memory system 3, the write operation for one memory cell is realized by a plurality of write operations. Such a write operation is referred to as a multi-stage write operation. The write operation differs depending on the number of stages of the write operation.

In the memory system 3 (the semiconductor memory device 1), the two-stage write operation is executed after the primary write operation. The two-stage write operation includes the write operation (the secondary write operation ($2^{nd}$ write operation)) of a first stage ($1^{st}$ stage) and the write operation (the tertiary write operation ($3^{rd}$ write operation)) of a second stage ($2^{nd}$ stage).

Similar to the primary write operation, the secondary write operation includes the program operation and the verify operation. The program operation of the secondary write operation is an operation of programming a voltage corresponding to the "Er1" level, the "B1" level, the "D1" level, and the "F1" level to the memory cell transistor MT. The verify operation of the secondary write operation is an operation for confirming that the threshold voltages of the memory cell transistors MT have reached the respective levels after the respective program operations of the "Er1" level, the "B1" level, the "D1" level, and the "F1" level. Similar to the primary write operation, the secondary write operation is executed a plurality of times until a voltage corresponding to the "Er1", "B1", "D1", and "F1" levels is programmed to the memory cell transistor MT in the case where the voltage corresponding to the "Er1", "B1", "D1", and "F1" levels is not programmed to the memory cell transistor MT. The secondary write operation forms the "Er1" level, the "B1" level, the "D1" level, and the "F1" level.

Similar to the primary write operation, the tertiary write operation includes the program operation and the verify operation. The program operation of the tertiary write operation is an operation of programming the memory cell transistor MT with a voltage corresponding to the "Er" level to "G" level. The verify operation of the tertiary write operation is an operation for confirming that the threshold voltage of the memory cell transistor MT has reached the respective level after the respective program operations of the "Er" level to the "G" level. Similar to the primary write operation, when a voltage corresponding to the "Er" level to "G" level is not programmed in the memory cell transistor MT, the tertiary write operation is executed a plurality of times until a voltage corresponding to the "Er" level to "G" level is programmed in the memory cell transistor MT. The tertiary write operation after the secondary write operation forms the "Er" level to the "G" level.

The "B1" level, the "D1" level, and the "F1" level after the secondary write operation are larger than the "B" level, the "D" level, and the "F" level after the tertiary write operation, respectively. The number of write levels after the secondary write operation (4) is smaller than the number of write levels after the tertiary write operation (8). The "Er" level after the tertiary write operation is larger than the "Er1" level after the secondary write operation due to the unintended increase in the threshold voltage caused by the interference-effect and the effect of the program disturbance.

In the two-stage write operation, a rough write operation is executed in the secondary write operation, and a detailed write operation is executed in the tertiary write operation. Specifically, in the case where the final write level (the write level after the tertiary write operation) is at the "Er" level or the "A" level, the write operation is written to the "Er1" level by the secondary write operation and then written to the "Er" level or the "A" level by the tertiary write operation.

As described above, after being written to the "B1" level by the secondary write operation, it is written to the "B" level or the "C" level by the tertiary write operation. Similarly, after being written to the "D1" level by the secondary write operation, it is written to the "D" level or the "E" level by the tertiary write operation. Similarly, after being written to the "F1" level by the secondary write operation, it is written to the "F" level or the "G" level by the tertiary write operation.

The upper end of the threshold distribution at the smallest level among the plurality of levels after the tertiary write operation separated from one level after the secondary write operation is located on the higher voltage side than the upper end of the threshold distribution at the level before the separation (the level after the secondary write operation). Specifically, the upper end of the threshold distribution at the "B" level is located higher than the upper end of the threshold distribution at the "B1" level. In the write operation in each stage, since the threshold voltage can only be increased, the above-described write operation is executed.

In the memory cell transistor MT included in the semiconductor memory device 1, the threshold voltage of the written memory cell transistor MT (target memory cell transistor MT) is changed by the write operation of the other memory cell transistor MT executed after the write operation of the memory cell transistor MT. As described above, the threshold voltage of the target memory cell transistor MT is changed by the write operation of the other memory cell transistor MT.

By dividing the write operation into a plurality of stages, the effect of the write operation on the other memory cell transistors MT due to the write operation can be reduced.

<1-1-12. Three-Layer Cutoff>

Figure 20:
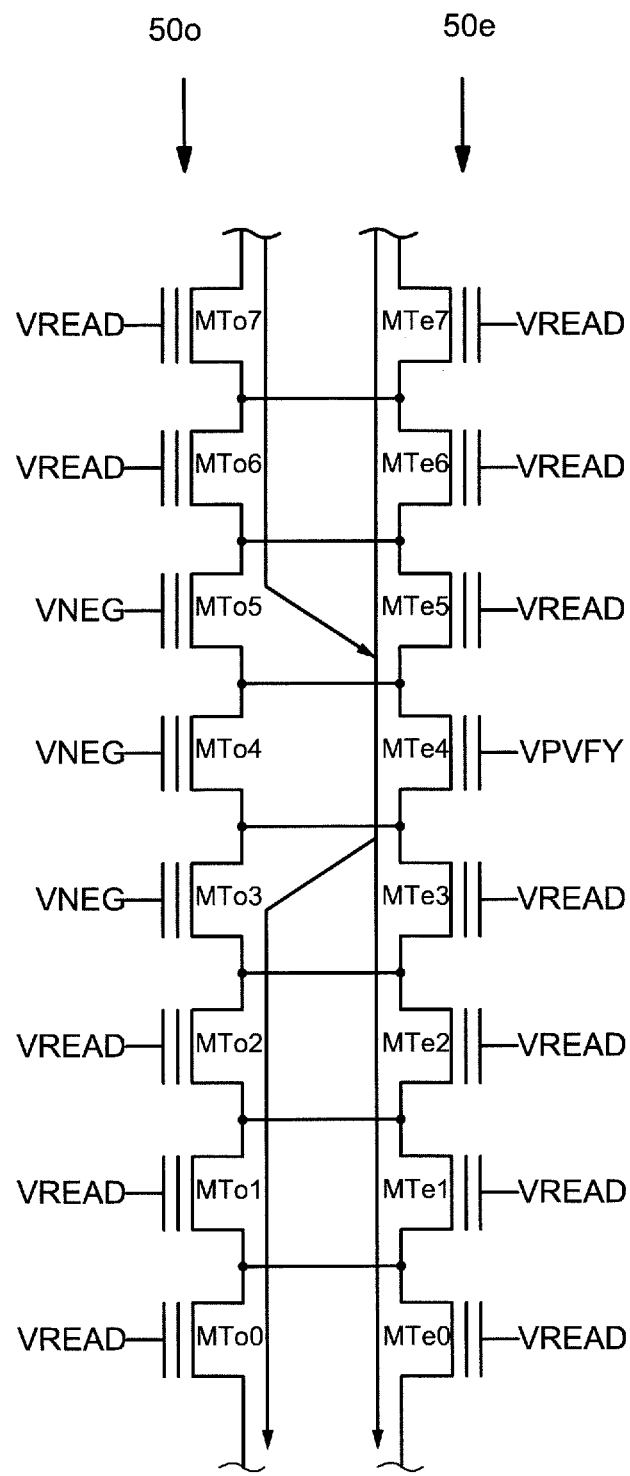
FIG. 20 is a diagram for explaining a three-layer cutoff read operation in the semiconductor memory device according to the first embodiment.

The three-layer cutoff will be described with reference to FIG. 20. As shown in FIG. 12, the channels of the memory cell transistors MT facing each other share a portion of the memory pillar MP. That is, the source-to-source and drain-to-drain of the memory cell transistor MT facing each other are electrically connected. For example, as shown in FIG. 20, in the case where the EP verify operation is executed on the memory cell transistor MTe4 of the memory string 50e, at least the memory cell transistor MTo4 of the memory string 50o needs to be forcibly turned off. Accordingly, the cutoff property of the memory cell transistor MTo4 can be improved.

Ideally, only the memory cell transistor MT facing the memory cell transistor MT that executes the EP verify operation is forcibly turned off. However, for example, if the gate length of the memory cell transistor is short, the current flowing from the opposing memory cell transistor MT to the memory cell transistor MT executing the write operation may not be sufficiently suppressed in the cutoff property of the opposing memory cell transistor. In this case, not only the opposing memory cell transistor MT but also the memory cell transistor MT located above and below the memory cell transistor or the memory cell transistor MT located above or below the memory cell transistor can be forcibly turned off to compensate for the cutoff property. In the case where the opposing memory cell transistor MT and the memory cell transistor MT located above and below the opposing memory cell transistors are forcibly turned off, the memory cell transistor MT belonging to a three-layer word line is turned off, and is therefore referred to as "three-layer cutoff".

FIG. 20 exemplarily illustrates the EP verify operation of a three-layer cutoff. The voltage VPVFY for reading the data of the memory cell transistor MT is supplied to the gate of the memory cell transistor MTe4, which is an EP verification target. The voltage VREAD is supplied to the gates of the memory cell transistors MTe0 to MTe3 and MTe5 to MTe7 to force the respective memory cell transistor MT to turn on. The gates of the memory cell transistor MTo3 to MTo5 are supplied with the voltage VNEG that forcibly turns off the memory cell transistor MT. The gates of the memory cell transistor MTo0 to MTo2 and MTo6 to MTo7 are supplied with the voltage VREAD. That is, as described above, in the three-layer cutoff EP verify operation, the memory cell transistor MT facing the memory cell transistor MT to be EP verified and the memory cell transistor MT provided in the upper and lower adjacent layers thereof are forcibly turned off.

<1-2. Write Operation>

Figure 21:
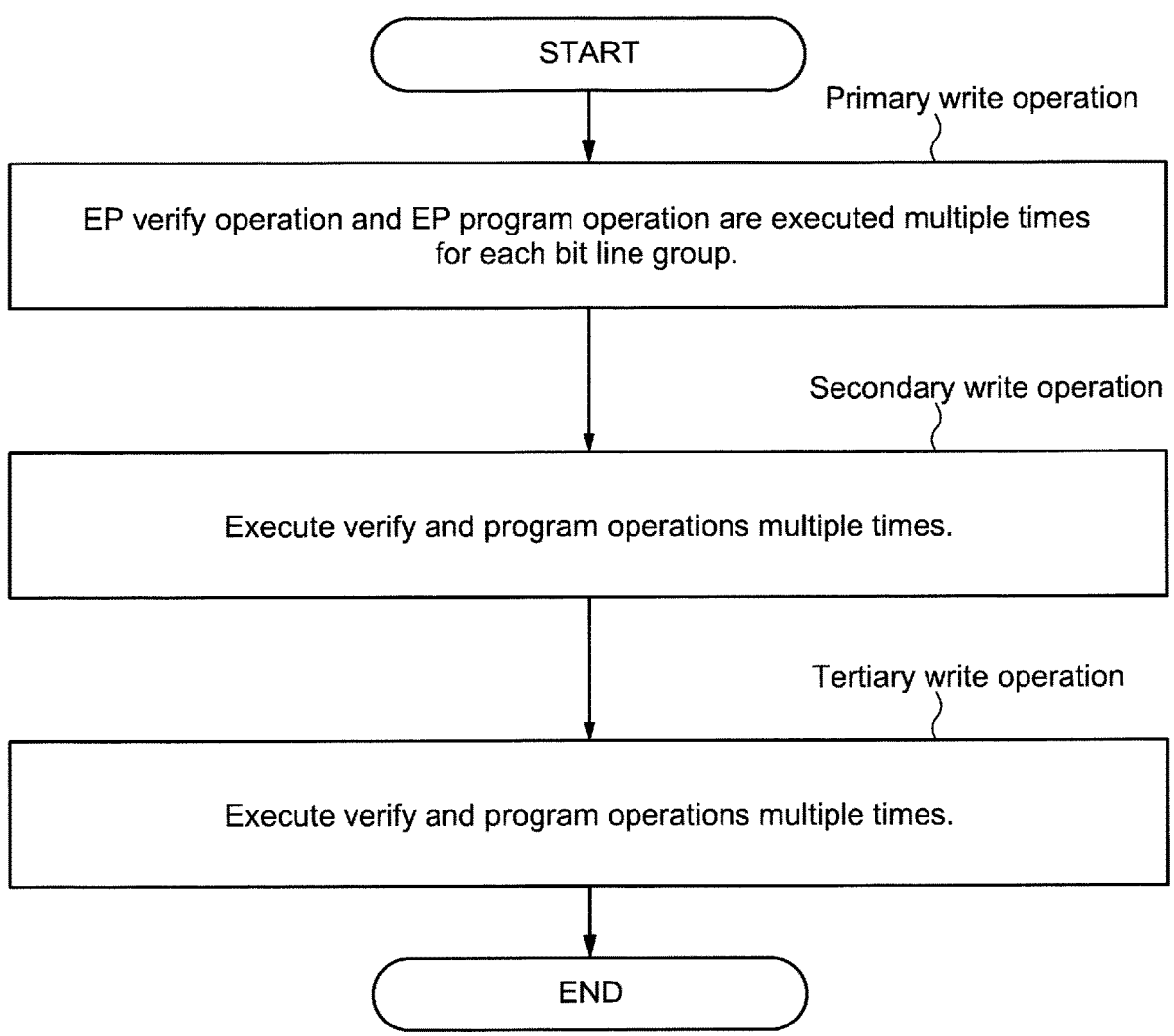
FIG. 21 is a flowchart illustrating a write operation of the semiconductor memory device according to the first embodiment.

With reference to FIG. 21 to FIG. 33, the order of the write operation of the semiconductor memory device 1 according to the first embodiment will be described. As described in "1-1-1. Memory System" and "1-1-2. Configuration of Semiconductor Memory Device", the write operation of the semiconductor memory device 1 according to the first embodiment is controlled using the sequencer 24 based on a signal or the like transmitted from the memory controller 2 to the semiconductor memory device 1. The write operation of the semiconductor memory device 1 according to the first embodiment includes the primary write operation, the secondary write operation, and the tertiary write operation. In FIG. 21 or FIG. 22, "SGD0" to "SGD5" corresponds to the select gate lines SGD0 to SGD5 shown in FIG. 3, "GR1" and "GR2" correspond to the first group GR1 and the second group GR2 shown in FIG. 3, and "WL0" to "WL7", "WLe", and "WLo" correspond to the odd-numbered word lines WLo0 to WLo7 and the even-numbered word lines WLe0 to WLe7 shown in FIG. 5 and FIG. 13. "1st", "2nd", and "3rd" shown in FIG. 29 correspond to the primary write operation, the secondary write operation, and the tertiary write operation shown in "1-1-10. Primary Write Operation" and "1-1-11. Two-Stage Write Operation". In the description of FIG. 21 to FIG. 33, descriptions of the same or similar configurations as the description of FIG. 1 to FIG. 20 may be omitted.

<1-2-1. Overview of Write Operation>

As shown in FIG. 21, when the write operation of the semiconductor memory device 1 according to the first embodiment is started, the primary write operation, the secondary write operation, and the tertiary write operation are repeatedly executed. When the tertiary write operation is completed, the write operation of the semiconductor memory device 1 is completed. In the semiconductor memory device 1, the primary write operation is executed in the order of the word line WL7, the word line WL6, the word line WL5, the word line WL4, the word line WL3, the word line WL2, the word line WL1, and the word line WL0.

The primary write operation includes STEP1, STEP2, and STEP3. In a sequence of primary write operations, for example, STEP2 is executed after STEP1 and STEP3 is executed after STEP2. STEP1 includes STEP1A, STEP1B, STEP1C, and STEP1D, STEP2 includes STEP2A, STEP2B, STEP2C, and STEP2D, and STEP3 includes STEP3A, STEP3B, STEP3C, and STEP3D. Specifically, in STEP1, after STEP1A and STEP1B are executed a plurality of times, STEP1C and STEP1D are executed a plurality of times. In STEP2, after STEP2A and STEP2B are executed a plurality of times, STEP2C and STEP2D are executed a plurality of times. In STEP3, after STEP3A and STEP3B are executed a plurality of times, STEP3C and STEP3D are executed a plurality of times. The steps of STEP1A, STEP1B, STEP1C, STEP1D, STEP2A, STEP2B, STEP2C, STEP2D, STEP3A, STEP3B, STEP3C and STEP3C include the EP verify operation and the EP program operation.

Although details will be described later, in each of the steps, the EP verify operation and the EP program operation are executed N times, for example.

Following the primary write operation, the secondary write operation and the tertiary write operation described in "1-1-12. Two-Stage Write Operation" are executed a plurality of times. The plurality of times is, for example, N times. Although the number of times of execution of the primary write operation is N, N times of the primary write operation may be the same as or different from N times of the secondary write operation and the tertiary write operation. As long as the threshold voltage of the memory cell transistor MT to be written is the write operation set to a predetermined level, the number of executions of each of the primary write operation, the secondary write operation, and the tertiary write operation may be the same or may be different.

FIG. 22 is a diagram for explaining an overview of each step of the primary write operation of the semiconductor memory device 1 according to the first embodiment. In the following "1-2-2. STEP1A and STEP1B", and "1-2-3. STEP1C and STEP1D", the operations of the respective steps are described with reference to FIG. 22. In FIG. 22, "EPV" corresponds to the EP verify operation (EP Verify), and "EPP" corresponds to the EP program operation (EP Program). "VFY" corresponds to a voltage VSGVFY and is a voltage applied to the select gate lines SGD0 to SGD5 that execute the EP verify operation, "V" corresponds to the voltage VPVFY and is a voltage applied to the word lines WLe and WLo that execute the EP verify operation, "P" corresponds to the voltage VPGM and is a voltage applied to the word lines WLe and WLo that execute EP verify operation. "S" indicates "SELECT" and "US" indicates "UNSELECT". In the first group GR1 or the second group GR2 in which "S" is described in each step, the EP verify operation or the EP program operation is executed, and in the first group GR1 or the second group GR2 in which "US" is described in each step, the EP verify operation or the EP program operation is not executed.

<1-2-1-1. STEP1A and STEP1B>

In the semiconductor memory device 1 according to the first embodiment, a first set is executed N times by setting STEP1A and STEP1B as one set (the first set). In the case where attention is paid to the four bit lines BL0 to BL3 or BL4 to BL7, the first setting is executed for the memory cell transistors MT belonging to the three bit lines BL1 to BL3 belonging to the second group GR2 or the memory cell transistors MT belonging to the three bit lines BL5 to BL7. Further, in the first set, the operations for the memory cell transistors MT belonging to the word lines WLe and the second group GR2 and the operations for the memory cell transistors MT belonging to the word lines WLo and the second group GR2 are alternately executed.

Specifically, in STEP1A, the word lines WLe and the second group GR2 are selected (S), and the EP verify operation and the EP program operation are executed on the memory cell transistors MT belonging to the second group GR2 of the select gate line SGD0 and belonging to the word lines WLe. The word lines WLo and the first group GR1 are unselected (US), and the memory cell transistors MT belonging to the word lines WLo and the first group GR1 are not subjected to the EP verify operation and the EP program operation. In the EP verify operation, the select gate line SGD0 is applied with the voltage VSGVFY, the select gate lines SGD1 to SGD5 are applied with a voltage VSS, and the predetermined word line WLe is applied with the voltage VPVFY. In the EP program operation, the select gate line SGD0 is applied with a voltage VSG, the select gate lines SGD1 to SGD5 are applied with the voltage VSS, and the predetermined word line WLe is applied with the voltage VPRG. The memory cell transistors MT belonging to the second group GR2, the select gate line SGD0, and the word lines WLe are the memory cell transistors MT facing the word lines WLe of the memory pillars MP0, MP6, MP7, MP12, MP18 and MP19.

In STEP1B, the EP verify operation and the EP program operation are executed on the memory cell transistors MT belonging to the second group GR2 of the select gate line SGD1 and belonging to the word lines WLo. The word lines WLe and the first group GR1 are unselected (US), and the memory cell transistors MT belonging to the word lines WLe and the first group GR1 are not subjected to the EP verify operation and the EP program operation. In the EP verify operation, the select gate line SGD1 is applied with the voltage VSGVFY, the select gate lines SGD0 and SGD2 to SGD5 are applied with the voltage VSS, and the predetermined word line WLo is applied with the voltage VPVFY. In the EP program operation, the select gate line SGD1 is applied with the voltage VSG, the select gate lines SGD0 and SGD2 to SGD5 are applied with the voltage VSS, and the predetermined word line WLo is applied with the voltage VPRG. The memory cell transistors MT belonging to the second group GR2, the select gate line SGD1, and the word lines WLo are the memory cell transistors MT facing the word lines WLo of the memory pillars MP0, MP6, MP7, MP12, MP18 and MP19.

<1-2-1-2. STEP1C and STEP1D>

In the semiconductor memory device 1 according to the first embodiment, a second set is executed N times, with STEP1C and STEP1D being set as one set (the second set). In the case where attention is paid to the four bit lines BL0 to BL3 or BL4 to BL7, the second set is executed for the memory cell transistors MT belonging to one bit line BL0 belonging to the first group GR1 or the memory cell transistors MT belonging to one bit line BL4. In the second set, the operations for the memory cell transistors MT belonging to the word lines WLe and the first group GR1 and the operations for the memory cell transistors MT belonging to the word lines WLo and the first group GR1 are alternately executed.

Specifically, in STEP1C, the word lines WLe and the first group GR1 are selected (S), and the EP verify operation and the EP program operation are executed on the memory cell transistors MT belonging to the first group GR1 of the select gate line SGD0 and belonging to the word lines WLe. The word lines WLo and the first group GR1 are unselected (US), and the memory cell transistors MT belonging to the word lines WLo and the first group GR1 are not subjected to the EP verify operation and the EP program operation. In STEP1C, an operation in which the second group GR2 of STEP1A is replaced with the first group GR1 is executed. Here, differences from STEP1A are mainly described. The memory cell transistors MT belonging to the first group GR1, the select gate line SGD0, and the word lines WLe are the memory cell transistors MT facing the word lines WLe of the memory pillars MP5 and MP17.

In STEP1D, the EP verify operation and the EP program operation are executed on the memory cell transistors MT belonging to the first group GR1 of the select gate line SGD5 and belonging to the word lines WLo. The word lines WLe and the second group GR2 are unselected (US), and the memory cell transistors MT belonging to the word lines WLe and the second group GR2 are not subjected to the EP verify operation and the EP program operation. In the EP verify operation, the select gate line SGD5 is applied with the voltage VSGVFY, the select gate lines SGD0 to SGD4 are applied with the voltage VSS, and the predetermined word line WLo is applied with the voltage VPVFY. In the EP program operation, the select gate line SGD5 is applied with the voltage VSG, the select gate lines SGD0 to SGD4 are applied with the voltage VSS, and the predetermined word line WLo is applied with the voltage VPRG. The memory cell transistors MT belonging to the select gate line SGD5 and the word lines WLo are the memory cell transistors MT facing the word lines WLo of the memory pillars MP5 and MP17.

<1-2-1-3. STEP2A and STEP2B>

In the semiconductor memory device 1 according to the first embodiment, a third set is executed N times, with STEP2A and STEP2B being set as one set (the third set). In the case where attention is paid to the four bit lines BL0 to BL3 or BL4 to BL7, similar to the first set, the third set is executed for the memory cell transistors MT belonging to the three bit lines BL1 to BL3 belonging to the second group GR2 or the memory cell transistors MT belonging to the three bit lines BL5 to BL7. In the third set, similar to the first set, the operations for the memory cell transistors MT belonging to the word lines WLe and the second group GR2 and the operations for the memory cell transistors MT belonging to the word lines WLo and the second group GR2 are alternately executed.

Specifically, in STEP2A, an operation in which the select gate line SGD0 of STEP1A is replaced with the select gate line SGD2 is executed. Here, differences from STEP1A are mainly described. The memory cell transistors MT belonging to the first group GR2, the select gate line SGD2, and the word lines WLe are the memory cell transistors MT facing the word lines WLe of the memory pillars MP2, MP8, MP9, MP14, MP20 and MP21.

In STEP2B, an operation in which the select gate line SGD1 of STEP1B is replaced with the select gate line SGD3 is executed. Here, differences from STEP1B are mainly described. The memory cell transistors MT belonging to the second group GR2, the select gate line SGD3, and the word lines WLo are the memory cell transistors MT facing the word lines WLo of the memory pillars MP2, MP8, MP9, MP14, MP20 and MP21.

<1-2-1-4. STEP2C and STEP2D>

In the semiconductor memory device 1 according to the first embodiment, a fourth set is executed N times with STEP2C and STEP2D being set as one set (the fourth set). In the case where attention is paid to four bit lines BL0 to BL3 or BL4 to BL7, similar to the second set, the fourth set is executed for a memory cell transistor MT belonging to one bit line BL0 belonging to the first group GR1 or a memory cell transistor MT belonging to one bit line BL4. In the fourth set, similar to the second set, the operations for the memory cell transistors MT belonging to the word lines WLe and the first group GR1 and the operations for the memory cell transistors MT belonging to the word lines WLo and the first group GR1 are alternately executed.

Specifically, in STEP2C, an operation in which the select gate line SGD0 of STEP1C is replaced with the select gate line SGD2 is executed. Here, differences from STEP1C are mainly described. The memory cell transistors MT belong-
ing to the first group GR1, the select gate line SGD2, and the word lines WLe are the memory cell transistors MT facing the word lines WLe of the memory pillars MP1 and MP13.

In STEP2D, an operation in which the select gate line SGD5 of STEP1D is replaced with the select gate line SGD1 is executed. Here, differences from STEP1D are mainly described. The memory cell transistors MT belonging to the select gate line SGD1 and the word lines WLo are the memory cell transistors MT facing the word lines WLo of the memory pillars MP1 and MP13.

<1-2-1-5. STEP3A and STEP3B>

In the semiconductor memory device 1 according to the first embodiment, a fifth set is executed N times by setting STEP3A and STEP3B to one set (the fifth set). In the case where attention is paid to the four bit lines BL0 to BL3 or BL4 to BL7, as in the first set, the fifth set is executed for the memory cell transistors MT belonging to the three bit lines BL1 to BL3 belonging to the second group GR2 or the memory cell transistors MT belonging to the three bit lines BL5 to BL7. In the fifth set, similar to the first set, the operations for the memory cell transistors MT belonging to the word lines WLe and the second group GR2 and the operations for the memory cell transistors MT belonging to the word lines WLo and the second group GR2 are alternately executed.

Specifically, in STEP3A, an operation in which the select gate line SGD0 of STEP1A is replaced with the select gate line SGD4 is executed. Here, differences from STEP1A are mainly described. The memory cell transistors MT belonging to the first group GR2, the select gate line SGD4, and the word lines WLe are the memory cell transistors MT facing the word lines WLe of the memory pillars MP4, MP10, MP11, MP16, MP22 and MP23.

In STEP3B, an operation in which the select gate line SGD1 of STEP1B is replaced with the select gate line SGD5 is executed. Here, differences from STEP1B are mainly described. The memory cell transistors MT belonging to the second group GR2, the select gate line SGD5, and the word lines WLo are the memory cell transistors MT facing the word lines WLo of the memory pillars MP4, MP10, MP11, MP16, MP22 and MP23.

<1-2-1-6. STEP3C and STEP3D>

In the semiconductor memory device 1 according to the first embodiment, a sixth set is executed N times by setting STEP3C and STEP3D as one set (the sixth set). In the case where attention is paid to the four bit lines BL0 to BL3 or BL4 to BL7, similar to the second set, the sixth set is executed for the memory cell transistor MT belonging to one bit line BL0 belonging to the first group GR1 or the memory cell transistor MT belonging to one bit line BL4. In the sixth set, similar to the second set, the operations for the memory cell transistors MT belonging to the word lines WLe and the first group GR1 and the operations for the memory cell transistors MT belonging to the word lines WLo and the first group GR1 are alternately executed.

Specifically, in STEP3C, an operation in which the select gate line SGD0 of STEP1C is replaced with the select gate line SGD4 is executed. Here, differences from STEP1C are mainly described. The memory cell transistors MT belonging to the first group GR1, the select gate line SGD4, and the word lines WLe are the memory cell transistors MT facing the word lines WLe of the memory pillars MP3 and MP15.

In STEP3D, an operation in which the select gate line SGD5 of STEP1D is replaced with the select gate line SGD3 is executed. Here, differences from STEP1D are mainly described. The memory cell transistors MT belonging to the select gate line SGD3 and the word lines WLo are the memory cell transistors MT facing the word lines WLo of the memory pillars MP3 and MP15.

<1-2-2. Example of Primary Write Operation>

Figure 23:
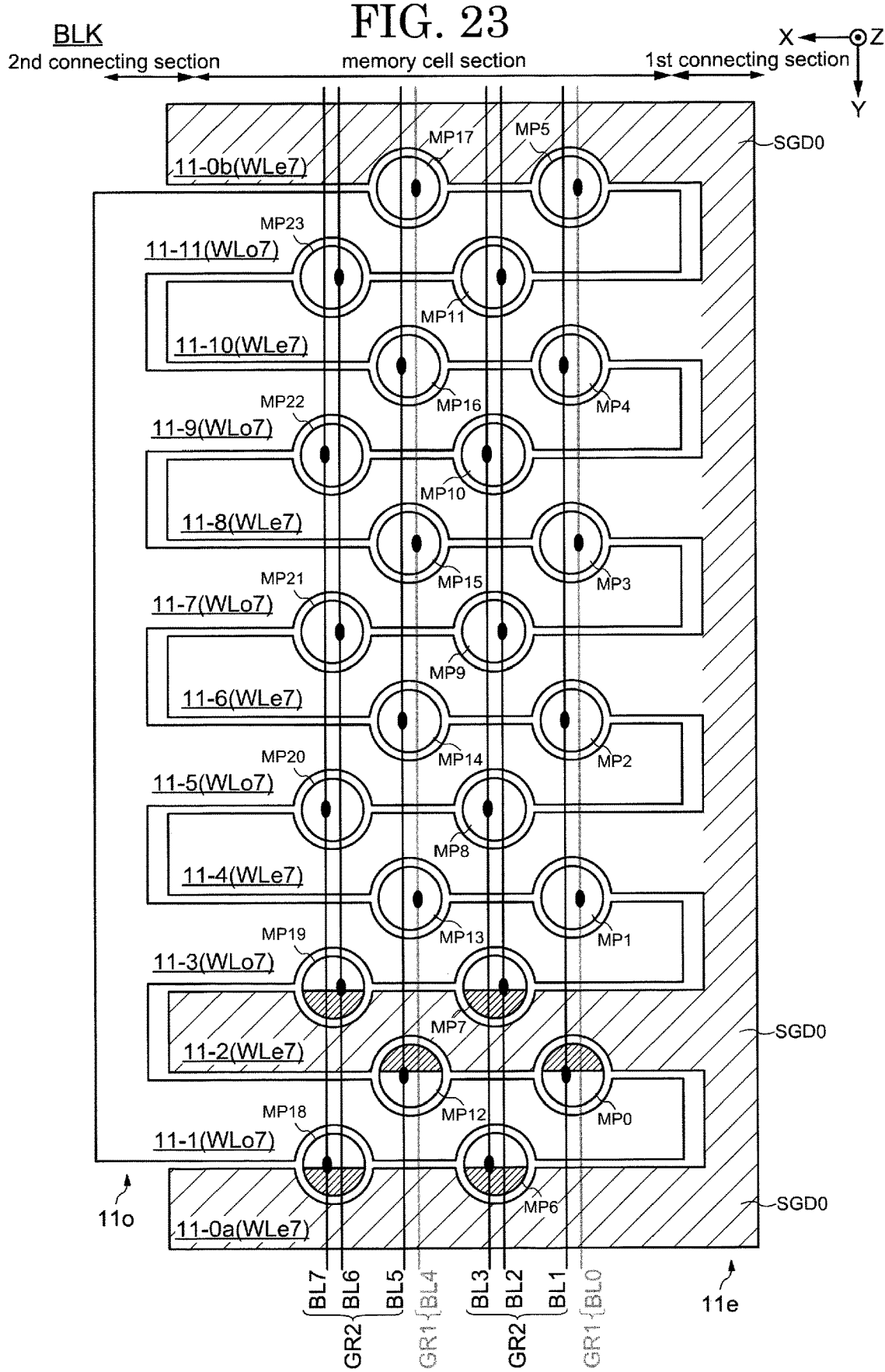
FIG. 23 is a diagram for explaining a primary write operation with reference to a layout of the word line and the memory pillar of the semiconductor memory device according to the first embodiment.
Figure 24:
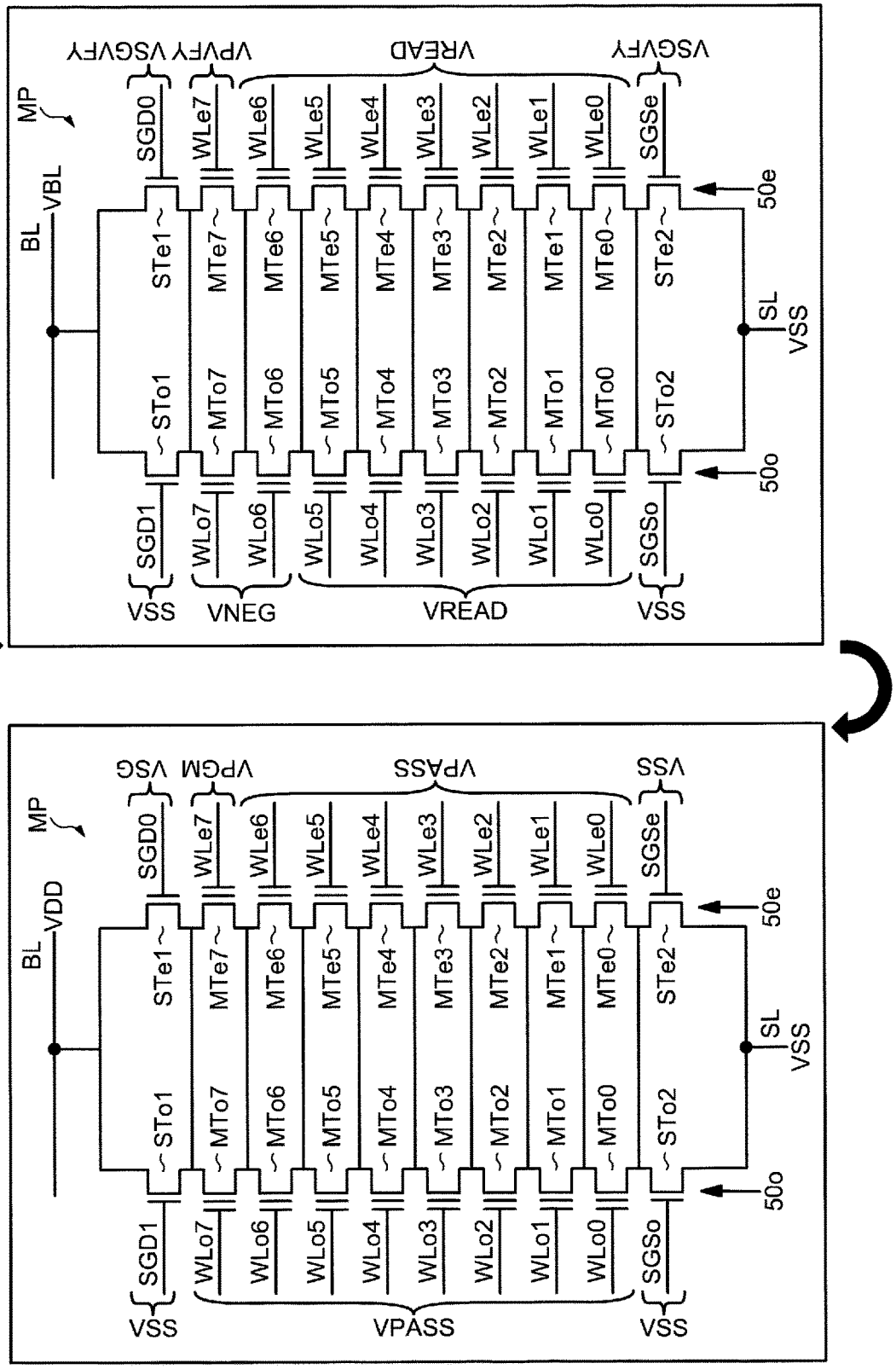
FIG. 24 is a diagram illustrating a primary write operation with reference to an equivalent circuit of the adjacent strings of the semiconductor memory device according to the first embodiment.
Figure 25:
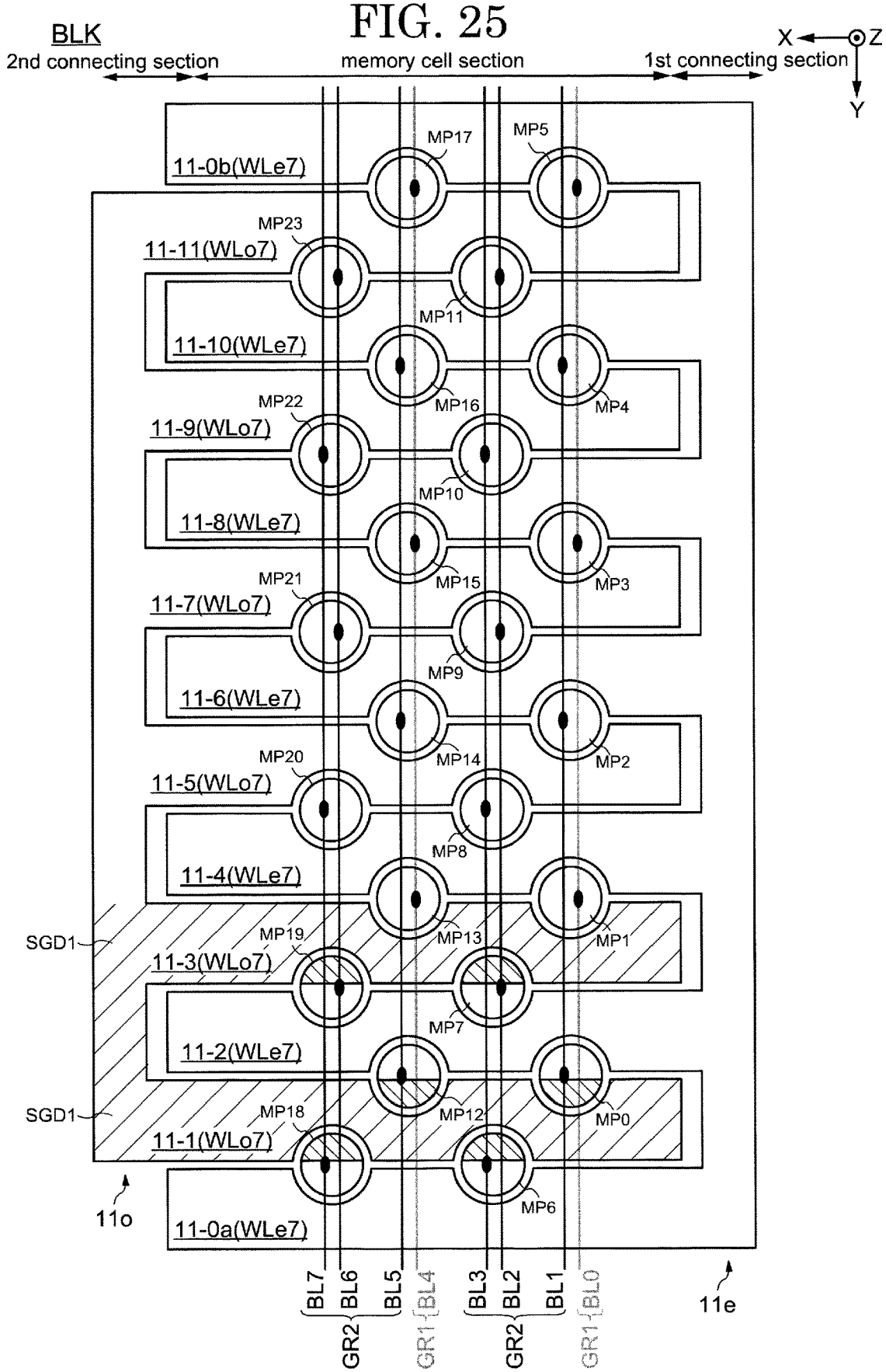
FIG. 25 is a diagram for explaining a primary write operation referring to a layout of the word line and the memory pillar of the semiconductor memory device according to the first embodiment.
Figure 26:
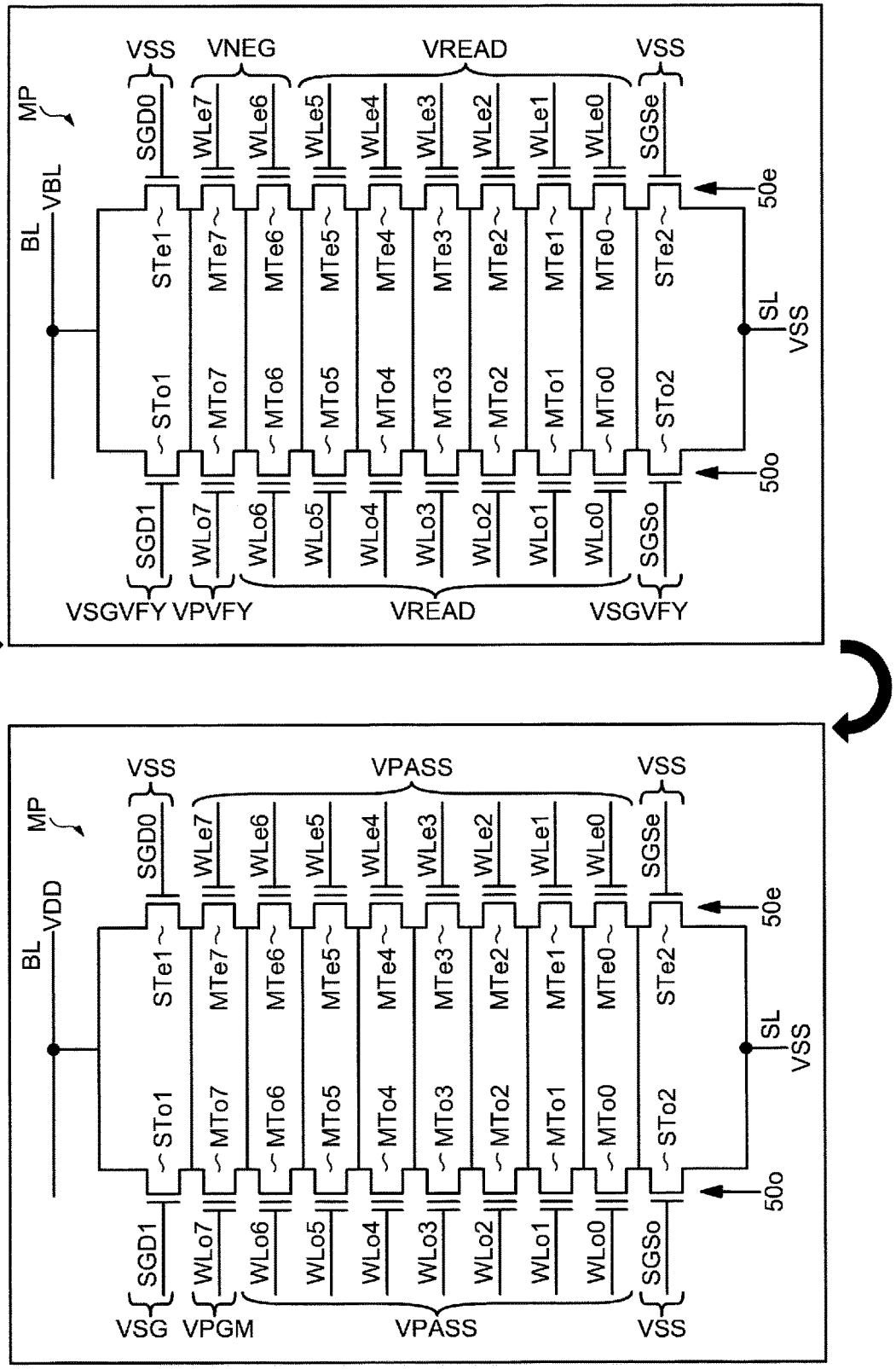
FIG. 26 is a diagram illustrating a primary write operation with reference to an equivalent circuit of the adjacent strings of the semiconductor memory device according to the first embodiment.
Figure 30:
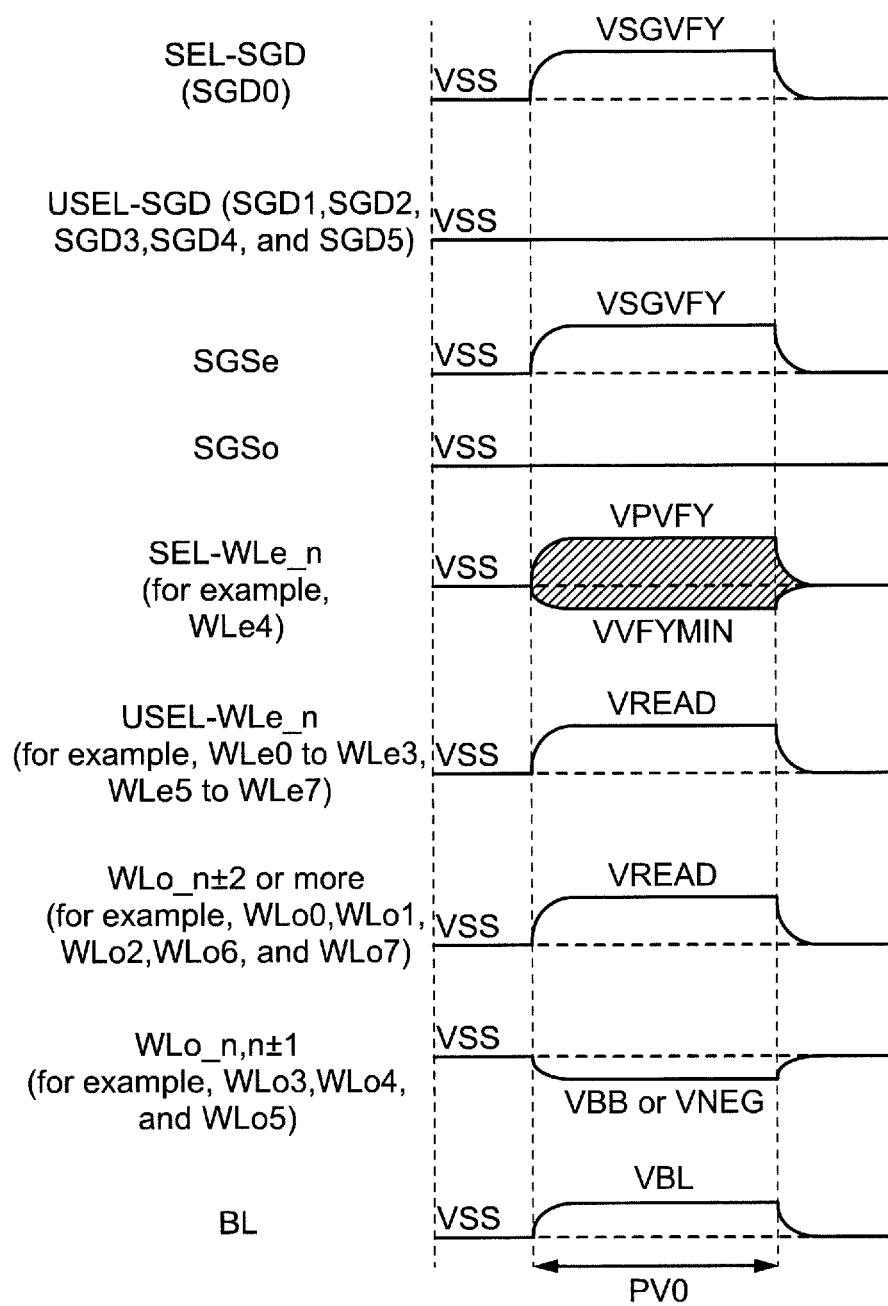
FIG. 30 is a diagram illustrating a timing chart of various types of signals during an EP verify operation in the semiconductor memory device according to the first embodiment.
Figure 31:
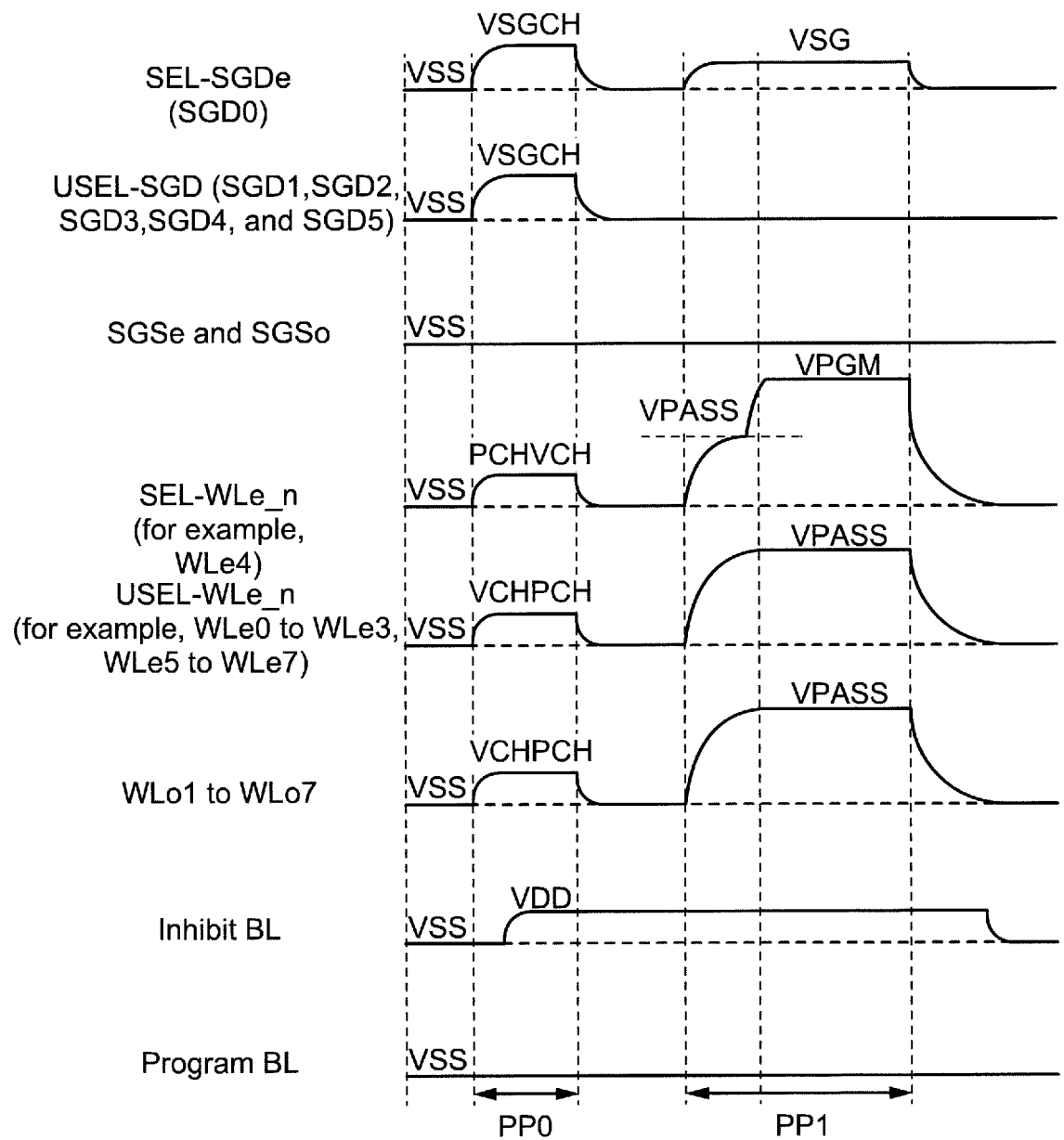
FIG. 31 is a diagram illustrating the timing chart of various types of signals during an EP program operation in the semiconductor memory device according to the first embodiment.

With reference to FIG. 3, FIG. 23 to FIG. 28, FIG. 30, and FIG. 31, an exemplary sequence of STEP1 among STEP1, STEP2 and STEP3 of the primary write operation will be described. FIG. 23, FIG. 25, FIG. 27, and FIG. 28 are diagrams for explaining the primary write operation of the semiconductor memory device 1, and FIG. 24 and FIG. 26 are diagrams for explaining the write operation with reference to an equivalent circuit of an adjacent string of the semiconductor memory device 1. FIG. 30 is a diagram showing a timing chart of various signals during the EP verify operation of the semiconductor memory device 1 according to the first embodiment, and FIG. 31 is a diagram showing a timing chart of various signals during the EP program operation of the semiconductor memory device according to the first embodiment.

<1-2-2-1. Overview of Primary Write Operation>

When the primary write operation is executed, any of the select gate lines SGD0 to SGD5 shown in FIG. 3 is selected. The write operation is executed on the memory cell transistor MT belonging to the same memory string 50o or 50e as the select transistor ST1 corresponding to the selected select gate line.

In FIG. 23, FIG. 25, FIG. 27, and FIG. 28, the memory pillar MP (MP0 to MP23) and the word lines WL (the word lines WLe7 and WLo7 of the uppermost layer) are shown. The memory cell transistors MT are formed in an area where the memory pillars MP and the word lines WL face each other.

Each of the wiring layers 10-0 to 10-3 corresponding to the respective select gate lines is supplied with a voltage at which the select transistor ST1 is turned on or off in accordance with the voltage supplied to the bit lines BL.

Among the word lines WL0 to WL7, a voltage for executing the write operation to the memory cell transistor MT (for example, a voltage for injecting electrons from the semiconductor layer 31 as a channel to the insulating layer 33 as the charge storage layer) is supplied to the wiring layer 11e or 11 corresponding to the memory cell transistor MT to be subjected to the write operation.

When the select gate line SGD0 (the wiring layer 10-0) is selected and the voltage for executing the write operation is supplied to the uppermost word line WLe7, the write operation is executed on the memory cell transistors MT located at the uppermost layers of the memory strings 50e in the memory pillars MP0, MP5, MP6, MP7, MP12, MP17, MP18, and MP19.

In the case where the select gate line SGD1 (the wiring layer 10-1) is selected and the voltage for executing the write operation is supplied to the uppermost word line WLo7, the write operation is executed on the memory cell transistors MT located at the uppermost layers of the memory strings 50o in the memory pillars MP0, MP1, MP6, MP7, MP12, MP13, MP18, and MP19.

In the case where the select gate line SGD2 (the wiring layer 10-2) is selected and the voltage for executing the write operation is supplied to the uppermost word line WLe7, the write operation is executed on the memory cell transistors MT located at the uppermost layers of the memory strings 50e in the memory pillars MP1, MP2, MP8, MP9, MP13, MP14, MP20, and MP21.

In the case where the select gate line SGD3 (the wiring layer 10-3) is selected and the voltage for executing the write operation is supplied to the uppermost word line WLo7, the write operation is executed on the memory cell transistors MT located at the uppermost layers of the memory strings 50o in the memory pillars MP2, MP3, MP8, MP9, MP14, MP15, MP20, and MP21.

In the case where the select gate line SGD4 (the wiring layer 10-4) is selected and the voltage for executing the write operation is supplied to the uppermost word line WLe7, the write operation is executed on the memory cell transistors MT located at the uppermost layers of the memory strings 50e in the memory pillars MP3, MP4, MP10, MP11, MP15, MP16, MP22, and MP23.

In the case where the select gate line SGD5 (the wiring layer 10-5) is selected and the voltage for executing the write operation is supplied to the uppermost word line WLo7, the write operation is executed on the memory cell transistors MT located at the uppermost layers of the memory strings 50o in the memory pillars MP4, MP5, MP10, MP11, MP16, MP17, MP22, and MP23.

In the block BLK, a group of the memory cell transistors MT to be subjected to the write operation at the same time may be referred to as a "page".

The select gate line SGD0 may be referred to as the "first select gate line", the select gate line SGD1 may be referred to as the "second select gate line", the select gate line SGD2 may be referred to as a "third select gate line", the select gate line SGD3 may be referred to as a "fourth select gate line", the select gate line SGD4 may be referred to as a "fifth select gate line", and the select gate line SGD5 may be referred to as a "sixth select gate line".

The select transistor SGD0 connected to the select gate line ST1 may be referred to as the "first select transistor", the select transistor SGD1 connected to the select gate line ST1 may be referred to as the "second select transistor", the select transistor ST1 connected to the select gate line SGD2 may be referred to as a "third select transistor", the select transistor ST1 connected to the select gate line SGD3 may be referred to as a "fourth select transistor", the select transistor ST1 connected to the select gate line SGD4 may be referred to as a "fifth select transistor", and the select transistor SGD3 connected to the select gate line SGD1 may be referred to as a "sixth select transistor".

The word lines WLe provided in the wiring layers 11e may be referred to as the "first word line". The word lines WLo provided in the wiring layers 11 may be referred to as the "second word line". The wiring layer provided with the first word line and the second word line may be referred to as the "first layer". The first word line and the second word line are controlled independently of each other. The respective memory pillars MP are sandwiched between the word lines WLe (the first word line) and the word lines WLo (the second word line). Among the memory cell transistors MT provided in the memory pillars MP, the memory cell transistors facing the word lines WLe (the first word line) are referred to as the "first memory cell" or a "seventh memory cell", and the memory cell transistors facing the word lines WLo (the second word line) are referred to as the "second memory cell" or an "eighth memory cell". The plurality of memory pillars MP extend in the Z direction and are arranged in the X direction and the Y direction. For example, the first word line is the word line WLe5 and the second word line is the word line WLo5.

The word lines WLe provided in the wiring layer 11e of the "second layer" adjacent above the "first layer" may be referred to as the "third word line". The word lines WLo provided in the wiring layer 11 of the "second layer" may be referred to as the "fourth word line". The word lines WLe provided in the wiring layer 11e of the "third layer" adjacent below an "eleventh layer" may be referred to as a "fifth word line". The word lines WLo provided in the wiring layer 11 of the "third layer" may be referred to as the "sixth word line". For example, the third word line is the word line WLe6, the fourth word line is the word line WLo6, the fifth word line is the word line WLe4, and the sixth word line is the word line WLo4.

The third word line and the fourth word line are controlled independently of each other. The fifth word line and the sixth word line are controlled independently of each other. The respective memory pillars MP are sandwiched between the word lines WLe (the third word line) and the word lines WLo (the fourth word line), and are sandwiched between the word lines WLe (the fifth word line) and the word lines WLo (the sixth word line).

Of the memory cell transistor MT provided in the memory pillar MP, the memory cell transistor facing the third word line is referred to as the "third memory cell" or a "ninth memory cell". The memory cell transistor facing the fourth word line is referred to as the "fourth memory cell" or a "tenth memory cell". The memory cell transistor facing the fifth word line is referred to as the "fifth memory cell" or an "eleventh memory cell". The memory cell transistor facing the sixth word line is referred to as the "sixth memory cell" or a "twelfth memory cell".

Note that in the semiconductor memory device 1, In the case of executing the write operation on the memory cell transistors MT facing the word lines WLe after the write operation was executed on the memory cell transistors MT facing the word lines WLo, the word lines of the first layer, the second layer, and the third layer are referred to as the first word line, the third word line, and the fifth word line, respectively, and the word lines WLe of the first layer, the second layer, and the third layer can be referred to as the second word line, the fourth word line, and the sixth word line, respectively. Similarly, the memory cell transistors MT facing the word lines WLo of the first layer, the second layer and the third layer are referred to as the first memory cell or the seventh memory cell, the third memory cell or the ninth memory cell, the fifth memory cell or the 11th memory cell, respectively, and the first layer, the second layer and the third layer of the memory cell transistors MT facing the word lines WLe can be referred to as the second memory cell or the eighth memory cell, the fourth memory cell or the tenth memory cell, the sixth memory cell or the twelfth memory cell, respectively.

<1-2-2-2. Example of Primary Write Operation>

STEP1A will be described with reference to FIG. 23. In STEP1A, the EP verify operation and the EP program operation are executed on the memory cell transistors MT belonging to the memory string 50e selected by the select gate line SGD0 shown in FIG. 3 and belonging to the uppermost word line WLe7 and the second group GR2 (for example, three bit lines BL1 to BL3).

Specifically, when the select gate line SGD0, the word line WLe7, and the second group GR2 are selected, the select transistors ST1 facing the wiring layers 10-0a and 10-0b shown in FIG. 3 are turned on or off in accordance with the voltage supplied to the bit lines BL1 to BL3 and BL5 to BL7. In FIG. 23, a hatched area of the wiring layer 11e corresponds to an area where the wiring layer 10-0a, 10-0b, and 10-0c shown in FIG. 3 is arranged.

When the select gate line SGD0, the word line WLe7, and the second group GR2 are selected, the select transistor ST1 connected to the select gate line SGD0 corresponding to wiring layers 10-0a and 10-0b of the wiring 11e (see FIG. 3) is selected, and the EP verify operation and the EP program operation are executed on the memory cell transistors MT (the first memory cells) provided on the respective word lines WLe7 sides of the memory pillars MP0, MP6, MP7, MP12, MP18, and MP19. In FIG. 23, the memory cell transistors MT (the first memory cells) provided on the respective word line WLe7 sides of the memory pillars MP0, MP6, MP7, MP12, MP18, and MP19 are shown by narrow hatched lines.

In the EP verify operation of STEP1A described with reference to FIG. 23, for example, as shown in an equivalent circuit on the right side of FIG. 24 and a timing chart of FIG. 30, voltages are applied to the respective signal lines and transistors. As shown in FIG. 24 or FIG. 30, in the PV0 period of FIG. 30, the voltage VSGVFY is supplied to a select gate line SEL-SGD (here, the selection gate line SGD0), the select transistor STe1 connected to SGD0, the select gate line SGSe, and the select transistor STe2 connected to the select gate line SGSe, the voltage VSS is supplied to an unselected gate line USEL-SGD (here, SGD1, SGD2, SGD3, SGD4, and SGD5), the select transistor STo1 connected to the unselected gate line USEL-SGD (here, SGD1), the select gate lines SGSo, and the select transistor STo2 connected to the select gate line SGSo. The memory cell transistors MTe7 connected to a selected word line SEL-WLe_n (here, WLe7) and WLe7 are supplied with the voltage VPVFY. In the first embodiment, since the three-layer cutoff is executed, the voltage VNEG or a voltage VBB is supplied to the unselected word line facing the selected word line, the memory cell transistor MT connected to the unselected word line, the word line below the unselected word line and the memory cell transistor MT connected to the word line below the unselected word line. Specifically, word lines SEL-WLo_n, n±1 (here, WLo7 and WLo6), and the memory cell transistors MTo6 and MTo7 connected to the word lines WLo7 and WLo6 are supplied with the voltage VNEG. The voltage VREAD is supplied to an unselected word line USEL-WLe_n (here, WLe6 to WLe0), the memory cell transistors MTe6 to MTe0 connected to the word lines WLe6 to WLe0, word lines WLo_n±2 or more (here, WLo5 to WLo0), and the memory cell transistors MTo5 to MTo0 connected to the word lines WLo5 to WLo0. Further, the voltage VBL is supplied to the second group GR2 (for example, the bit lines BL1 to BL3), and the voltage VSS is supplied to the source lines SL. In the period other than the PV0 period in FIG. 30, the voltage VSS is supplied to each signal line or each transistor.

Here, WLe4 of the selected word line SEL-WLe_n shown in FIG. is replaced with WLe7 to explain a case where the selected word line SEL-WLe_n is WLe7. As shown in FIG. 30, in the case where the selected word line SEL-WLe_n is WLe4, the word lines SEL-WLo_n and n±1 are WLo3 to WLo5, the unselected word line USEL-WLe_n is WLe7 to WLe5 and WLe3 to WLe0, and the word line WLo_n±2 or more is WLo7, WLo6, and WLo2 to WLo0. The voltage VPVFY is set to, for example, a voltage equal to or higher than the voltage VPVFY and equal to or lower than a voltage VPVFYMIN depending on the threshold voltage of the memory cell transistor MT in which the EP verify operation is executed.

In the EP program operation of STEP1A described with reference to FIG. 23, for example, as shown in an equivalent circuit on the left side of FIG. 24 and a timing chart of FIG. 31, voltages are applied to the respective signal lines and transistors. As shown in FIG. 24 or FIG. 31, in the PPO period of FIG. 31, a voltage VSGPCH is supplied to a select gate line SEL-SGD (here, SGD0), the select transistor STe1 connected to the select gate line SGD0, the unselected gate line USEL-SGD (here, SGD1, SGD2, SGD3, SGD4, and SGD5), and the select transistor STo1 connected to the unselected gate line USEL-SGD (here, SGD1). The voltage VSS is supplied to the select gate line SGSe, the select transistors STe2 connected to the select gate line SGSe, the select gate line SGSo, and the select transistors STo2 connected to the select gate line SGSo. A voltage VCHPCH is supplied to the selected word line SEL-WLe_n (here, WLe7), the memory cell transistors MTe7 connected to WLe7, the unselected word lines USEL-WLe_n (here, WLe6 to WLe0), the memory cell transistors MTe6 to MTe0 connected to the word lines WLe6 to WLe0, the word lines WLo0 to WLo7, and the memory cell transistors MTo0 to MTo7 connected to the word lines WLo0 to WLo7.

As shown in FIG. 24 or FIG. 31, in the PP1 period following the PP0 period in FIG. 31, the select gate line SEL-SGD (here, SGD0) and the selection transistor STe1 connected to SGD0 are supplied with the voltage VSG. The unselected gate line USEL-SGD (here, SGD1, SGD2, SGD3, SGD4, and SGD5) and the select transistor STo1 connected to the unselected select gate line USEL-SGD (here, SGD1), the select gate line SGSe, the select transistor STe2 connected to the select gate line SGSe, the select gate line SGSo, and the select transistor STo2 connected to the select gate line SGSo are supplied with the voltage VSS. The voltage VPASS is supplied to the selected word lines SEL-WLe_n (here, WLe7) and the memory cell transistors MTe7 connected to WLe7, and then the voltage VPRG is supplied thereto. The voltage VPRG is higher than the voltage VPASS.

As shown in FIG. 24 or FIG. 31, a voltage changed from the voltage VSS to the voltage VDD is supplied to the first group GR1 (for example, the unselected bit line BL0 (Inhibit BL in FIG. 31)) in the PP0 period shown in FIG. 31, and a voltage changed from the voltage VDD to the voltage VSS is supplied after the P1 period shown in FIG. 31. During the operation illustrated in FIG. 31, the second group GR2 (for example, the selected bit lines BL1 to BL3 (Program BL in FIG. 31)) and the source lines SL are supplied with the voltage VSS. In the period other than the PP0 and the PP1 period shown in FIG. 31, VSS is supplied to each signal line or each transistor other than Inhibit BL, Program BL and the source line.

In the description using FIG. 23 to FIG. 31, in the case where the memory string 50e and the memory string 50o are described, the configuration and the function of the memory string 50e and the memory string 50o are the same as the configuration and the function described with reference to FIG. 13.

STEP1B will be described with reference to FIG. 25. In STEP1B, the EP verify operation and the EP program operation are executed on the memory cell transistors MT belonging to the memory string 50o selected by the select gate line SGD1 shown in FIG. 3 and belonging to the uppermost word line WLo7 and the second group GR2 (for example, three bit lines BL1 to BL3).

Specifically, when the select gate line SGD1, the word line WLo7, and the second group GR2 are selected, the select transistors ST1 opposed to the wiring layers 10-1a and 10-1b shown in FIG. 3 are turned on or off in accordance with voltages supplied to the bit lines BL1 to BL3 and BL5 to BL7. In FIG. 25, the hatched area of the wiring layer 11 corresponds to the area where the wiring layer 10-1a and 10-1b shown in FIG. 3 are arranged.

When the select gate line SGD1, the word line WLo7, and the second group GR2 are selected, the select transistors ST1 connected to the select gate lines SGD1 corresponding to the wiring layers 10-1a and 10-1b of the wiring layers 11 (see FIG. 3) are selected, and the EP verify operation and the EP program operation are executed on the memory cell transistors MT (second memory cells) provided on the respective word lines WLo7 sides of the memory pillars MP0, MP6, MP7, MP12, MP18, and MP19. In FIG. 25, the memory cell transistors MT (second memory cells) provided on the respective word lines WLo7 sides of the memory pillars MP0, MP6, MP7, MP12, MP18, and MP19 are indicated by wide hatched lines.

In the EP verify operation of STEP1B described with reference to FIG. 25, for example, as in the configuration and the function shown in an equivalent circuit on a right side of FIG. 26, voltages are applied to the signal lines and the transistors. Note that the configuration shown in the equivalent circuit on the right side of FIG. 26 is the same as the configuration in FIG. 24 and FIG. 30 in which the configuration related to the memory string 50e (for example, the selection transistors STe1 and STe2, the memory cell transistors MTe0 to MTe7, the word lines WLe, and the like) and the configuration related to the memory string 50o (for example, the selection transistors STo1 and STo2, the memory cell transistors MTo0 to MTe7, the word lines WLo, and the like) are replaced, and therefore, explanation thereof is omitted here.

In the EP program operation of STEP1A described with reference to FIG. 25, for example, as in the configuration and the function shown in the equivalent circuit on the left side of FIG. 26 and the timing chart of FIG. 31, voltages are applied to the signal lines and the transistors. Note that, in the equivalent circuit on the left side of FIG. 26, and in FIG. 24 and FIG. 31, the configuration of the memory string 50e (for example, the selection transistors STe1 and STe2, the memory cell transistors MTe0 to MTe7, the word lines WLe, and the like) and the configuration of the memory string 50o (for example, the selection transistors STo1 and STo2, the memory cell transistors MTo0 to MTe7, the word lines WLo, and the like) are replaced with each other, and therefore, explanation thereof is omitted here.

Figure 27:
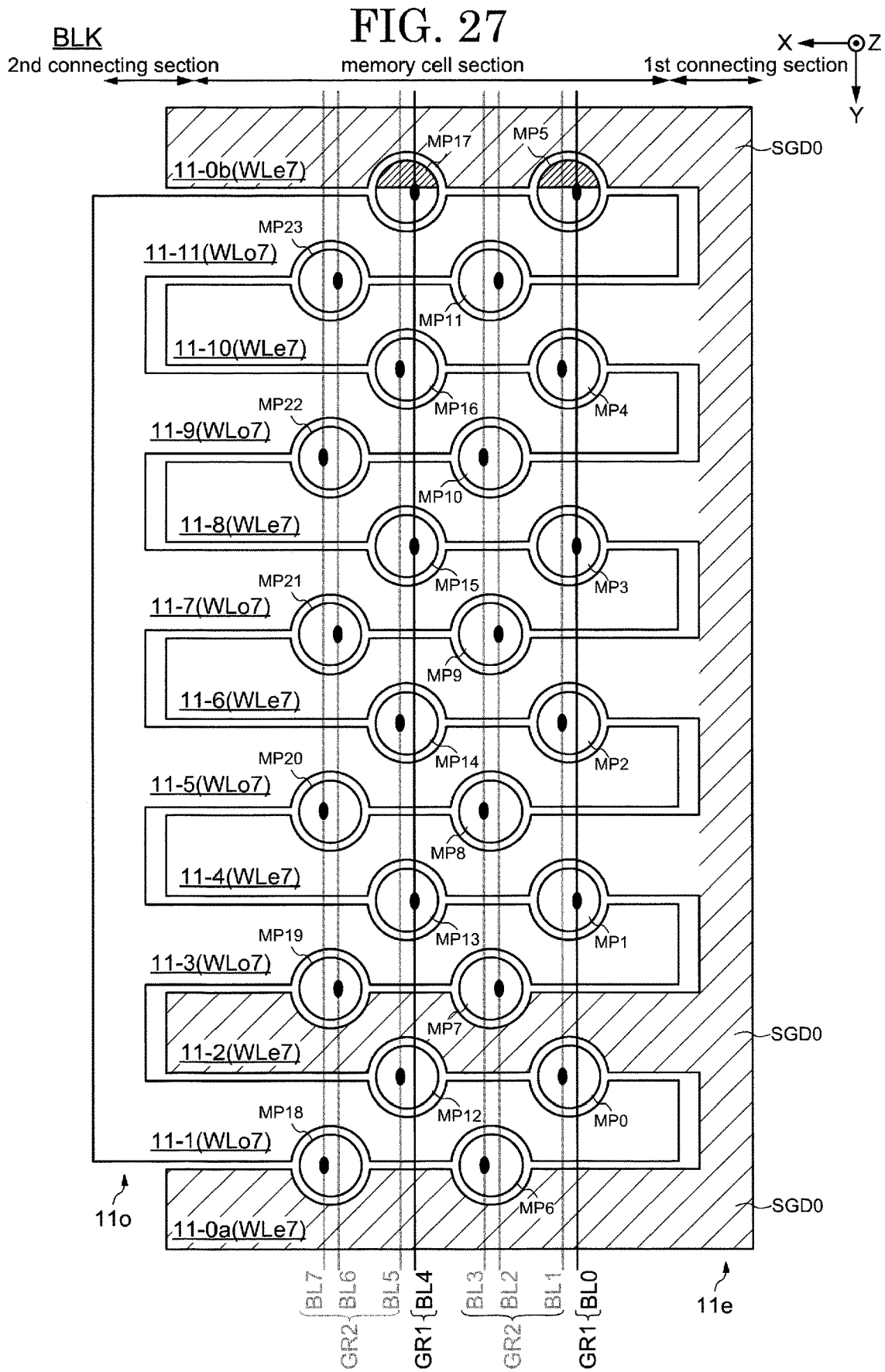
FIG. 27 is a diagram for explaining a primary write operation referring to a layout of the word line and the memory pillar of the semiconductor memory device according to the first embodiment.

STEP1C will be described with reference to FIG. 27. In STEP1C, the EP verify operation and the EP program operation are executed on the memory cell transistors MT belonging to the memory string 50o selected by the select gate line SGD0 shown in FIG. 3 and belonging to the uppermost word line WLe7 and the first group GR1 (for example, one bit line BL0).

Specifically, when the select gate line SGD0, the word line WLe7, and the first group GR1 are selected, the select transistor ST1 facing the wiring layers 10-0c shown in FIG. 3 are turned on or off in accordance with the voltages supplied to the bit lines BL0 and BL4. In FIG. 27, a hatched area of the wiring layer 11e corresponds to the area where the wiring layers 10-0a, 10-0b, and 10-0c shown in FIG. 3 are arranged.

When the select gate line SGD0, the word line WLe7, and the first group GR1 are selected, the select transistor ST1 connected to the select gate line SGD0 corresponding to the wiring layer 10-0c of the wiring layers 11e (see FIG. 3), and the EP verify operation and the EP program operation are executed on the memory cell transistor MT (the first memory cell) provided on the respective word line WLe7 sides of the memory pillars MP5 and MP17. In FIG. 27, the memory cell transistors MT (the first memory cells) provided on the respective word line WLe7 sides of the memory pillars MP5 and MP17 are shown by narrow hatched lines.

In the EP verify operation of STEP1C described with reference to FIG. 27, for example, as in the configuration and the function shown in the equivalent circuit on the right side of FIG. 24 and the timing chart of FIG. 30, the respective signal lines and transistors are energized. Further, in the EP program operation of STEP1C described with reference to FIG. 27, for example, as in the configuration and the function shown in the equivalent circuit on the left side of FIG. 24 and the timing chart of FIG. 31, voltages are applied to the signal lines and the transistors. The descriptions of FIG. 24, FIG. 30, and FIG. 31 are as described above, and therefore the descriptions thereof will be omitted.

Figure 28:
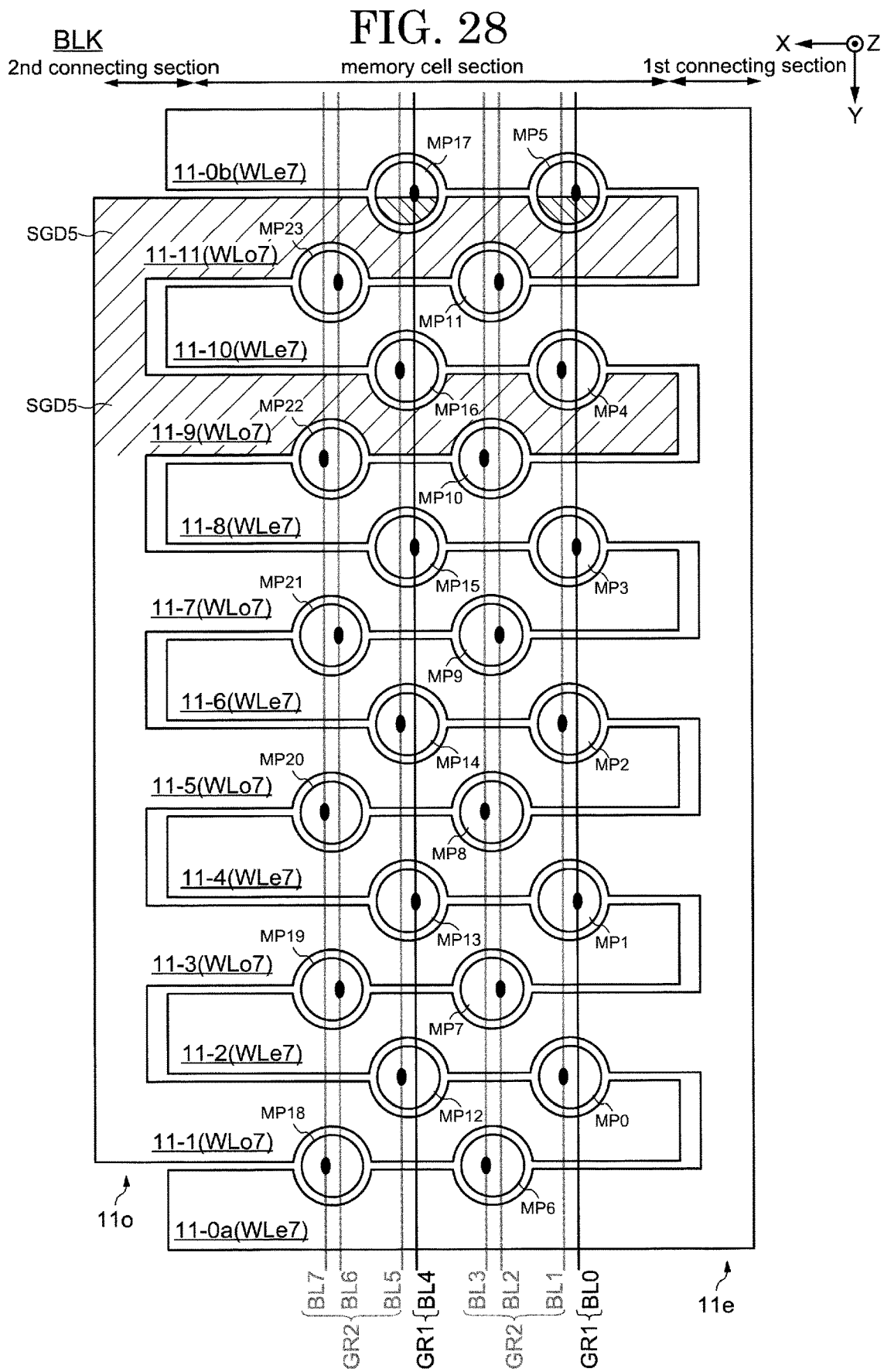
FIG. 28 is a diagram illustrating a primary write operation with reference to an equivalent circuit of the adjacent strings of the semiconductor memory device according to the first embodiment.

STEP1D will be described with reference to FIG. 28. In STEP1D, the EP verify operation and the EP program operation are executed on the memory cell transistors MT belonging to the memory string 50o selected by the select gate line SGD5 shown in FIG. 3 and belonging to the uppermost word line WLo7 and the first group GR1 (for example, one bit line BL0).

Specifically, when the select gate line SGD5, the word line WLo7, and the first group GR1 are selected, the select transistors ST1 facing the wiring layers 10-5a and 10-5b shown in FIG. 3 are turned on or off in accordance with voltages supplied to the bit lines BL0 and BL4. In FIG. 28, a hatched area of the wiring layer 11o corresponds to an area where the wiring layers 10-5a and 10-5b shown in FIG. 3 are arranged.

When the select gate line SGD5, the word line WLo7, and the first group GR1 are selected, the select transistors ST1 connected to the select gate line SGD5 corresponding to the wiring layers 10-5a and 10-5b of the wiring layers 11o (see FIG. 3) are selected, and the EP verify operation and the EP program operation are executed on the memory cell transistors MT (the second memory cells) provided on the respective word line WLo7 sides of the memory pillars MP5 and MP17. In FIG. 28, the memory cell transistors MT (the second memory cells) provided on the respective word line WLo7 sides of the memory pillars MP5 and MP17 are indicated by wide hatched lines.

In the EP verify operation of STEP1D described with reference to FIG. 28, for example, as in the configuration and the function shown in the equivalent circuit on the right side of FIG. 26 and the timing chart of FIG. 30, the respective signal lines and transistors are energized. Further, in the EP program operation of STEP1D described with reference to FIG. 28, for example, as in the configuration and the function shown in the equivalent circuit on the left side of FIG. 26 and the timing chart of FIG. 31, voltages are applied to the signal lines and the transistors. Note that, in the EP verify operation and the EP program operation of STEP1D described with reference to FIG. 28, SGD0 of the selected select gate lines SEL-SGD in FIG. 26, FIG. 30, or FIG. 31 are replaced with the select gate line SGD5, and the select gate lines SGD1 to SGD5 of the unselected select gate lines USEL-SGD in FIG. 26, FIG. 30, or FIG. 31 are replaced with the select gate lines SGD0 to SGD4, so that explanation thereof is omitted here.

<1-2-3. Example of Write Operation Order>

FIG. 29 is a diagram illustrating a write order of the semiconductor memory device 1 according to the first embodiment. The numerical values described in the items in FIG. 29 indicate the order in which the write operation is executed. That is, the write operation is executed in the order of "1"→"2"→"3"→"4"→"5" . . . Note that the operation in the order of parentheses in FIG. 29 is the same as the operation in the order without the parentheses. For example, "(1, 2)" indicates the order of operations in which both STEP1 and STEP2 are executed, and the primary write operation is executed for the memory cell transistors MT belonging to the select gate line SGD1 and belonging to the word line WL7 (the memory cell transistor MT belonging to the memory pillars MP0, MP6, MP7, MP12, MP18 and MP19).

First, operations of "1", "2", "3", "4", and "5" will be described with reference to FIG. 29. "1" indicates the order of operations in which STEP1 described in "1-1-10. Primary Write Operation" and "1-2. Write operation" to "1-2-2-2. Example of Primary Write Operation" is executed, "2" indicates the order of operations in which STEP2 described in "1-1-10. Primary Write Operation", "1-2. Write Operation" to "1-2-1. Overview of Write Operation", "1-2-1-3. STEP2A and STEP2B", and "1-2-1-4. STEP2C and STEP2D" is executed, and "3" indicates the order of operations in which STEP3 described in "1-1-10. Primary Write Operation", "1-2. Write Operation" to "1-2-1. Overview of Write Operation", "1-2-1-5. STEP3A and STEP3B", and "1-2-1-6. STEP3C and STEP3D" is executed. "1", "2", and "3" execute the primary write operation on the word line WL7.

In "4" following "3", an operation similar to "1" is executed on the word line WL6 that differs from the word line WL7 executed on "1". In "5" following "4", the secondary write operation (the verify operation and the program operation in the secondary write operation) is executed on the memory cell transistors belonging to the select gate line SGD0 and the word line WL7.

Therefore, in the semiconductor memory device 1 according to the first embodiment, after the primary write operation of the memory cell transistor belonging to the word line WL6 is executed, the secondary write operation of the memory cell transistor belonging to the word line WL7 is executed. In the semiconductor memory device 1 according to the first embodiment, in the case where the primary write operation of the memory cell transistor belonging to the desired word line is completed and the secondary write operation of the memory cell transistor belonging to the desired word line is executed, it is possible to eliminate the fact that the memory cell transistor belonging to the word line under the desired word line is in an over-erased state, and the fact that the threshold voltage is further increased by writing an excessive voltage by executing the primary write operation of the memory cell transistor belonging to the word line under the desired word line. In other words, in the semiconductor memory device 1 according to the first embodiment, in the case where the secondary write operation of the memory cell transistor belonging to the desired word line is executed, the threshold voltage of the memory cell transistor belonging to the word line under the desired word line can be stored in the threshold distribution as shown in FIG. 18 by executing the primary write operation of the memory cell transistor belonging to the word line under the desired word line. As a result, it is possible to realize an accurate secondary write operation while suppressing erroneous writing and erroneous reading.

Next, the order of the primary write operation will be described. "13", "28" and "43" execute the same operations as "4", and "6", "15", "30" and "45" execute the same operations as "2" for word lines different from the word line WL7 executed at "2", and "8", "17", "32" and "47" execute the same operations as "3" for word lines different from the word line WL7 executed at "3". "4", "6", and "8" execute the primary write operation on the word line WL6, "13", "15", and "17" execute the primary write operation on the word line WL5, "28", "30", and "32" execute the primary write operation on the word line WL5, and "43", "45", and "47" execute the primary write operation on the word line WL4. Similar to the primary write operation for the word lines WL7 to WL4, the primary write operation is also executed for the word lines WL3 to WL0.

Next, an order of the secondary write operation will be described. In "10", "7", "11", "9", and "12", the secondary write operation is executed on the memory cell transistor MT belonging to the same word line WL7 as "5" and the select gate lines SGD (SGD1 to SGD5) differing from "5" shown in FIG. 29. In "14", "19", "16", "20", "18", and "21", the secondary write operation is executed on the memory cell transistors MT belonging to the different select gate lines SGD (SGD0 to SGD5) with respect to the word line WL6, respectively. In "14", "19", "16", "20", "18", and "21", the secondary write operation is executed on the same select gate lines SGD (SGD0 to SGD5) as "5", "10", "7", "11", "9", and "12" shown in FIG. 29, respectively. In "29", "34", "31", "35", "33", and "36", the secondary write operation is executed on the same select gate lines SGD (SGD0 to SGD5) as "5", "10", "7", "1 1", "9", and "12" shown in FIG. 29, respectively and the secondary write operation is executed on the memory cell transistors MT belonging to the same word line WL5. In "44", "49", "46", "50", "48", and "51", the secondary write operation is executed on the same select gate lines SGD (SGD0 to SGD5) as "5", "10", "7", "1 1", "9", and "12" respectively shown in FIG. 29, and the secondary write operation is executed on the memory cell transistors MT belonging to the same word line WL4. Similar to the secondary write operation for the word lines WL7 to WL4, the secondary write operation is also executed for the word lines WL3 to WL0.

Next, an order of the tertiary write operation (the verify operation and the program operation of the tertiary write operation) will be described. The tertiary write operation of the desired word line is executed after the secondary write operation of the desired word line is completed and the secondary write operation of the lower layer of the desired word line is completed. Specifically, after the secondary write operations ("5", "10", "7", "11", "9", and "12") of the memory cell transistor MT belonging to the word line WL7 are completed and the secondary write operations ("14", "19", "16", "20", "18", and "21") of the memory cell transistor MT belonging to the word line WL6 belonging to the lower layer of the word line WL7 are completed, the tertiary write operations ("22", "25", "23", "26", "24", and "27") of the memory cell transistors MT belonging to the word line WL7 are executed. In "37", "40", "38", "41", "39", and "42", the tertiary write operation is executed on the memory cell transistors MT belonging to the respective select gate lines SGD (SGD0 to SGD5) with respect to the word line WL6. In "37", "40", "38", "41", "39", and "42", the tertiary write operation is executed on the same select gate lines SGD (SGD0 to SGD5) as "22", "25", "23", "26", "24", and "27" shown in FIG. 29, respectively. In "52", "55", "53", "56", "54", and "57", the same select gate lines SGD (SGD0 to SGD5) as "22", "25", "23", "26", "24", and "27" shown in FIG. 29, respectively and the tertiary write operation is executed on the memory cell transistors MT belonging to the same word line WL5. Similar to the secondary write operation for the word lines WL7 to WL5, the tertiary write operation is also executed for the word lines WL4 to WL0.

<1-2-4. Example of Write Operation Sequence>

FIG. 32 is a diagram illustrating a write sequence of the semiconductor memory device 1 according to the first embodiment, and FIG. 33A, FIG. 33B, and FIG. 33C are diagrams illustrating an exemplary sequence of the primary write operation of the semiconductor memory device 1 according to the first embodiment. In the description of FIG. 32, FIG. 33A to FIG. 33C, descriptions of the same or similar configurations as those of FIG. 1 to FIG. 31 may be omitted.

The write sequence of the semiconductor memory device 1 according to the first embodiment will be described with reference to FIG. 32. In the primary write operation, the execution of a first EP verify operation and a first EP program operation to the memory cell transistor MT belonging to a select gate line SGDn, the word lines WLe, and the second group GR2, and the execution of a second EP verify operation and a second EP program operation to the memory cell transistor MT belonging to a select gate line SGDn+1, the word lines WLo, and the second group GR2 are executed N times as a pair, the execution of a third EP verify operation and a third EP program operation to the memory cell transistor MT belonging to the select gate line SGDn, the word lines WLe, and the first group GR1, and the execution of a fourth EP verify operation and a fourth EP program operation to the memory cell transistor MT belonging to the select gate line SGDn+1, the word lines WLo, and the first group GR1 are executed N times as a pair.

The first EP verify operation and the first EP program operation are, for example, STEP 1A shown in FIG. 22, the second EP verify operation and the second EP program operation are, for example, STEP1B shown in FIG. 22, the third EP verify operation and the third EP program operation are, for example, STEP1C shown in FIG. 22, and the fourth EP verify operation and the fourth EP program operation are, for example, STEP1D shown in FIG. 22. The select gate line SGDn is, for example, SGD0. The select gate line SGDn+1 is, for example, SGD1.

In the secondary write operation, the verify operation and the program operation related to the secondary write operation are executed N times to the memory cell transistors MT belonging to the select gate line SGDn, the word lines WLe, the first group GR1, and the second group GR2. In the verify operation and the program operation related to the secondary write operation, for example, the select gate line SGDn is SGD1 and corresponds to "5" of the secondary write operation illustrated in FIG. 29.

In the tertiary write operation, the verify operation and the program operation related to the tertiary write operation are executed N times to the memory cell transistors MT belonging to the select gate line SGDn, the word lines WLe, the first group GR1, and the second group GR2. In the verify operation and the program operation related to the tertiary write operation, for example, the select gate line SGDn is SGD1 and corresponds to "22" of the tertiary write operation illustrated in FIG. 29.

FIG. 33A, FIG. 33B, and FIG. 33C are used to describe the sequencing of the primary write operation of the memory device 1 according to the first embodiment.

As shown in FIG. 33A, in the primary write operation of the semiconductor memory device 1, the order of the first EP verify operation and the first EP program operation, the second EP verify operation and the second EP program operation, the third EP verify operation and the third EP program operation, and the fourth EP verify operation and the fourth EP program operation may be switched with respect to the primary write operation shown in FIG. 32.

As shown in FIG. 33B, in the primary write operation of the semiconductor memory device 1, in the first EP verify operation and the first EP program operation, and in the second EP verify operation and the second EP program operation, after the first EP verify operation and the second EP verify operation are executed, the first program operation and the second program operation may be executed. In addition, in the third EP verify operation and the third EP program operation, and the fourth EP verify operation and the fourth EP program operation, after the third EP verify operation and the third EP program operation are executed, the fourth EP verify operation and the fourth EP program operation may be executed.

As shown in FIG. 33C, in the primary write operation of the semiconductor memory device 1, the first EP verify operation and the first EP program operation and the second EP verify operation and the second EP program operation may be executed on FIG. 33B, and after the first program operation and the second program operation are executed, the first EP verify operation and the second EP verify operation may be executed. In addition, in the third EP verify operation and the third EP program operation, and the fourth EP verify operation and the fourth EP verify operation EP program operation, after the fourth EP verify operation and the fourth EP program operation are executed, the third EP verify operation and the third EP program operation may be executed.

Second Embodiment

In the semiconductor memory device 1 according to the second embodiment, an example will be described in which the three-layer cutoff of the semiconductor memory device 1 according to the first embodiment is replaced with a two-layer cutoff, and the order of the write operations is different. Since other configurations and functions are the same as those of the semiconductor memory device 1 according to the first embodiment, the description of the semiconductor memory device 1 according to the second embodiment mainly describes differences from the semiconductor memory device 1 according to the first embodiment.

<2-1. Two-Layer Cutoff>

Figure 34:
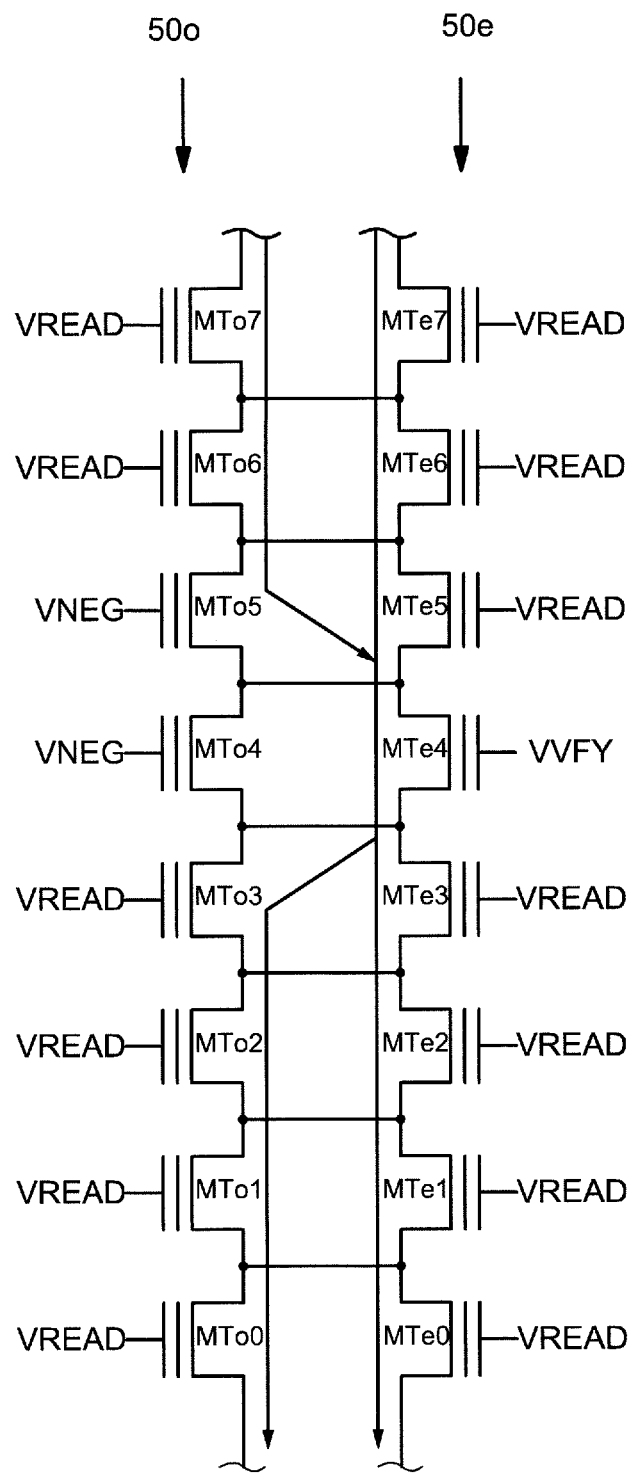
FIG. 34 is a diagram for explaining a two-layer cutoff read operation in the semiconductor memory device according to a second embodiment.

The two-layer cutoff will be described with reference to FIG. 34. FIG. 34 is a diagram for explaining a two-layer cutoff reading operation in the semiconductor memory device 1 according to the second embodiment. In contrast to the "1-1-12. Three-layer cutoff" described with reference to FIG. 20, in the case where the memory cell transistors MT facing each other and the memory cell transistor MT that is located on one side thereof are forcibly turned off, the memory cell transistor MT that belongs to the two-layer word line is turned off, and therefore, it is referred to as a "two-layer cutoff".

As shown in FIG. 34, the gate of the memory cell transistor MTe4 which is the subject of EP verify is supplied with the voltage VPVFY for reading the data of the memory cell transistor MT. The voltage VREAD is supplied to the gates of the memory cell transistors MTe0 to MTe3 and MTe5 to MTe7 to force the respective memory cell transistor MT to turn on. The voltage VNEG for forcibly turning off the memory cell transistor MT is supplied to the gates of the memory cell transistors MTo4 and MTo5. The gate of the memory cell transistor MTo0 to MTo5 and MTo6 to MTo7 is supplied with the voltage VREAD. That is, in an EP verify operation of the two-layer cutoff, the memory cell transistor MT facing the memory cell transistor MT which is the subject of EP verify and the memory cell transistor MT provided in the layer adjacent to the memory cell transistor MT are forcibly turned off.

<2-2. Example of Write Operation Order>

FIG. 35 is a diagram illustrating a write order of the semiconductor memory device 1 according to the second embodiment. As in FIG. 29, the numerical values described in the items of FIG. 35 indicate the order in which the write operation is executed. That is, the write operation is executed in the order of "1"→"2"→"3"→"4"→"5". As in FIG. 29, the operation in the order of the parentheses in FIG. 35 is the same as the operation in the order without the parentheses.

First, operations of "1", "2", "3", "4", and "5" will be described with reference to FIG. 35. "1" indicates the order of the operations in which STEP1 described in "1-1-10. Primary Write Operation" and "1-2. Write Operation" to "1-2-2-2. Example of Primary Write Operation" is executed. "2" and "4" indicate the order in which the secondary write operation (the verify operation and the program operation in the secondary write operation) is executed. "3" indicates the order of the operations in which STEP2 described in "1-11-10. Primary Write Operation" and "1-2. Write Operation" to "1-2-1. Overview of Write Operation", "1-2-1-3. STEP2A and STEP2B", and "1-2-1-4. STEP2C and STEP2D" is executed. "5" indicates the order of the operations in which STEP3 described in "1-11-10. Primary Write Operation" and "1-2. Write Operation" to "1-2-1. Overview of Write Operation", "1-2-1-5. STEP3A and STEP3B", and "1-2-1-6. STEP3C and STEP3D" is executed.

In the semiconductor memory device 1 according to the second embodiment, the primary write operation for the word line WL7 is executed by "1", "3", and "5".

In the semiconductor memory device 1 according to the second embodiment, unlike the first embodiment, since the two-layer cutoff is applied, for example, when the primary write operation of the memory cell transistor MT belonging to a desired word line WLe_n is completed and the primary write operation of the memory cell transistor MT belonging to the desired word line WLe_n is completed, the cutoff current is suppressed, so that the secondary write operation of the memory cell transistor MT belonging to the desired word line WLe_n can be executed.

That is, in "1", when the primary write operation is executed on the memory cell transistors belonging to the select gate line SGD0 and the word line WL7, the secondary write operation can be executed on the memory cell transistors belonging to the select gate line SGD0 and the word line WL7 in "2". Similarly, in "3", when the primary write operation is executed on the memory cell transistors belonging to the select gate line SGD2 and the word line WL7, the secondary write operation can be executed on the memory cell transistors belonging to the select gate line SGD2 and the word line WL7 in "4".

In "4" following "3", an operation similar to "1" is executed on a word line WL6 that differs from the word line WL7 executed on "1". In "5" following "4", the secondary write operation (the verify operation and the program operation in the secondary write operation) is executed on the memory cell transistors belonging to the select gate line SGD0 and the word line WL7.

Next, the order of the primary write operation will be described. "10" and "25" execute the same operations as "1", and "12" and "27" execute the same operation as "3" for word lines different from the word line WL7 executed for "3", and "14" and "29" execute the same operation as "5" for word lines different from the word line WL7 executed for "5". "10", "12", and "14" execute the primary write operation for the word line WL6, and "25", "27", and "29" execute the primary write operation for the word line WL5. Similar to the primary write operation for the word lines WL7 to WL5, the primary write operation is also executed for the word lines WL4 to WL0.

Next, the order of the secondary write operation will be described. In "7", "8", "6", and "9", the secondary write operation is executed on the memory cell transistor MT belonging to the same word line WL7 as "2" and "4", and belonging to the select gate lines SGD (SGD1, SGD3 to SGD5) differing from "2" and "4" shown in FIG. 35. In "11", "16", "13", "17", "15", and "18", the secondary write operation is executed on the memory cell transistors MT belonging to the respective select gate lines SGD (SGD0 to SGD5) with respect to the word line WL6. In "11", "16", "13", "17", "15", and "18", the secondary write operation is executed on the same select gate lines SGD (SGD0 to SGD5) as "2", "7", "4", "8", "6", and "9" shown in FIG. 35, respectively. In "26", "31", "28", "32", "30", and "33", the secondary write operation is executed on the same select gate lines SGD (SGD0 to SGD5) as "2", "7", "4", "8", "6", and "9" shown in FIG. 35, and the memory cell transistors MT belonging to the same word line WL5, respectively. Similar to the secondary write operation for the word lines WL7 to WL5, the secondary write operation is also executed for the word lines WL4 to WL0.

Next, the order of the tertiary write operation (the verify operation and the program operation of the tertiary write operation) will be described. As in the first embodiment, the tertiary write operation of the desired word line is executed after the secondary write operation of the desired word line is completed and the secondary write operation of the lower layer of the desired word line is completed. Specifically, after the secondary write operation ("2", "7", "4", "8", "6", and "9") of the memory cell transistor MT belonging to the word line WL7 is completed and the secondary write operation ("11", "16", "13", "17", "15", and "18") of the memory cell transistor MT belonging to the word line WL6 belonging to the lower layer of the word line WL7 is completed, the tertiary write operation ("19", "22", "20", "23", "21", and "24") of the memory cell transistor MT belonging to the word line WL7 is executed. In "34", "37", "35", "38", "36", and "39", the tertiary write operation is executed on the memory cell transistors MT belonging to the respective select gate lines SGD (SGD0 to SGD5) with respect to the word line WL6. In "34", "37", "35", "38", "36", and "39", the tertiary write operation is executed on the same select gate lines SGD (SGD0 to SGD5) as "19", "22", "20", "23", "21", and "24" shown in FIG. 35, respectively. Similar to the secondary write operation for the word lines WL7 to WL6, the tertiary write operation is also executed for the word lines WL5 to WL0.

<2-3. Example of Timing Chart of EP Verification Operation>

Figure 36:
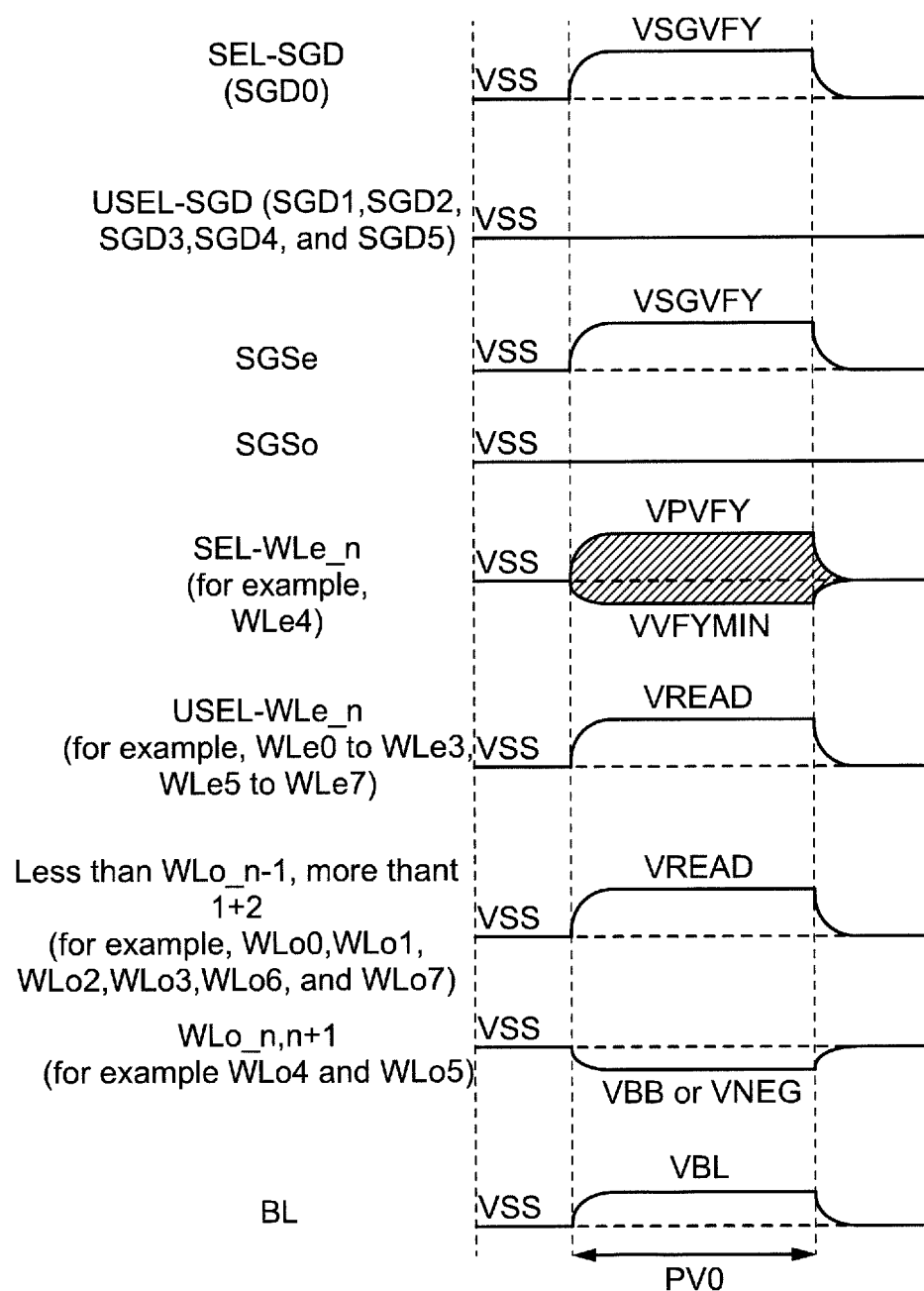
FIG. 36 is a diagram illustrating a timing chart of various types of signals during the EP verify operation in the semiconductor memory device according to the second embodiment.

FIG. 36 is a diagram illustrating a timing chart of various types of signals during the EP verify operation in the semiconductor memory device 1 according to the second embodiment. In the EP verify operation in the semiconductor memory device 1 according to the second embodiment, the voltages supplied to the memory cell transistors MT connected to the word line WLo_n and the word line WLo_n differ from the EP verify operation in the semiconductor memory device 1 according to the first embodiment shown in FIG. 30. The other voltages supplied to the signal lines or the memory cell transistors MT are the same as the voltages shown in FIG. 30.

Specifically, in the PV0 period of FIG. 35, the selected word line SEL-WLe_n (here, Wle7) and the memory cell transistor Mte7 connected to Wle7 are supplied with the voltage VPVFY. In the first embodiment, since the two-layer cutoff is executed, the voltage VNEG or the voltage VBB is supplied to the memory cell transistors MT connected to the unselected word lines and the unselected word lines facing the selected word lines. Specifically, the word lines SEL-Wlo_n, n+1 (here, Wlo7) and the memory cell transistors Mto7 connected to Wlo7 are supplied with the voltage VNEG. The voltage VREAD is supplied to the word lines Wlo_n−1 or less and 1+2 or more (here, Wlo6 to Wlo0) and the memory cell transistors Mto6 to Mto0 connected to Wlo6 to Wlo0.

Here, Wle4 of the selected word line SEL-Wle_n shown in FIG. 35 is replaced with Wle7 in order to explain an example that the selected word line SEL-WLe_n is WLe7. As shown in FIG. 35, in the case where the selected word line SEL-WLe_n is WLe4, the word lines SEL-WLo_n and n+1 are WLo4 and WLo5, and word lines WLo_n−1 or less and 1+2 or more are WLo7, WLo6 and WLo3 to WLo0.

Third Embodiment

In the semiconductor memory device 1 according to the third embodiment, the primary writing to the memory cell transistors MT belonging to the word lines WLe, the first group GR1, and the second group GR2 (bit lines BL0 to BL7) and the primary write operation to the memory cell transistors MT belonging to the word lines WLo, the first group GR1, and the second group GR2 (bit lines BL0 to BL7) differ from the primary writing in the semiconductor memory device 1 according to the first embodiment. Since other configurations and functions are the same as those of the semiconductor memory device 1 according to the first embodiment, descriptions of the semiconductor memory device 1 according to the third embodiment mainly describes differences from the semiconductor memory device 1 according to the first embodiment.

<3-1. Overview of Write Operation>

An example of the primary write operation of the semiconductor memory device 1 according to the third embodiment will be described with reference to FIG. 37. In the descriptions of FIG. 37, descriptions of the same or similar configurations as those of FIG. 1 to FIG. 36 may be omitted.

In the semiconductor memory device 1 according to the third embodiment, writing to the memory cell transistors MT belonging to the first group GR1 and the second group GR2 (bit lines BL0 to BL7) is executed. That is, focusing on the four bit lines BL0 to BL3, in the semiconductor memory device 1 according to the first embodiment, writing to the memory cell transistors MT belonging to the three bit lines BL2 to BL3 and writing to the memory cell transistors MT belonging to the one bit line BL0 is executed alternately, whereas in the semiconductor memory device 1 according to the third embodiment, writing to the memory cell transistors MT belonging to the four bit lines BL0 to BL3 is executed at the same timing. That is, without dividing the pages, the write operation to the memory strings 50e belonging to the four bit lines BL0 to BL3 and the word lines WLe and the write operation to the memory strings 50o belonging to the four bit lines BL0 to BL3 and the word lines WLo is alternately executed. In the third embodiment, four bit lines BL0 to BL3 among the first group GR1 and the second group GR2 (bit lines BL0 to BL7) will be mainly described.

In the semiconductor memory device 1 according to the third embodiment, the four bit lines BL0 to BL3 can be collectively written without dividing the four bit lines BL0 to BL3 into the first group GR1 or the second group GR2.

<3-1-1. STEP1>

STEP1 of the semiconductor memory device 1 according to the third embodiment is an operation in which STEP1A and STEP1C of the semiconductor memory device 1 according to the first embodiment are combined. In STEP1 of the semiconductor memory device 1 according to the third embodiment, the EP verify operation and the EP program operation according to STEP1 are set as one set (a seventh set), and the seventh set is executed N times.

Specifically, in STEP1 of the semiconductor memory device 1 according to the third embodiment, the word lines WLe, the first group GR1, and the second group GR2 are selected (S), and the select gate line SGD0, the word lines WLe, the first group GR1, and the memory cell transistor MT belonging to the second group GR2 are subjected to the EP verify operation and the EP program operation. The word lines WLo are unselected (US), and the EP verify operation and the EP program operation are not executed for the memory cell transistors MT belonging to the word lines WLo. In the EP verify operation, the select gate line SGD0 is applied with the voltage VSGVFY, the select gate lines SGD1 to SGD5 are applied with the voltage VSS, and the predetermined word lines WLe are applied with the voltage VPVFY. In the EP program operation, the select gate line SGD0 is applied with the voltage VSG, the select gate lines SGD1 to SGD5 are applied with the voltage VSS, and the predetermined word lines WLe are applied with the voltage VPRG. The memory cell transistors MT belonging to the first group GR1, the second group GR2, the select gate line SGD0, and the word lines WLe are the memory cell transistors MT facing the word lines WLe of the memory pillars MP0, MP5, MP6, MP7, MP12, MP17, MP18 and MP19.

<3-1-2. STEP2>

STEP2 of the semiconductor memory device 1 according to the third embodiment is an operation in which STEP2A and STEP2C of the semiconductor memory device 1 according to the first embodiment are combined. In STEP2 of the semiconductor memory device 1 according to the third embodiment, the EP verify operation and the EP program operation according to STEP2 are set as one set (an eighth set), and the eighth set is executed N times.

Specifically, STEP2 of the semiconductor memory device 1 according to the third embodiment differs from STEP1 of the semiconductor memory device 1 according to the third embodiment in that the select gate line SGD0 is changed to the select gate line SGD2. Here, differences from STEP1 of the semiconductor memory device 1 according to the third embodiment will be mainly described. In STEP2 of the semiconductor memory device 1 according to the third embodiment, the EP verify operation and EP program operation are executed on the memory cell transistors MT belonging to the select gate line SGD2, the word lines WLe, the first group GR1, and the second group GR2. The memory cell transistors MT belonging to the first group GR1, the second group GR2, the select gate line SGD2, and the word lines WLe are the memory cell transistors MT facing the word lines WLe of the memory pillars MP1, MP2, MP8, MP9, MP13, MP14, MP20 and MP21.

<3-1-3. STEP3>

STEP3 of the semiconductor memory device 1 according to the third embodiment is an operation in which STEP3A and STEP3C of the semiconductor memory device 1 according to the first embodiment are combined. In STEP3 of the semiconductor memory device 1 according to the third embodiment, the EP verify operation and the EP program operation according to STEP3 are set as one set (a ninth set), and the ninth set is executed N times.

Specifically, STEP3 of the semiconductor memory device 1 according to the third embodiment differs from STEP1 of the semiconductor memory device 1 according to the third embodiment in that the select gate line SGD0 is changed to the select gate line SGD4. Here, differences from STEP1 of the semiconductor memory device 1 according to the third embodiment will be mainly described. In STEP3 of the semiconductor memory device 1 according to the third embodiment, the EP verify operation and the EP program operation are executed on the memory cell transistors MT belonging to the select gate line SGD4, the word lines WLe, the first group GR1, and the second group GR2. The memory cell transistors MT belonging to the first group GR1, the second group GR2, the select gate line SGD4, and the word lines WLe are the memory cell transistors MT facing the word lines WLe of the memory pillars MP3, MP4, MP8, MP10, MP11, MP15, MP16, MP22 and MP23.

<3-1-4. STEP4>

STEP4 of the semiconductor memory device 1 according to the third embodiment is an operation in which STEP1B and STEP2D of the semiconductor memory device 1 according to the first embodiment are combined. In STEP4 of the semiconductor memory device 1 according to the third embodiment, the EP verify operation and the EP program operation according to STEP4 are set as one set (a tenth set), and the tenth set is executed N times.

Specifically, in STEP4 of the semiconductor memory device 1 according to the third embodiment, the word lines WLo, the first group GR1, and the second group GR2 are selected (S), and the select gate line SGD1, the word lines WLo, the first group GR1, and the memory cell transistor MT belonging to the second group GR2 are subjected to the EP verify operation and the EP program operation. The word lines WLe are unselected (US), and the EP verify operation and the EP program operation are not executed for the memory cell transistors MT belonging to the word lines WLe. In the EP verify operation, the select gate line SGD1 is applied with the voltage VSGVFY, the select gate lines SGD0 and SGD2 to SGD5 are applied with the voltage VSS, and the predetermined word line WLo is applied with the voltage VPVFY. In the EP program operation, the select gate line SGD1 is applied with the voltage VSG, the select gate lines SGD0 and SGD2 to SGD5 are applied with the voltage VSS, and the predetermined word lines WLe are applied with the voltage VPRG. The memory cell transistors MT belonging to the first group GR1, the second group GR2, the select gate line SGD1, and the word lines WLo are the memory cell transistors MT facing the word lines WLo of the memory pillars MP0, MP1, MP6, MP7, MP12, MP13, MP18 and MP19.

<3-1-5. STEP5>

STEP5 of the semiconductor memory device 1 according to the third embodiment is an operation in which STEP2B and STEP3D of the semiconductor memory device 1 according to the first embodiment are combined. In a STEP5 of the semiconductor memory device 1 according to the third embodiment, the EP verify operation and the EP program operation according to STEP5 are set as one set (an eleventh set), and the eleventh set is executed N times.

Specifically, STEP5 of the semiconductor memory device 1 according to the third embodiment differs from STEP4 of the semiconductor memory device 1 according to the third embodiment in that the select gate line SGD1 is changed to the select gate line SGD3. Here, differences from STEP4 of the semiconductor memory device 1 according to the third embodiment will be mainly described. In STEP5 of the semiconductor memory device 1 according to the third embodiment, the EP verify operation and the EP program operation are executed on the memory cell transistors MT belonging to the select gate line SGD3, the word lines WLo, the first group GR1, and the second group GR2. The memory cell transistors MT belonging to the first group GR1, the second group GR2, the select gate line SGD3, and the word lines WLo are the memory cell transistors MT facing the word lines WLe of the memory pillars MP2, MP3, MP8, MP9, MP14, MP15, MP20 and MP21.

<3-1-6. STEP6>

STEP6 of the semiconductor memory device 1 according to the third embodiment is an operation in which STEP1D and STEP3B of the semiconductor memory device 1 according to the first embodiment are combined. In a STEP6 of the semiconductor memory device 1 according to the third embodiment, the EP verify operation and the EP program operation according to STEP6 are set as one set (a twelfth set), and the twelfth set is executed N times.

Specifically, STEP6 of the semiconductor memory device 1 according to the third embodiment differs from STEP4 of the semiconductor memory device 1 according to the third embodiment in that the select gate line SGD1 is changed to the select gate line SGD5. Here, differences from STEP1 of the semiconductor memory device 1 according to the third embodiment will be mainly described. In STEP6 of the semiconductor memory device 1 according to the third embodiment, the EP verify operation and the EP program operation are executed on the memory cell transistors MT belonging to the select gate line SGD5, the word lines WLo, the first group GR1, and the second group GR2. The memory cell transistors MT belonging to the first group GR1, the second group GR2, the select gate line SGD5, and the word lines WLo are the memory cell transistors MT facing the word lines WLe of the memory pillars MP4, MP5, MP10, MP11, MP16, MP17, MP22 and MP23.

<3-2. Example of Write Operation Order>

FIG. 38 is a diagram illustrating a write order of the semiconductor memory device 1 according to the third embodiment. The same as FIG. 29 in which the write order of the semiconductor memory device 1 according to the first embodiment is shown, numerical values described in the items of FIG. 38 indicate an order in which the write operation is executed. That is, the write operation is executed in the order of "1"→"2"→"3"→"4"→"5" . . . .

First, operations of "1" to "9" will be described with reference to FIG. 38. "1" indicates an order of operations in which STEP1 described in "3-1-1. STEP1" is executed, "2" indicates an order of operations in which STEP2 described in "3-1-2. STEP2" is executed, and "3" indicates an order of operations in which STEP3 described in "3-1-3. STEP3" is executed. "4" and "7" indicate an order of operations in which STEP4 described in "3-1-4. STEP4" is executed, "5" indicates an order of operations in which STEP5 described in "3-1-5. STEP5" is executed, and "6" and "8" indicate an order of operations in which STEP3 described in "3-1-6. STEP6" is executed. The primary write operation for the word line WL7 is executed by "1" to "6".

In "7" following "6", an operation similar to "4" is executed on the lower-layer word line WLo6 of the word line WLo7 executed on "4". Specifically, the primary write operation is executed on the four bit lines BL0 to BL3, the select gate line SGD0, and the memory cell transistors MT belonging to the select gate lines SGD1 and the word line WLo6 opposed to the memory cell transistors MT belonging to WLe6.

In "8" following "7", an operation similar to "6" is executed on the lower-layer word line WLo6 of the word line WLo7 executed on "6". Specifically, the primary write operation is executed on the four bit lines BL0 to BL3, the select gate line SGD0, and the memory cell transistors MT belonging to the select gate lines SGD5 and the word line WLo6 opposed to the memory cell transistors MT belonging to WLe6.

In "9" following "8", the secondary write operation (the verify operation and the program operation in the secondary write operation) is executed on the memory cell transistors MT belonging to the select gate line SGD0 and the word line WLe7.

In the third embodiment, in the case where the primary write operation of the memory cell transistors belonging to the word lines WLe is completed and the secondary write operation of the memory cell transistors belonging to the word lines WLe is executed, the primary write operation of the memory cell transistors belonging to the word lines WLo facing the word lines WLe below the word lines WLe is executed.

Therefore, in the semiconductor memory device 1 according to the third embodiment, as described in "7" to "9", in the case where the secondary write operation is executed on the memory cell transistors belonging to the select gate line SGD0 and the word line WLe7, the primary write operation is executed on the memory cell transistors MT belonging to the four bit lines BL0 to BL3, the select gate line SGD1, and the word line WLo6. Further, the primary write operation is executed on the memory cell transistors MT belonging to the select gate lines SGD5 and the word line WLo6 opposed to the memory cell transistors MT belonging to the four bit lines BL0 to BL3, the select gate lines SGD0 and the word line WLe7.

Thus, when the secondary write operation is executed on the memory cell transistors belonging to the select gate line SGD0 and the word line WLe7, the voltage VNEG can be supplied to the memory cell transistors MT belonging to the select gate line SGD1 and the word line WLo7 and the memory cell transistors MT belonging to the select gate line SGD5 and the word line WLo7. At this time, in "4" and "6", the primary write operation has been executed on the memory cell transistors belonging to the select gate line SGD1 and the word line WLo7 and the memory cell transistors MT belonging to the select gate lines SGD5 and the word line WLo7. Therefore, when the secondary write operation is executed on the memory cell transistors belonging to the select gate line SGD0 and the word line WLe7, the voltage VNEG can be supplied to the memory cell transistors belonging to the select gate line SGD1 and the word line WLo7 and the memory cell transistors MT belonging to the select gate lines SGD5 and the word line WLo7. Consequently, when the secondary write operation is executed on the memory cell transistors belonging to the select gate line SGD0 and the word line WLe7, the operation corresponding to the three-layer cutoff is executed.

In the semiconductor memory device 1 according to the third embodiment, without dividing the page, the primary write operation to the memory cell transistor MT belonging to the four bit lines BL0 to BL3 and the word lines WLe and the primary write operation to the memory cell transistor MT belonging to the four bit lines BL0 to BL3 and the word lines WLo can be executed, and the secondary write operation of the memory cell transistor belonging to the desired word line can be executed after eliminating the fact that the memory cell transistor belonging to the word line under the desired word line is in an over-erased state and the fact that an excessive voltage is written and that the threshold voltage is further increased. Therefore, in the semiconductor memory device 1 according to the third embodiment, the primary write operation and the secondary write operation can be executed at a higher speed than in the case where the page is divided.

Next, the order of the primary write operation will be described. "13", "25", and "61" execute the same operation as "1", and "14", "26", and "62" execute same operations as "2" to a word line different from the word line WL7 executed at "2", and "16", "28", and "64" execute the same operations as "3" to a word line different from the word line WL7 executed at "3", and "19", "37", and "55" execute the same operations as "4" and "7" to a word line different from the word line WL7 executed at "4" and the word line WL6 executed at "7", and "10," "22," "40," "58" execute the same operations as "5" to a word line different from the word line WL7 executed at "5", and "20", "38" and "56" execute the same operations as "6" and "8" to a word line different from the word line WL7 executed at "6" and the word line WL6 executed at "8".

"13", "7", "14", "10", "16" and "8" execute the primary write operation on the word line WL6, and "25", "19", "26", "22", "28" and "20" execute the primary write operation on the word line WL5, and "43", "37", "44", "40", "46" and "38" execute the primary write operation on the word line WL4, and "61", "55", "62", "58", "64" and "56" execute the primary write operation on the word line WL3. Similar to the primary write operation for the word lines WL7 to WL3, the primary write operation is also executed for the word lines WL2 to WL0.

Next, the order of the secondary write operation will be described. In "15", "11", "17", "12", and "18", the secondary write operation is executed on the memory cell transistors MT belonging to the same word line WL7 as "9" and the select gate lines SGD (SGD1 to SGD5) in the respective operations. In "21", "27", "23", "29", "24", and "30", the secondary write operation is executed on the memory cell transistors MT belonging to the select gate lines SGD (SGD0 to SGD5) in the respective operations with respect to the word line WL6. In "39", "45", "41", "47", "42", and "48", the secondary write operation is executed on the memory cell transistor MT belonging to the word line WL5 and the select gate lines SGD (SGD0 to SGD5) in the respective operation. In "57", "63", "59", "65", "60", and "66", the secondary write operation is executed on the memory cell transistor MT belonging to the word line WL4 and the select gate lines SGD (SGD0 to SGD5) in the respective operation. Similar to the secondary write operation for the word lines WL7 to WL4, the secondary write operation is also executed for the word lines WL3 to WL0.

Next, the order of the tertiary write operation (the verify operation and the program operation of the tertiary write operation) will be described. The tertiary write operation of the desired word line is executed after the secondary write operation of the desired word line is completed and the secondary write operation of the lower layer of the desired word line is completed. Specifically, after the secondary write operations ("9", "15", "11", "17", "12", and "18") of the memory cell transistors MT belonging to the word line WL7 are completed and the secondary write operations ("21", "27", "23", "29", "24", and "30") of the memory cell transistors MT belonging to the word line WL6 belonging to the lower layer of the word line WL7 are completed, the tertiary write operations ("31", "34", "32", "35", "33", and "36") of the memory cell transistors MT belonging to the word line WL7 are executed. In "49", "52", "50", "53", "51", and "54", the tertiary write operation is executed on the memory cell transistor MT belonging to the word line WL6 and the select gate lines SGD (SGD0 to SGD5) in each operation. In "67", "70", "68", "71", "69", and "72", the tertiary write operation is executed on the memory cell transistor MT belonging to the word line WL5 and the select gate lines SGD (SGD0 to SGD5) in the respective operation. Similar to the secondary write operation for the word lines WL7 to WL5, the tertiary write operation is also executed for the word lines WL4 to WL0.

In the semiconductor memory device 1 according to the third embodiment, in a steady state of the word line (for example, the word lines WL5 and WL4) below the word line WL7, instead of the word line WL7 at the uppermost layer, the number of the primary write operations executed immediately before the execution of a certain secondary write operation is "two, one, zero". For example, as shown in FIG. 38, in the case where the secondary write operation is executed on the memory cell transistor MT belonging to the word line WL5, two primary write operations indicated by "37" and "38" are executed immediately before "39" of the secondary write operation, and one primary write operation indicated by "40" is executed immediately before "41" of the secondary write operation, and one primary write operation is not executed (that is, 0 times) immediately before "42" of the secondary write operation, and two primary write operations indicated by "43" and "44" are executed immediately before "45" of the secondary write operation, and one primary write operation indicated by "46" is executed immediately before "47" of the secondary write operation, and the primary write operation is not executed immediately before the secondary write operation "48" (that is, zero times).

<3-3. Example of Write Operation>

Figure 39:
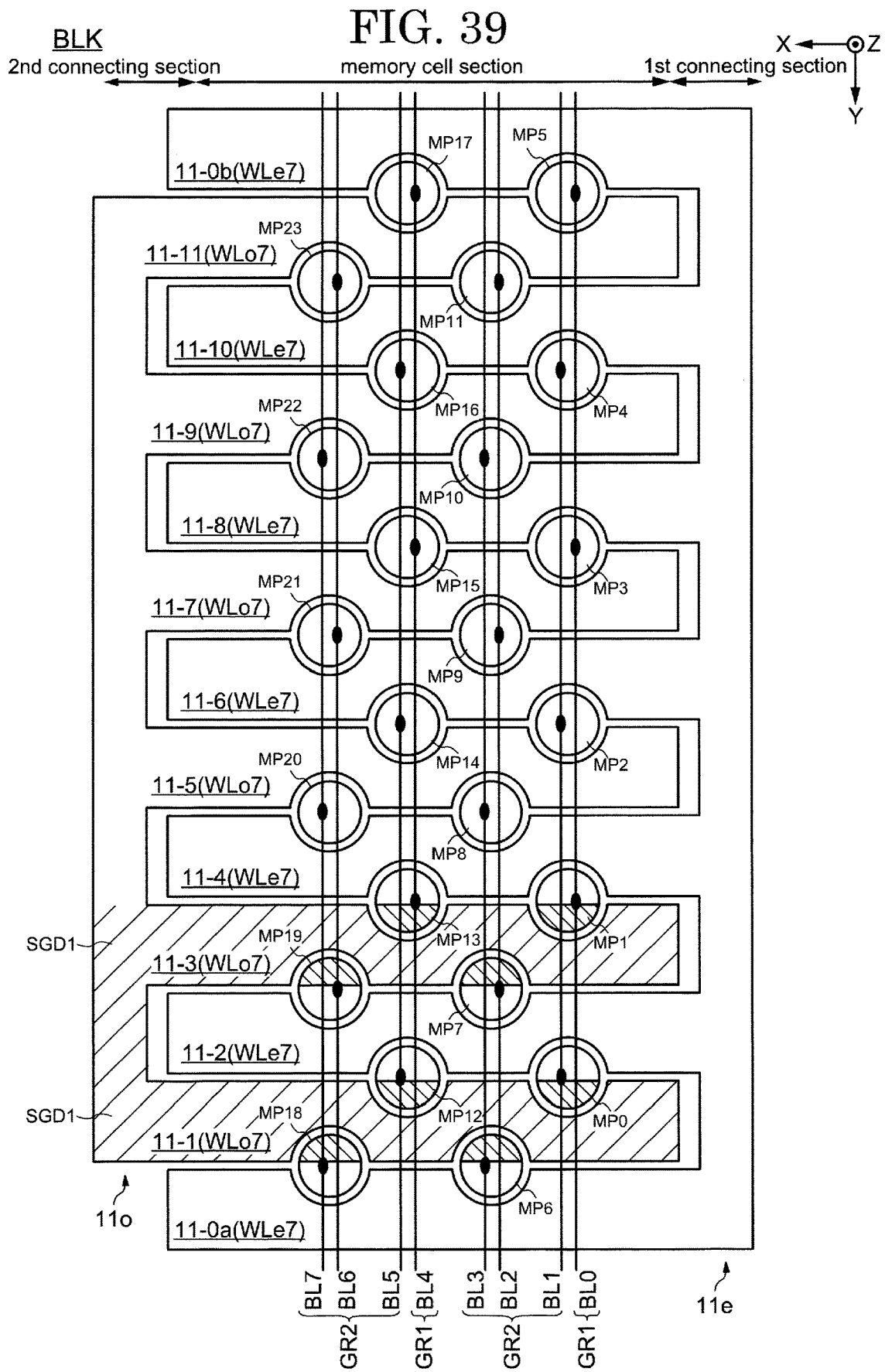
FIG. 39 is a diagram for describing the write operation with reference to a layout of a word line and a memory pillar in the semiconductor memory device according to the third embodiment.
Figure 42:
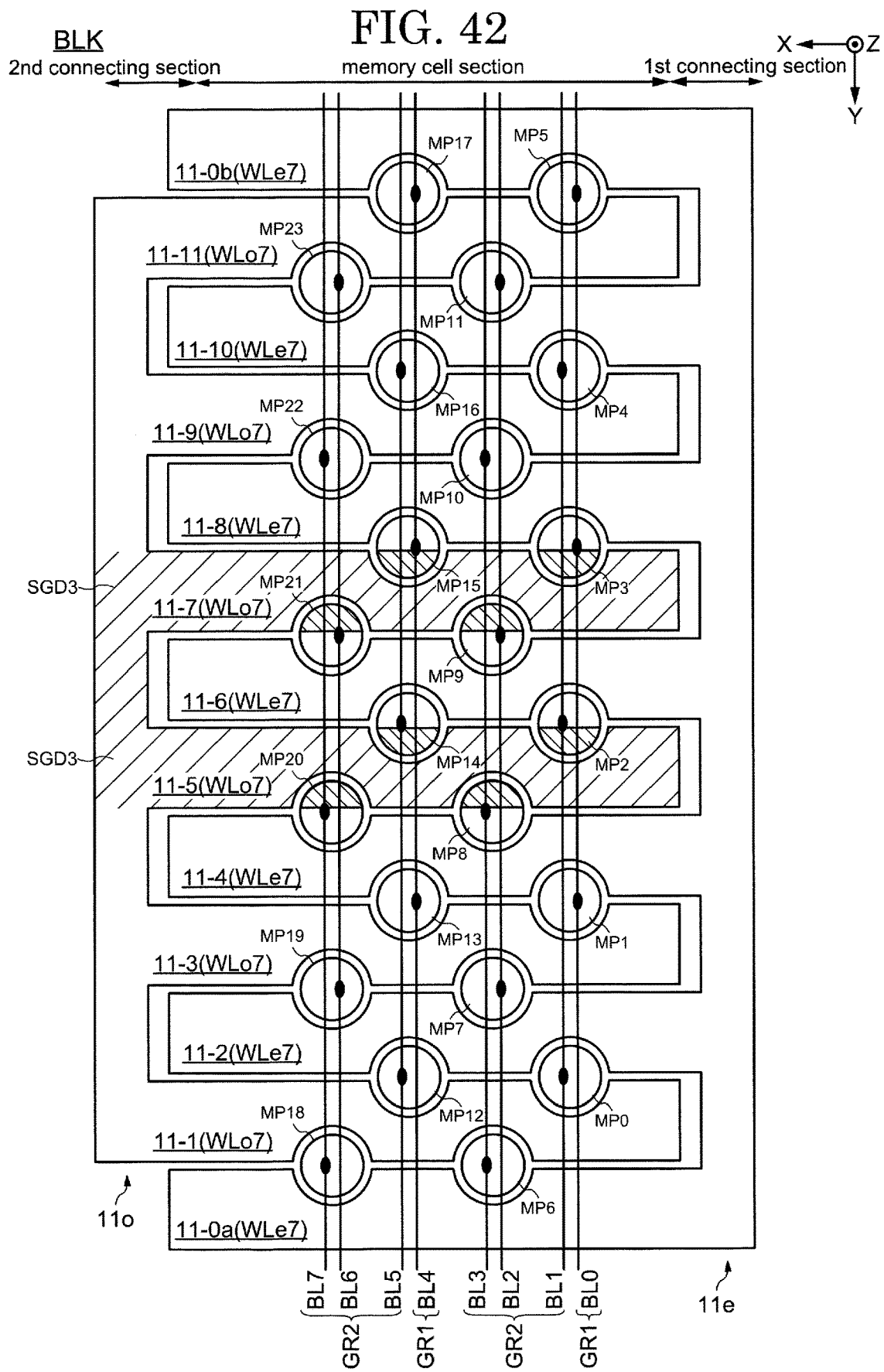
FIG. 42 is a diagram for explaining the write operation with reference to the layout of the word line and the memory pillar in the semiconductor memory device according to the third embodiment.
Figure 43:
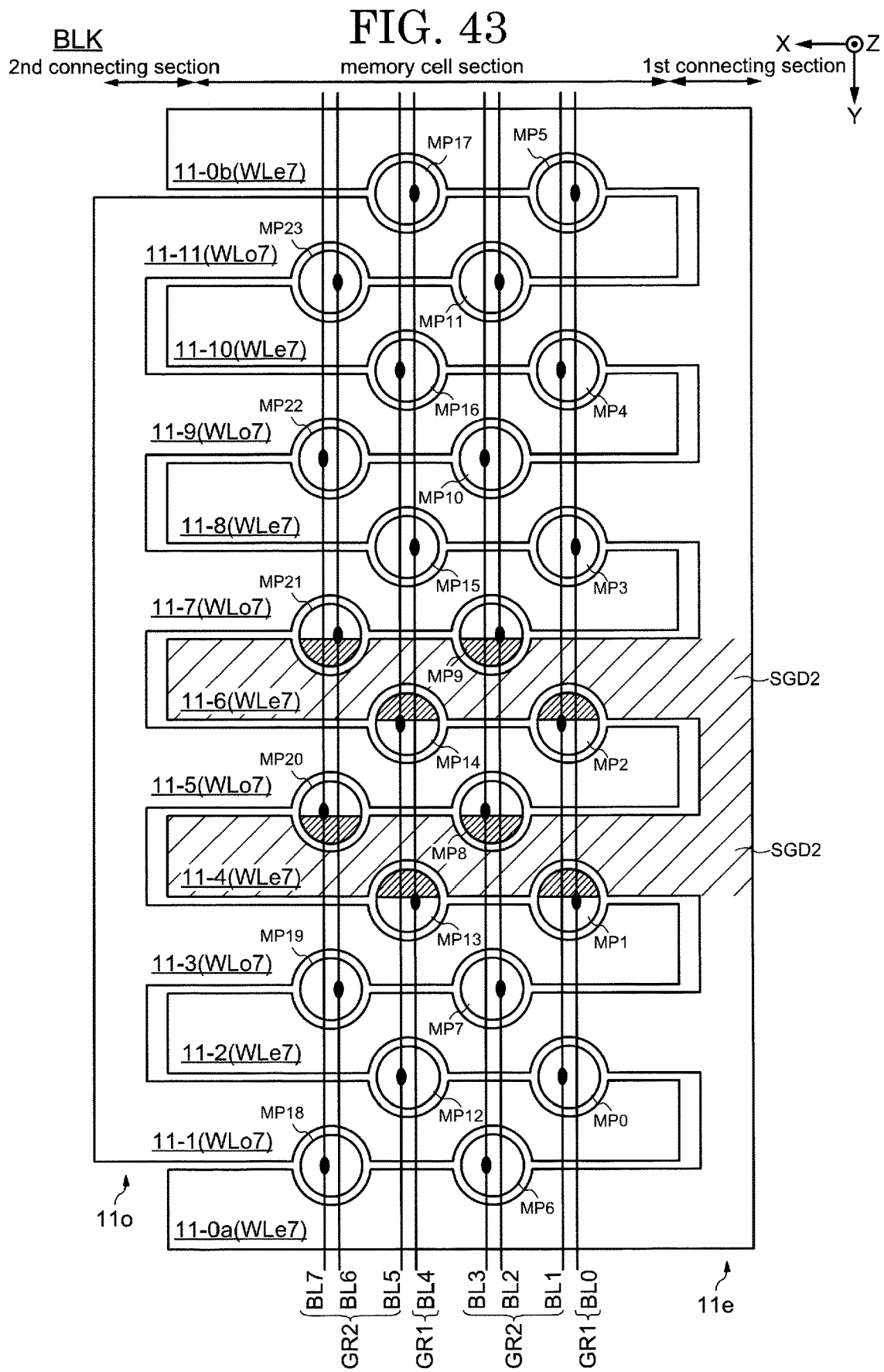
FIG. 43 is a diagram for describing the write operation with reference to the layout of the word line and the memory pillar in the semiconductor memory device according to the third embodiment.
Figure 44:
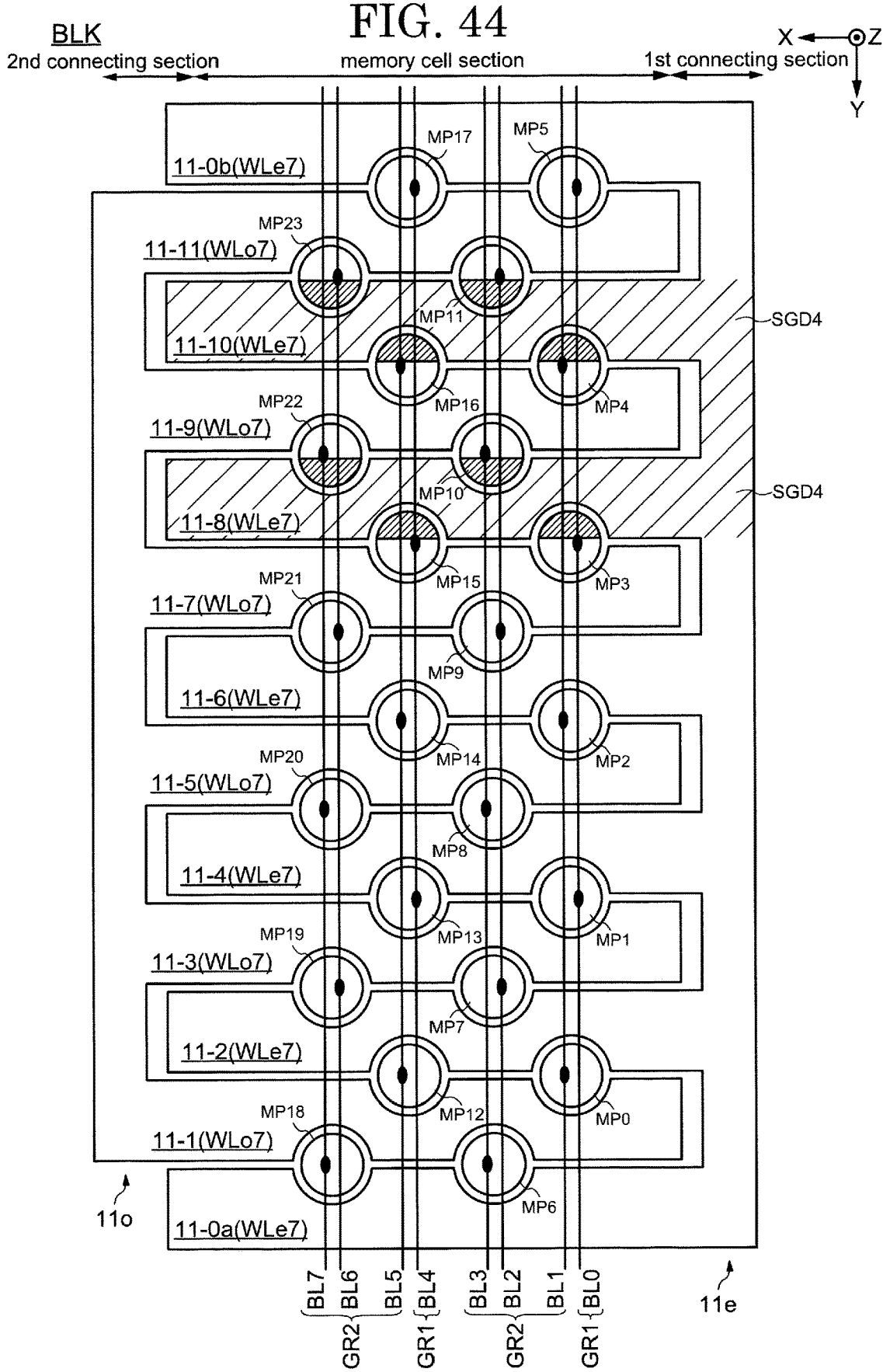
FIG. 44 is a diagram for explaining the write operation with reference to the layout of the word line and the memory pillar in the semiconductor memory device according to the third embodiment.

With reference to FIG. 3, FIG. 39, and FIG. 44, the primary write operation and the secondary write operation in the steady state of the semiconductor memory device 1 according to the third embodiment will be described with reference to "37" to "42". FIG. 39 to FIG. 44 are diagrams for describing the write operation with reference to the layout of the word lines and the memory pillars of the semiconductor memory device 1 according to the third embodiment. In the descriptions of FIG. 39 to FIG. 44, the same configuration as that described in "1-2-2-1. Overview of Primary Write Operation" can be used. In the description of FIG. 39 to FIG. 44, the description of the same or similar configurations as those of FIG. 1 to FIG. 38 may be omitted.

The primary write operation according to "37" will be described with reference to FIG. 3 and FIG. 39. In the primary write operation according to "37", the EP verify operation and the EP program operation are executed on the memory cell transistors MT belonging to the memory string 50o selected by the select gate line SGD1 shown in FIG. 3 and belonging to the word line WLo4, the first group GR1, and the second group GR2 (for example, four bit lines BL0 to BL3).

Specifically, when the select gate line SGD1, the word line WLo7, the first group GR1, and the second group GR2 are selected, the select transistor ST1 opposed to the wiring layers 10-1a and 10-1b shown in FIG. 3 is turned on or off in accordance with the voltage supplied to the bit lines BL0 to BL7. In FIG. 39, a hatched area of the wiring layer 11 corresponds to the area where the wiring layers 10-1a and 10-1b shown in FIG. 3 are arranged.

When the select gate line SGD1, the word line WLo4, the first group GR1, and the second group GR2 are selected, the select transistor ST1 connected to the select gate line SGD1 corresponding to the wirings 10-1a and 10-1b of the wirings 11o (see FIG. 3) is selected, and the EP verify operation and the EP program operation are executed on the memory cell transistors MT (the second memory cells) provided on each of the word line WLo7 sides of the memory pillars MP0, MP1, MP6, MP7, MP12, MP13, MP18 and MP19. In FIG. 39, the memory cell transistors MT (the second memory cells) provided on the respective word lines WLo4 sides of the memory pillars MP0, MP1, MP6, MP7, MP12, MP13, MP18 and MP19 are indicated by wide hatched lines.

Figure 40:
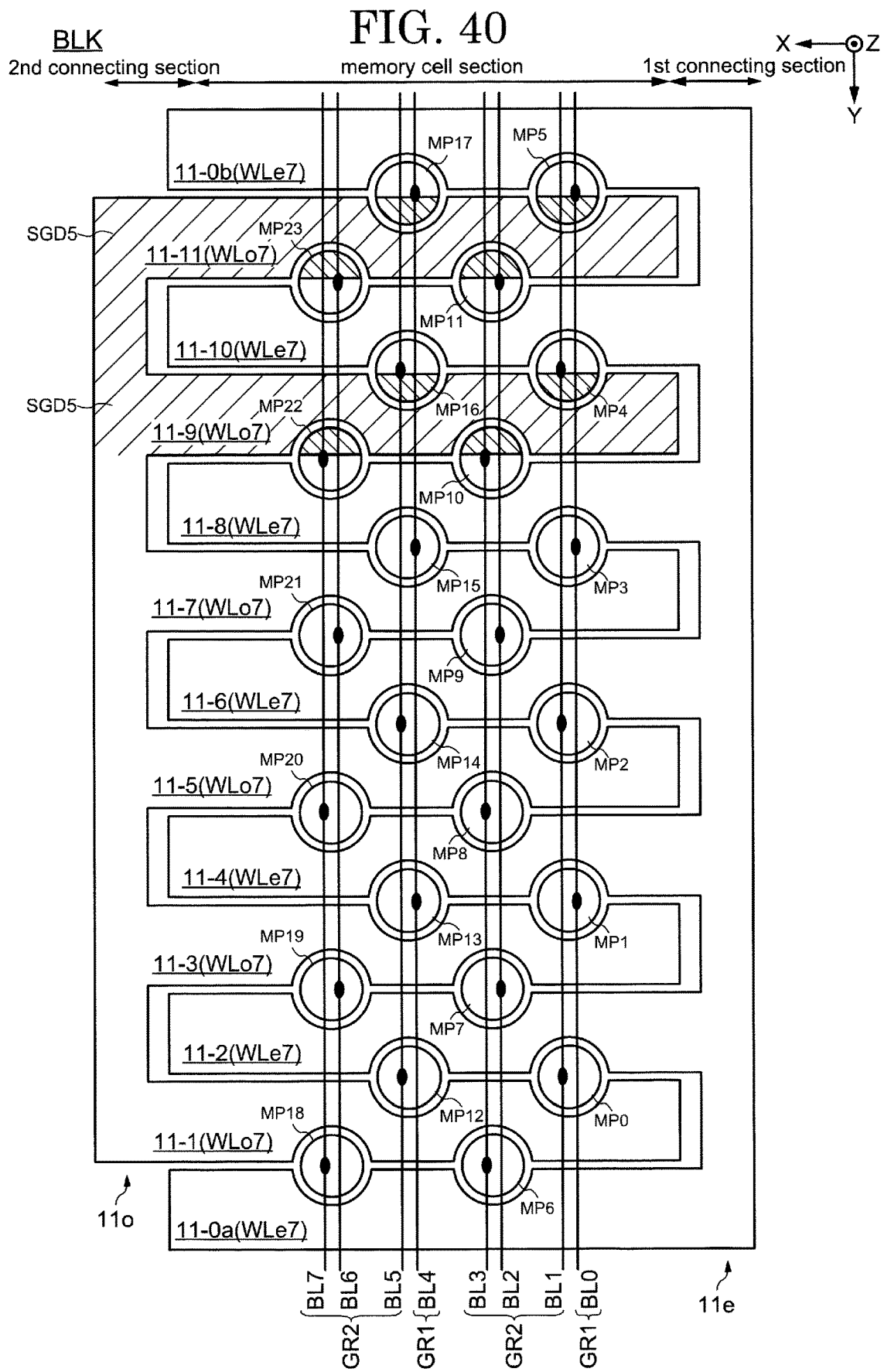
FIG. 40 is a diagram for describing the write operation with reference to the layout of the word line and the memory pillar in the semiconductor memory device according to the third embodiment.

The primary write operation according to "38" will be described with reference to FIG. 3 and FIG. 40. In the primary write operation according to "38", the EP verify operation and the EP program operation are executed on the memory cell transistors MT belonging to the memory string 50o selected by the select gate line SGD5 shown in FIG. 3 and belonging to the word line WLo4, the first group GR1, and the second group GR2 (for example, the four bit lines BL0 to BL3).

Specifically, when the select gate line SGD5, the word line WLo4, the first group GR1, and the second group GR2 are selected, the select transistor ST1 opposed to the wiring layers 10-5a and 10-5b shown in FIG. 3 is turned on or off in accordance with the voltage supplied to the bit lines BL0 to BL7. In FIG. 40, a hatched area of the wiring layer 11o corresponds to the area where the wiring layer 10-5a and 10-5b shown in FIG. 3 are arranged.

When the select gate line SGD5, the word line WLo4, the first group GR1, and the second group GR2 are selected, the select transistor ST1 connected to the select gate line SGD5 corresponding to the wiring layers 10-5a and 10-5b of the wiring layers 11o (see FIG. 3) is selected, and the EP verify operation and the EP program operation are executed on the memory cell transistors MT (the second memory cells) provided on each of the word line WLo4 sides of the memory pillars MP4, MP5, MP10, MP11, MP16, MP17, MP22 and MP23. In FIG. 40, the memory cell transistors MT (the second memory cells) provided on the respective word line WLo4 sides of the memory pillars MP4, MP5, MP10, MP11, MP16, MP17, MP22 and MP23 are indicated by wide hatched lines.

Figure 41:
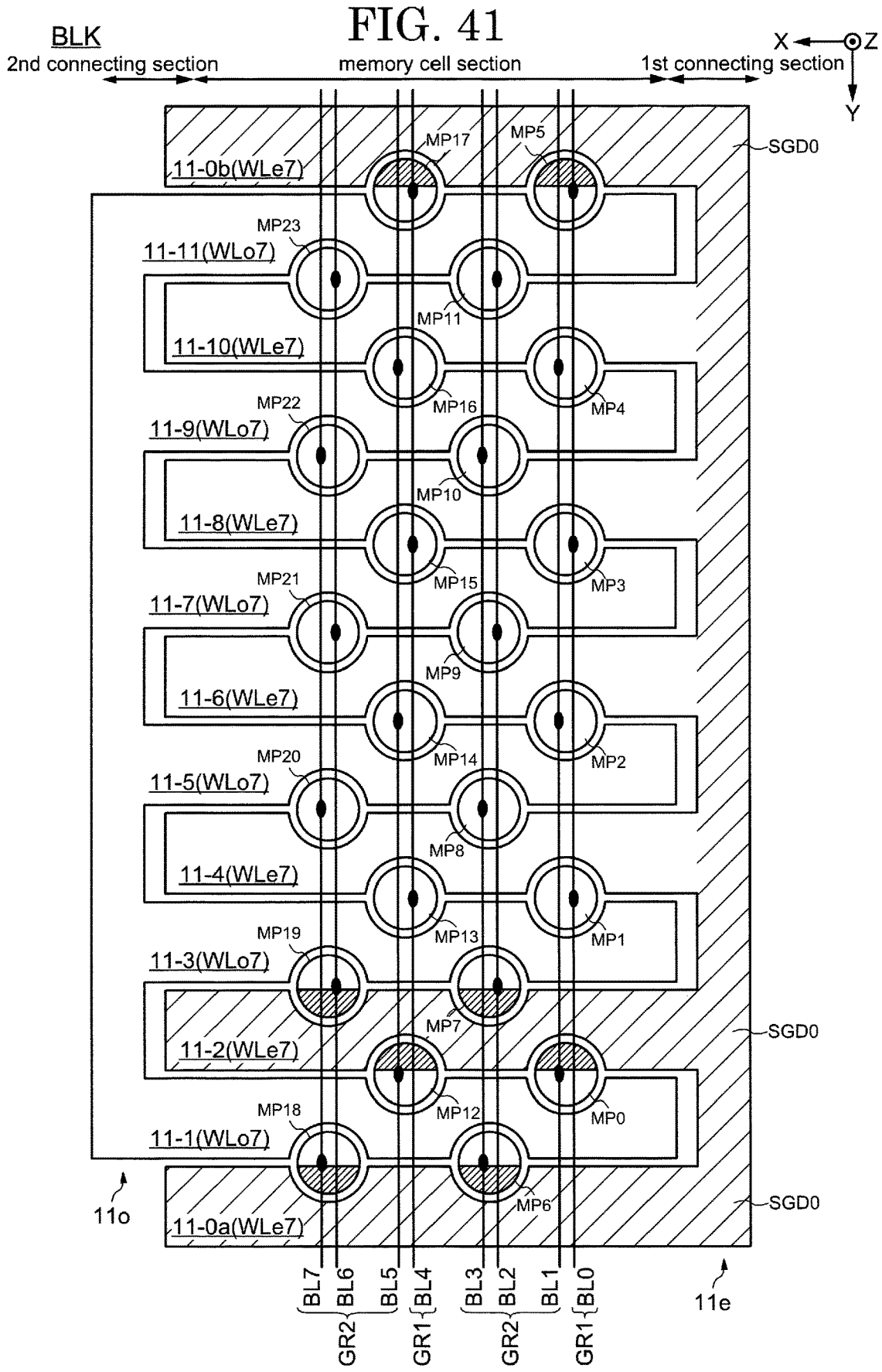
FIG. 41 is a diagram for describing the write operation with reference to the layout of the word line and the memory pillar in the semiconductor memory device according to the third embodiment.

The secondary write operation according to "39" will be described with reference to FIG. 3 and FIG. 41. In the secondary write operation according to "39", the verify operation and the program operation in the secondary write operation are executed on the memory cell transistors MT belonging to the memory string 50o selected by the select gate line SGD0 shown in FIG. 3 and belonging to the word line WLe5, the first group GR1, and the second group GR2 (for example, four bit lines BL0 to BL3).

Specifically, when the select gate line SGD0, the word line WLe5, the first group GR1, and the second group GR2 are selected, the select transistor ST1 facing the wiring layers 10-0c shown in FIG. 3 is turned on or off in accordance with the voltage supplied to the bit lines BL0 to BL7. In FIG. 41, a hatched area of the wiring layer 11e corresponds to the area where the wiring layer 10-0a, 10-0b, 10-0c shown in FIG. 3 is arranged.

When the select gate line SGD0, the word line WLe5, the first group GR1, and the second group GR2 are selected, the select transistor ST1 connected to the select gate line SGD0 corresponding to the wiring layer 10-0c of the wiring layer 11e (see FIG. 3) is selected, and the EP verify operation and the EP program operation are executed on the memory cell transistors MT (the first memory cells) provided on the word line WLe5 sides of each of the memory pillars MP0, MP5 to MP7, MP12, MP17 to MP19. In FIG. 41, the memory cell transistors MT (first memory cells) provided on the respective word line WLe5 sides of the memory pillars MP0, MP5 to MP7, MP12, MP17 to MP19 are shown by narrow hatched lines.

The primary write operation according to "40" will be described with reference to FIG. 3 and FIG. 42. In the primary write operation according to "40", the EP verify operation and the EP program operation are executed on the memory cell transistors MT belonging to the memory string 50o selected by the select gate line SGD3 shown in FIG. 3 and belonging to the word line WLo4, the first group GR1, and the second group GR2 (for example, four bit lines BL0 to BL3).

Specifically, when the select gate line SGD3, the word line WLo4, the first group GR1, and the second group GR2 are selected, the select transistor ST1 facing the wiring layers 10-3a and 10-3b shown in FIG. 3 is turned on or off in accordance with the voltage supplied to the bit line BL0 to BL7. In FIG. 42, a hatched area of the wiring layer 11o corresponds to an area where the wiring layer 10-3a and 10-3b shown in FIG. 3 are arranged.

When the select gate line SGD3, the word line WLo4, the first group GR1, and the second group GR2 are selected, the select transistor ST1 connected to the select gate lines SGD3 corresponding to the wiring layers 10-3a and 10-3b of the wiring layers 11o (see FIG. 3) is selected, and the EP verify operation and the EP program operation are executed on the memory cell transistors MT (the second memory cells) provided on each of the word line WLo7 sides of the memory pillars MP2, MP3, MP8, MP9, MP14, MP15, MP20 and MP21. In FIG. 42, the memory cell transistors MT (the second memory cells) provided on the respective word line WLo4 sides of the memory pillars MP2, MP3, MP8, MP9, MP14, MP15, MP20 and MP21 are indicated by wide hatched lines.

The secondary write operation according to "41" will be described with reference to FIG. 3 and FIG. 43. In the secondary write operation according to "41", the verify operation and the program operation in the secondary write operation are executed on the memory cell transistors MT belonging to the memory string 50o selected by the select gate line SGD2 shown in FIG. 3 and belonging to the word line WLe5, the first group GR1, and the second group GR2 (for example, four bit lines BL0 to BL3).

Specifically, when the select gate line SGD2, the word line WLe5, the first group GR1, and the second group GR2 are selected, the select transistor ST1 facing the wiring layers 10-0c shown in FIG. 3 is turned on or off in accordance with the voltage supplied to the bit lines BL0 to BL7. In FIG. 41, a hatched area of the wiring layer 11e corresponds to an area where the wiring layer 10-2a, 10-2b shown in FIG. 3 is arranged.

When the select gate line SGD2, the word line WLe5, the first group GR1, and the second group GR2 are selected, the select transistor ST1 connected to the select gate line SGD2 corresponding to the wiring layers 10-2a and 10-2b of the wiring layer 11e (see FIG. 3) is selected, and the verify operation and the program operation of the secondary write operation are executed on the memory cell transistors MT (the first memory cells) provided on the word line WLe5 sides of each of the memory pillars MP1, MP2, MP8, MP9, MP13, MP14, MP20 and MP21. In FIG. 43, the memory cell transistors MT (the first memory cells) provided on the respective word line WLe5 sides of the memory pillars MP1, MP2, MP8, MP9, MP13, MP14, MP20 and MP21 are shown by narrow hatched lines.

In the EP verify operation of the primary write operation of the semiconductor memory device 1 according to the third embodiment, an example (an example of the three-layer cutoff) in which the negative voltage (the voltage VNEG) is supplied to the three-layer word lines WLo (for example, WLo3, WLo4 and WLo5) opposed to the word lines WLe (for example, WLe4) in which writing is executed has been described. In the EP verify operation of the primary write operation of the semiconductor memory device 1 according to the third embodiment, the negative voltage (the voltage VNEG) may be supplied to the word lines WLo (for example, WLo4 and WLo5) of two layers opposed to the word lines WLe (for example, WLe4) to be written, as in the case of the two-layer cutoff illustrated in the EP verify operation of the primary write operation of the semiconductor memory device 1 according to the second embodiment. In this case, the order of the primary write operation, the secondary write operation, and the tertiary write operation shown in FIG. 38 is adjusted as appropriate.

Fourth Embodiment

In the semiconductor memory device 1 according to a fourth embodiment, the primary write operation to the memory cell transistor MT belonging to the even-numbered select gate line SGDe, the word lines WLe, the first group GR1, and the second group GR2 (the bit lines BL0 to BL7) and the primary write operation to the memory cell transistor MT belonging to the even-numbered select gate line SGDe, the word lines WLo, the first group GR1, and the second group GR2 (the bit lines BL0 to BL7) are alternately executed. Since other configurations and functions are the same as those of the semiconductor memory device 1 according to the first embodiment, descriptions of the semiconductor memory device 1 according to the fourth embodiment mainly describe differences from the semiconductor memory device 1 according to the first embodiment.
<4-1. Overview of Write Operation>

An example of the primary write operation of the semiconductor memory device 1 according to the fourth embodiment will be described with reference to FIG. 45. In the descriptions of FIG. 45, a description of the same or similar configurations as those of FIG. 1 to FIG. 44 may be omitted.

In the semiconductor memory device 1 according to the fourth embodiment, two memory cell transistors MT included in the same memory pillar MP share channels. In other words, two memory cell transistors MT included in the same memory pillar MP face each other. Writing to the memory cell transistors MT included in the memory strings 50e and 50o belonging to the even-numbered select gate line SGDe, the first group GR1, and the second group GR2 (the bit lines BL0 to BL7) is executed by using this property and selecting the even-numbered select gate line SGDe without selecting the odd-numbered select gate line SGDo. As a result, the write operation can be accelerated.

In the semiconductor memory device 1 according to the fourth embodiment, similar to the semiconductor memory device 1 according to the third embodiment, when focusing on the four bit lines BL0 to BL3, writing to the memory cell transistors MT belonging to the four bit lines BL0 to BL3 is executed at the same timing.

That is, in the semiconductor memory device 1 according to the fourth embodiment, by selecting only the even-numbered select gate line SGDe without selecting the odd-numbered select gate line SGDo, the write operation to the memory cell transistors MT belonging to the word lines WLe and the four bit lines BL0 to BL3 and the write operation to the memory cell transistors MT belonging to the word lines WLo and the four bit lines BL0 to BL3 can be alternately executed. In the fourth embodiment, four bit lines BL0 to BL3 among the first group GR1 and the second group GR2 (the bit lines BL0 to BL7) will be mainly described.
<4-1-1. STEP1>

STEP1 of the memory device 1 according to the fourth embodiment includes STEP1E and STEP1F. STEP1E is an operation in which STEP1A and STEP1C of the semiconductor memory device 1 according to the first embodiment are combined. In STEP1 of the semiconductor memory device 1 according to the fourth embodiment, the EP verify operation and the EP program operation according to STEP1 are set as one set (a thirteenth set), and the thirteenth set is executed N times.

Specifically, in STEP1E of the semiconductor memory device 1 according to the fourth embodiment, the first group GR1 and the second group GR2 are selected (S), and the memory cell transistor MT belonging to the select gate line SGD0, the word lines WLe, the first group GR1, and the second group GR2 are subjected to the EP verify operation and the EP program operation. The word lines WLo are unselected (US), and the EP verify operation and the EP program operation are not executed for the memory cell transistors MT belonging to the word lines WLo. In the EP verify operation, the select gate line SGD0 is applied with the voltage VSGVFY, the select gate lines SGD1 to SGD5 is applied with the voltage VSS, and the predetermined word line WLe is applied with the voltage VPVFY. In the EP program operation, the select gate line SGD0 is applied with the voltage VSG, the select gate lines SGD1 to SGD5 are applied with the voltage VSS, and the predetermined word line WLe is applied with the voltage VPRG. The memory cell transistors MT belonging to the first group GR1, the second group GR2, the select gate line SGD0, and the word lines WLe are the memory cell transistors MT facing the word lines WLe of the memory pillars MP0, MP5 to MP7, MP12, MP17 to MP19.

In STEP1F of the semiconductor memory device 1 according to the fourth embodiment, the word lines WLe according to STEP1E are replaced with the word lines WLo. In STEP1F of the semiconductor memory device 1 according to the fourth embodiment, the EP verify operation and the EP program operation are executed on the memory cell transistors MT belonging to the select gate line SGD0, the word lines WLo, the first group GR1, and the second group GR2. The memory cell transistors MT belonging to the first group GR1, the second group GR2, the select gate line SGD0, and the word lines WLo are the memory cell transistors MT facing the word lines WLe of the memory pillars MP0, MP5 to MP7, MP12, MP17 to MP19.
<4-1-2. STEP2>

STEP2 of the memory device 1 according to the fourth embodiment includes STEP2E and STEP2F. STEP2E is an operation in which STEP2A and STEP1C of the semiconductor memory device 1 according to the first embodiment are combined. In STEP2 of the semiconductor memory device 1 according to the fourth embodiment, the EP verify operation and the EP program operation according to STEP2 are set as one set (a fourteenth set), and the fourteenth set is executed N times.

Specifically, STEP2 of the semiconductor memory device 1 according to the fourth embodiment differs from STEP1 of the semiconductor memory device 1 according to the fourth embodiment in that the select gate line SGD0 is changed to the select gate line SGD2. Here, differences from STEP1 of the semiconductor memory device 1 according to the fourth embodiment will be mainly described. In STEP2E of the semiconductor memory device 1 according to the fourth embodiment, the EP verify operation and the EP program operation are executed on the memory cell transistors MT belonging to the select gate line SGD2, the word lines WLe, the first group GR1, and the second group GR2. The memory cell transistors MT belonging to the first group GR1, the second group GR2, the select gate line SGD2, and the word lines WLe are the memory cell transistors MT facing the word lines WLe of the memory pillars MP1, MP2, MP8, MP9, MP13, MP14, MP20 and MP21.

Specifically, in STEP2F of the semiconductor memory device 1 according to the fourth embodiment, the EP verify operation and the EP program operation are executed on the memory cell transistors MT belonging to the select gate line SGD2, the word lines WLo, the first group GR1, and the second group GR2. The memory cell transistors MT belonging to the first group GR1, the second group GR2, the select gate line SGD2, and the word lines WLo are the memory cell transistors MT facing the word lines WLe of the memory pillars MP1, MP2, MP8, MP9, MP13, MP14, MP20 and MP21.

<4-1-3. STEP3>

STEP3 of the memory device 1 according to the fourth embodiment includes STEP3E and STEP3F. STEP3E is an operation in which STEP3A and STEP3C of the semiconductor memory device 1 according to the first embodiment are combined. In STEP3 of the semiconductor memory device 1 according to the fourth embodiment, the EP verify operation and the EP program operation according to STEP3 are set as one set (a fifteenth set), and the fifteenth set is executed N times.

Specifically, STEP3 of the semiconductor memory device 1 according to the fourth embodiment differs from STEP1 of the semiconductor memory device 1 according to the fourth embodiment in that the select gate line SGD0 is changed to the select gate line SGD4. Here, differences from STEP1 of the semiconductor memory device 1 according to the fourth embodiment will be mainly described. In STEP3E of the semiconductor memory device 1 according to the fourth embodiment, the EP verify operation and the EP program operation are executed on the memory cell transistors MT belonging to the select gate line SGD4, the words line WLe, the first group GR1, and the second group GR2. The memory cell transistors MT belonging to the first group GR1, the second group GR2, the select gate line SGD4, and the word lines WLe are the memory cell transistors MT facing the word lines WLe of the memory pillars MP3, MP4, MP10, MP11, MP15, MP16, MP22 and MP23.

In STEP3F of the semiconductor memory device 1 according to the fourth embodiment, the EP verify operation and the EP program operation are executed on the memory cell transistors MT belonging to the select gate line SGD4, the word lines WLo, the first group GR1, and the second group GR2. The memory cell transistors MT belonging to the first group GR1, the second group GR2, the select gate line SGD4, and the word lines WLo are the memory cell transistors MT facing the word lines WLe of the memory pillars MP3, MP4, MP10, MP11, MP15, MP16, MP22 and MP23.

<4-2. Example of Write Operation Order>

FIG. 46 is a diagram illustrating a write order of the semiconductor memory device 1 according to the fourth embodiment. The same as FIG. 29 in which the write order of the semiconductor memory device 1 according to the first embodiment is shown, the numerical values described in the items of FIG. 46 indicate the order in which the write operation is executed. Note that the write order of the semiconductor memory device 1 according to the fourth embodiment is the same as the write order of the semiconductor memory device 1 according to the first embodiment. In the description of the write order of the semiconductor memory device 1 according to the fourth embodiment, mainly, differences from the write order of the semiconductor memory device 1 according to the first embodiment will be described.

First, operations of "1" to "5" will be described with reference to FIG. 46. "1" indicates the order of operations in which STEP1 described in "4-1-1. STEP1" is executed, "2" indicates the order of operations in which STEP2 described in "4-1-2. STEP2" is executed, and "3" indicates the order of operations in which STEP3 described in "4-1-3. STEP3" is executed.

At "1", the select gate lines SGD1 and SGD5 are supplied with the voltage VSS and are not selected. However, when the select gate line SGD0 is supplied with the voltages VSGVFY or VSG and selected, the write operation to the memory cell transistor MT belonging to the word line WLe7 and the four bit lines BL0 to BL3 and the write operation to the memory cell transistor MT belonging to the word line WLo7 and the four bit lines BL0 to BL3 can be alternately executed.

At "2", similar to "1", the select gate lines SGD1 and SGD3 are supplied with the voltage VSS and are not selected. However, when the select gate line SGD2 is supplied with the voltages VSGVFY or VSG and selected, the write operation to the memory cell transistor MT belonging to the word line WLe7 and the four bit lines BL0 to BL3 and the write operation to the memory cell transistor MT belonging to the word line WLo7 and the four bit lines BL0 to BL3 can be alternately executed.

At "3", similar to "1", the select gate lines SGD3 and SGD5 are supplied with the voltage VSS and are not selected. However, when the select gate line SGD4 is supplied with the voltages VSGVFY or VSG and selected, the write operation to the memory cell transistor MT belonging to the word line WLe7 and the four bit lines BL0 to BL3 and the write operation to the memory cell transistor MT belonging to the word line WLo7 and the four bit lines BL0 to BL3 can be alternately executed.

The primary write operations for the word line WL7 are executed by "1" to "3". In "4" following "3", an operation similar to "1" is executed on the word line WL6 that differs from the word line WL7 executed on "1". In "5" following "4", the secondary write operation (the verify operation and the program operation in the secondary write operation) is executed on the memory cell transistors belonging to the select gate line SGD0 and the word line WL7.

Operations after "6" of the semiconductor memory device 1 according to the fourth embodiment are the same as those of "1" to "5" of the semiconductor memory device 1 according to the fourth embodiment described above and the semiconductor memory device 1 according to the first embodiment, and thus description thereof is omitted.

<4-3. Example of Write Operation>

Figure 47:
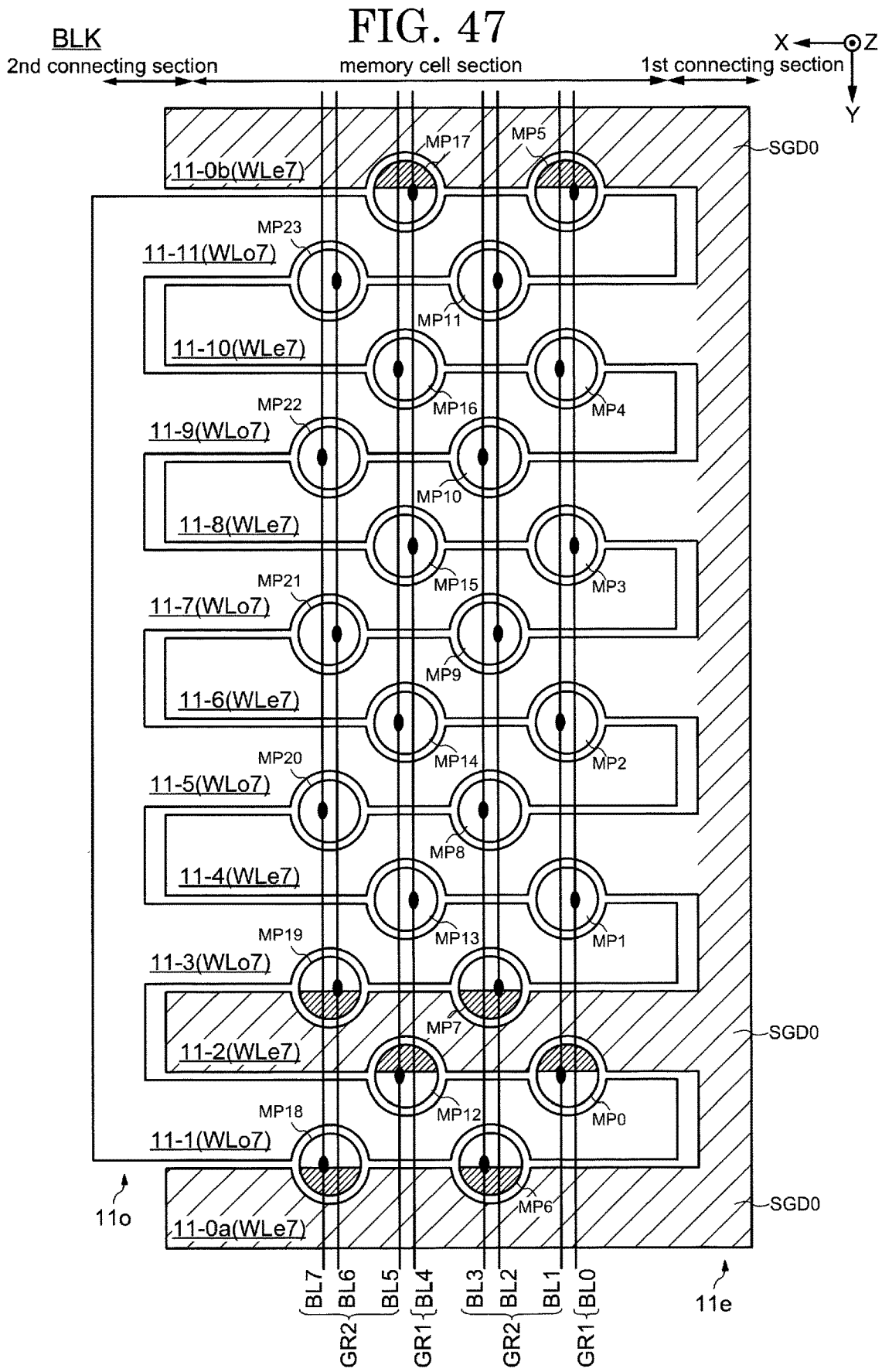
FIG. 47 is a diagram for describing the write operation with reference to a layout of a word line and a memory pillar in the semiconductor memory device according to the fourth embodiment.
Figure 50:
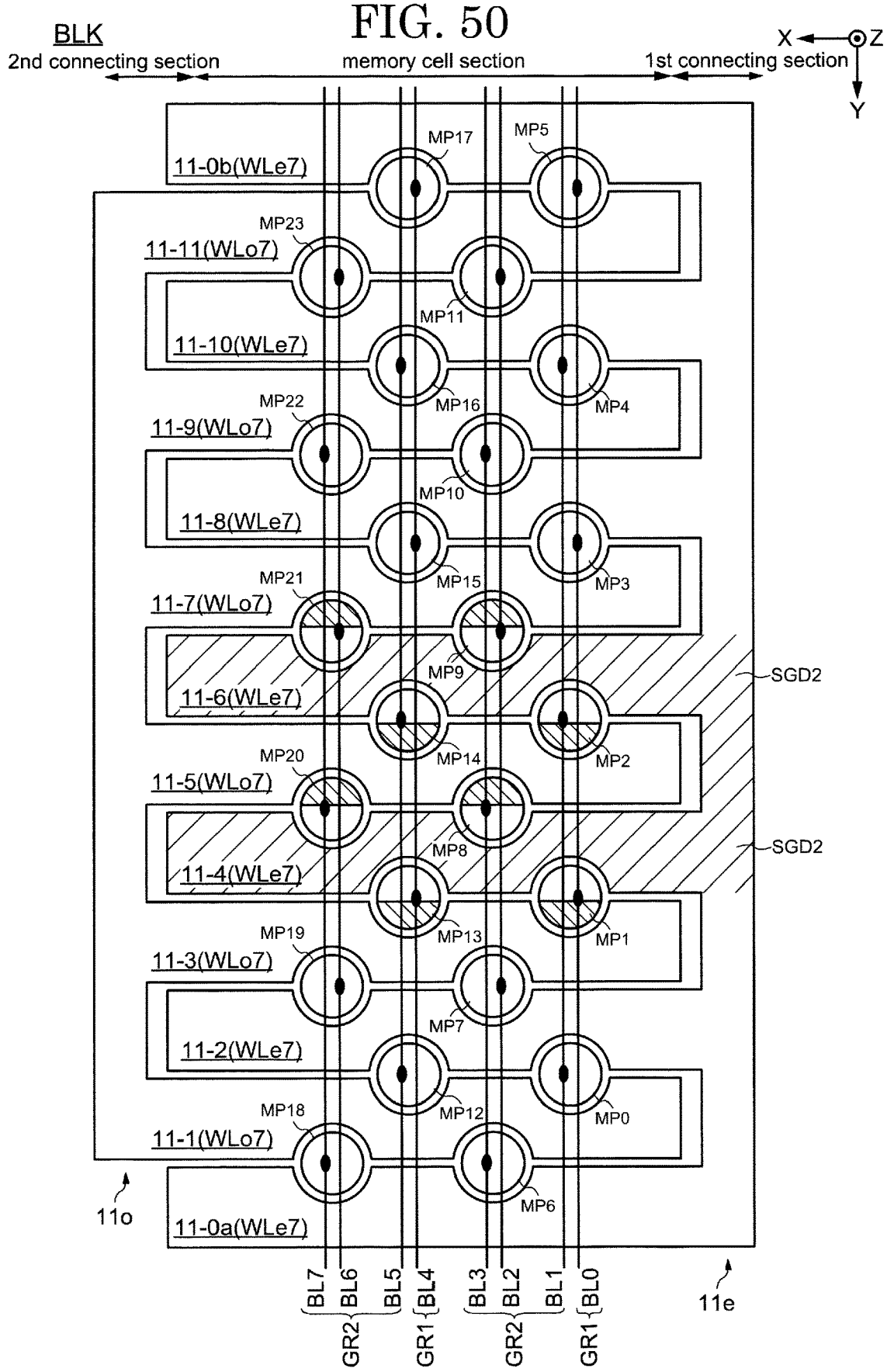
FIG. 50 is a diagram for describing the write operation with reference to the layout of the word line and the memory pillar in the semiconductor memory device according to the fourth embodiment.
Figure 51:
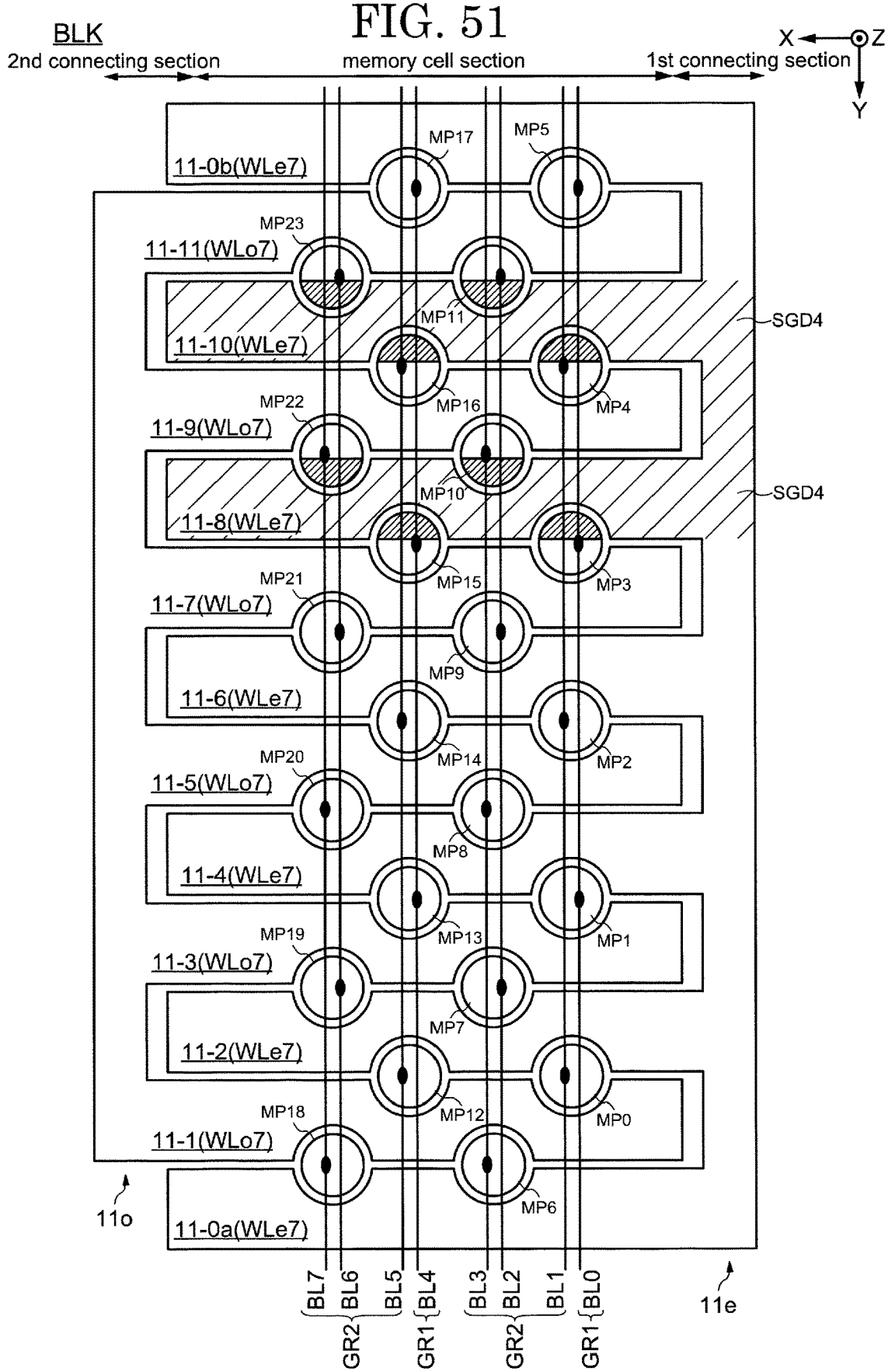
FIG. 51 is a diagram for describing the write operation with reference to the layout of the word line and the memory pillar in the semiconductor memory device according to the fourth embodiment.
Figure 52:
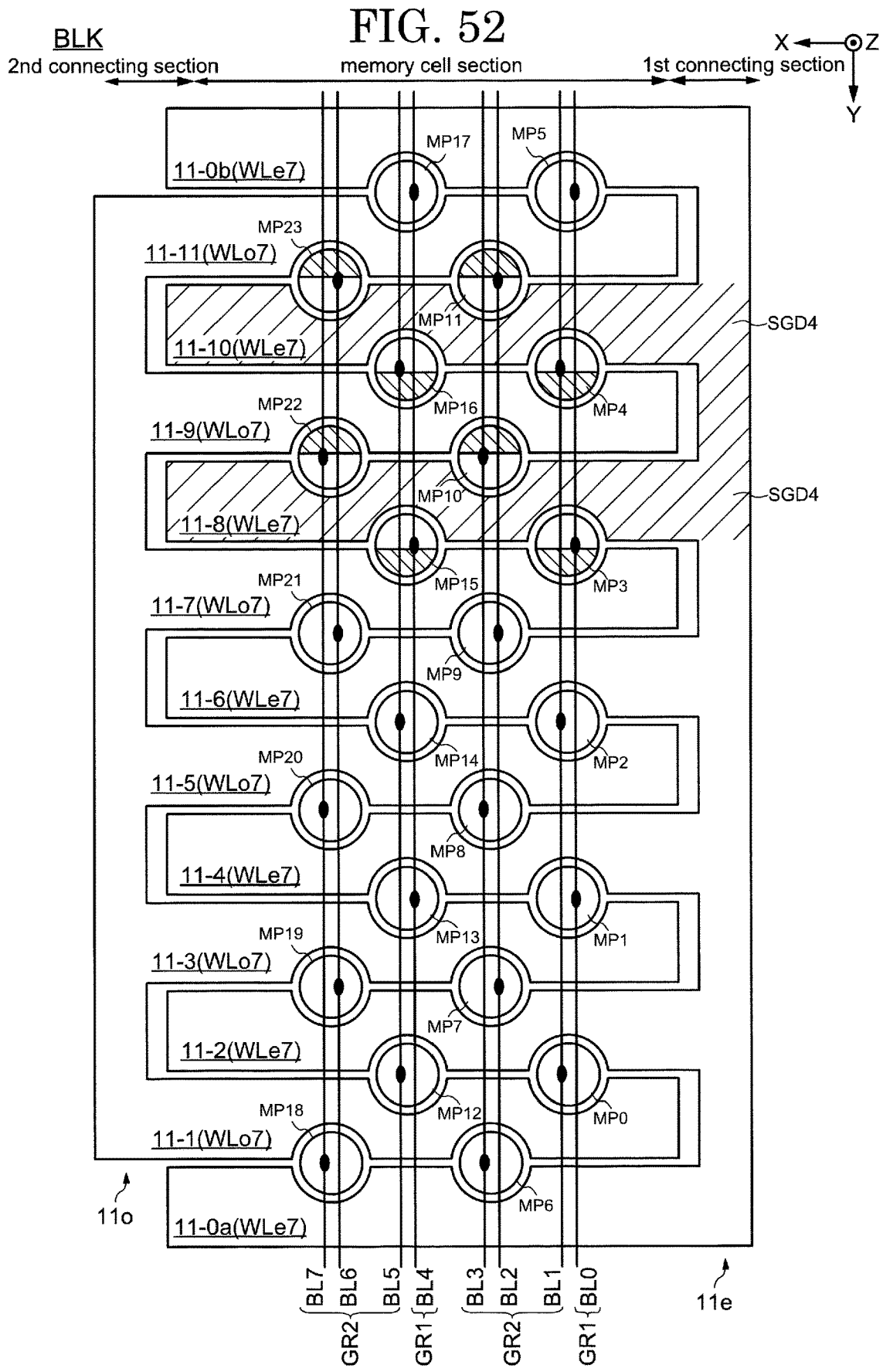
FIG. 52 is a diagram for describing the write operation with reference to the layout of the word line and the memory pillar in the semiconductor memory device according to the fourth embodiment.

With reference to FIG. 3, FIG. 47, and FIG. 52, STEP1 and STEP1F of the primary write operation, and STEP2 (STEP2E, and STEP2F), and STEP3 (STEP3E and STEP3F) according to the fourth embodiment will be described. FIG. 47 to FIG. 52 are diagrams for describing the write operation with reference to the layout of the word lines and the memory pillars of the semiconductor memory device 1 according to the fourth embodiment. In the descriptions of FIG. 47 to FIG. 52, the same configurations as that described in "1-2-2-1. Overview of Primary Write Operation" can be used. In the description of FIG. 47 to FIG. 52, the description of the same or similar configurations as those of FIG. 1 to FIG. 46 may be omitted.

STEP1E will be described with reference to FIG. 3 and FIG. 47. In STEP1E, the memory cell transistor MT belonging to the memory string 50*o* selected by the select gate line SGD0 shown in FIG. 3 and belonging to the word line WLe7, the first group GR1, and the second group GR2 (for example, four bit lines BL0 to BL3) is subjected to the EP verify operation and the EP program operation.

Specifically, when the select gate line SGD0, the word line WLe7, the first group GR1, and the second group GR2 are selected, the select transistor ST1 facing the wiring layers 10-0*c* shown in FIG. 3 is turned on or off in accordance with the voltage supplied to the bit lines BL0 to BL7. In FIG. 47, a hatched area of the wiring layer 11*e* corresponds to the area where the wiring layer 10-0*a*, 10-0*b*, 10-0*c* shown in FIG. 3 is arranged.

When the select gate line SGD0, the word line WLe7, the first group GR1, and the second group GR2 are selected, the select transistor ST1 connected to the select gate line SGD0 corresponding to the wiring layer 10-0*c* of the wiring layer 11*e* (see FIG. 3) is selected, and the EP verify operation and the EP program operation are executed on the memory cell transistors MT (the first memory cells) provided on the word line WLe7 sides of each of the memory pillars MP0, MP5 to MP7, MP12, MP17 to MP19. In FIG. 47, the memory cell transistors MT (the first memory cells) provided on the respective word line WLe7 sides of the memory pillars MP0, MP5 to MP7, MP12, MP17 to MP19 are shown by narrow hatched lines.

Figure 48:
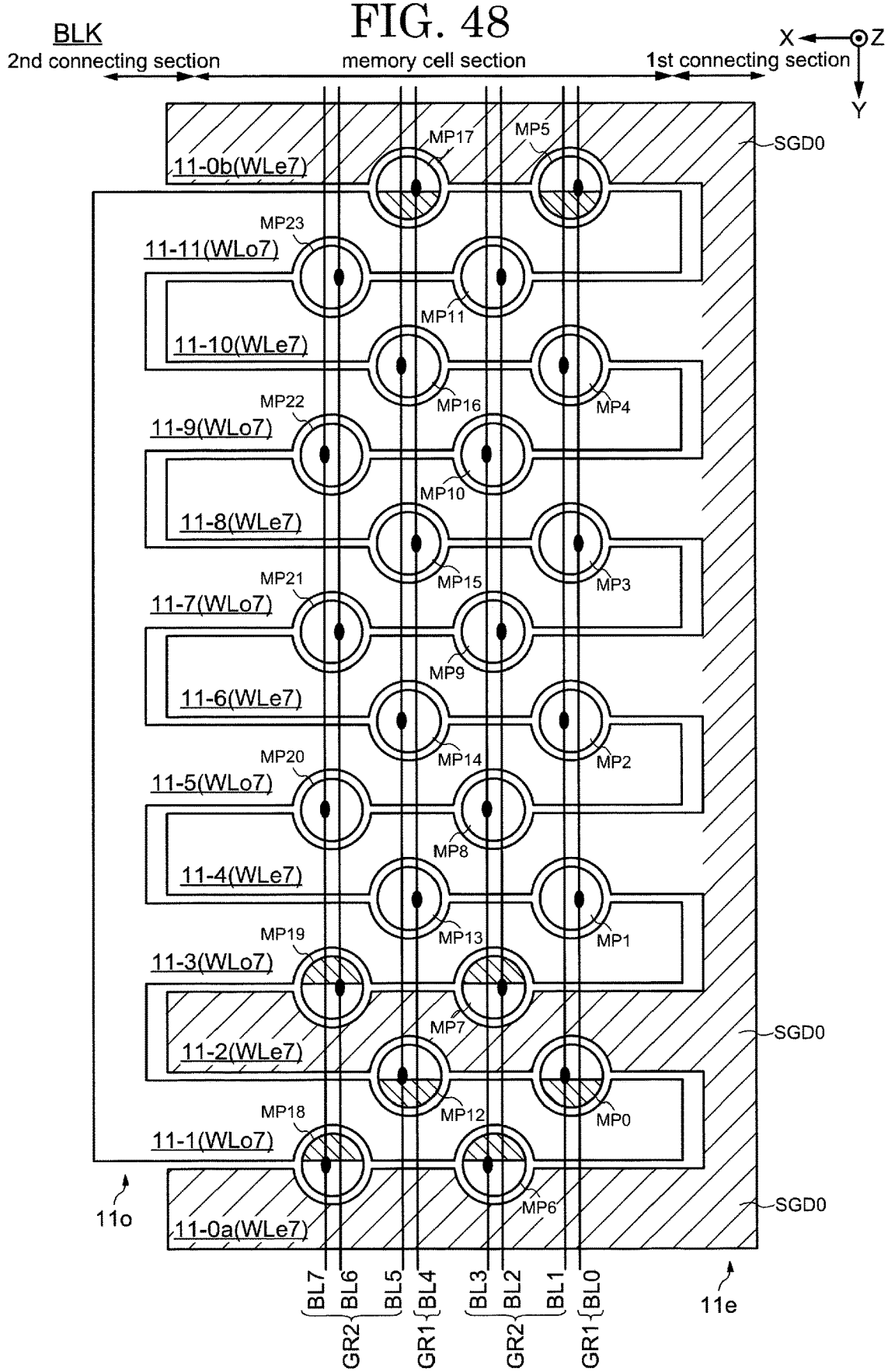
FIG. 48 is a diagram for describing the write operation with reference to the layout of the word line and the memory pillar in the semiconductor memory device according to the fourth embodiment.

STEP1F will be described with reference to FIG. 3 and FIG. 48. The configuration of STEP1F is the same as the configuration of STEP1E except that the word line WLe7 is replaced with the word line WLo7. Here, differences from the configuration of STEP1E described with reference to FIG. 3 and FIG. 47 will be mainly described.

In STEP1F, when the select gate line SGD0, the word line WLo7, the first group GR1, and the second group GR2 are selected, the select transistor ST1 connected to the select gate line SGD0 corresponding to the wiring layer 10-0*c* of the wiring layer 11*e* (see FIG. 3) is selected, and the EP verify operation and the EP program operation are executed on the memory cell transistors MT (the second memory cells) provided on each of the word line WLo7 sides of the memory pillars MP0, MP5 to MP7, MP12, MP17 to MP19. In FIG. 48, the memory cell transistors MT (the second memory cells) provided on the respective word lines WLo7 sides of the memory pillars MP0, MP5 to MP7, MP12, MP17 to MP19 are indicated by wide hatched lines.

Figure 49:
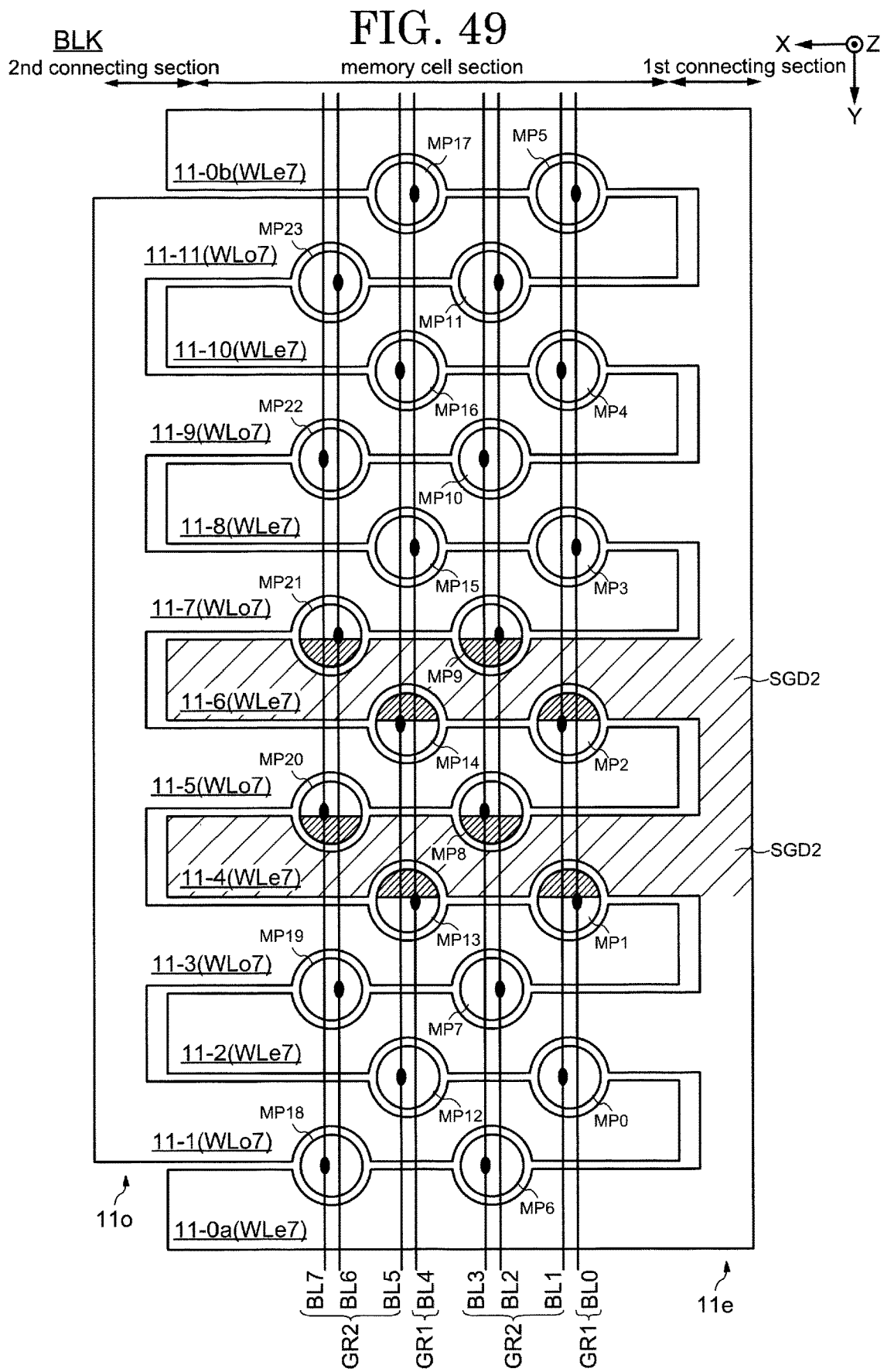
FIG. 49 is a diagram for describing the write operation with reference to the layout of the word line and the memory pillar in the semiconductor memory device according to the fourth embodiment.

STEP2E will be described with reference to FIG. 3 and FIG. 49. In STEP2E, the memory cell transistor MT belonging to the memory string 50*o* selected by the select gate line SGD2 shown in FIG. 3 and belonging to the word line WLe7, the first group GR1, and the second group GR2 (for example, four bit lines BL0 to BL3) is subjected to the EP verify operation and the EP program operation.

Specifically, when the select gate line SGD2, the word line WLe7, the first group GR1, and the second group GR2 are selected, the select transistor ST1 facing the wiring layers 10-2*c* shown in FIG. 3 is turned on or off in accordance with the voltage supplied to the bit line BL0 to BL7. In FIG. 41, a hatched area of the wiring layer 11*e* corresponds to the area where the wiring layer 10-2*a*, 10-2*b* shown in FIG. 3 is arranged.

When the select gate line SGD2, the word line WLe7, the first group GR1, and the second group GR2 are selected, the select transistor ST1 connected to the select gate lines SGD2 corresponding to the wiring layers 10-2*a* and 10-2*b* of the wiring layers 11*e* (see FIG. 3) is selected, and the EP verify operation and the EP program operation are executed on the memory cell transistors MT (the first memory cells) provided on each of the word line WLe7 sides of the memory pillars MP1, MP2, MP8, MP9, MP13, MP14, MP20 and MP21. In FIG. 49, the memory cell transistors MT (the first memory cells) provided on the respective word line WLe7 sides of the memory pillars MP1, MP2, MP8, MP9, MP13, MP14, MP20 and MP21 are shown by narrow hatched lines.

STEP2F will be described with reference to FIG. 3 and FIG. 50. A configuration of STEP2F is the same as the configuration of STEP2E except that the word line WLe7 is replaced with the word line WLo7. Here, differences from the configuration of STEP2E described with reference to FIG. 3 and FIG. 49 will be mainly described.

In STEP2F, when the select gate line SGD2, the word line WLo7, the first group GR1, and the second group GR2 are selected, the select transistor ST1 connected to the select gate line SGD2 corresponding to the wiring layer 10-2*a* and 10-2*b* of the wiring layer 11*e* (see FIG. 3) is selected, and the EP verify operation and the EP program operation are executed on the memory cell transistors MT (the second memory cells) provided on each of the word line WLo7 sides of the memory pillars MP1, MP2, MP8, MP9, MP13, MP14, MP20 and MP21. In FIG. 50, the memory cell transistors MT (the second memory cells) provided on the respective word line WLo7 sides of the memory pillars MP1, MP2, MP8, MP9, MP13, MP14, MP20 and MP21 are indicated by wide hatched lines.

STEP3E will be described with reference to FIG. 3 and FIG. 51. In STEP3E, the memory cell transistor MT belonging to the memory string 50*o* selected by the select gate line SGD4 shown in FIG. 3 and belonging to the word line WLe7, the first group GR1, and the second group GR2 (for example, four bit lines BL0 to BL3) is subjected to the EP verify operation and the EP program operation.

Specifically, when the select gate line SGD4, the word line WLe7, the first group GR1, and the second group GR2 are selected, the select transistor ST1 facing the wiring layers 10-4*a* and 10-4*b* shown in FIG. 3 is turned on or off in accordance with the voltage supplied to the bit lines BL0 to BL7. In FIG. 51, a hatched area of the wiring layer 11*e* corresponds to an area where the wiring layer 10-4*a* and 10-4*b* shown in FIG. 3 are arranged.

When the select gate line SGD4, the word line WLe7, the first group GR1, and the second group GR2 are selected, the select transistor ST1 connected to the select gate lines SGD4 corresponding to the wiring layers 10-4*a* and 10-4*b* of the wiring layers 11*e* (see FIG. 3) is selected, and the EP verify operation and the EP program operation are executed on the memory cell transistors MT (the first memory cells) provided on each of the word line WLe7 sides of the memory pillars MP3, MP4, MP10, MP11, MP15, MP16, MP22 and MP23. In FIG. 51, the memory cell transistors MT (the first memory cells) provided on the respective word line WLe7 sides of the memory pillars MP3, MP4, MP10, MP11, MP15, MP16, MP22 and MP23 are shown by narrow hatched lines.

STEP3F will be described with reference to FIG. 3 and FIG. 52. The configuration of STEP3F is the same as the configuration of STEP3E except that the word line WLe7 is replaced with the word line WLo7. Here, differences from the configuration of STEP3E described with reference to FIG. 3 and FIG. 51 will be mainly described.

In STEP3F, when the select gate line SGD4, the word line WLo7, the first group GR1, and the second group GR2 are selected, by selecting the select transistor ST1 connected to the select gate line SGD4 corresponding to the wiring layer 10-4*a*, 10-4*b* of the wiring layer 11*e* (see FIG. 3) is selected, and the EP verify operation and the EP program operation are executed on the memory cell transistors MT (the second memory cells) provided on each of the word line WLo7 sides of the memory pillars MP3, MP4, MP10, MP11, MP15, MP16, MP22 and MP23. In FIG. 52, the memory cell transistors MT (the second memory cells) provided on the respective word line WLo7 sides of the memory pillars MP3, MP4, MP10, MP11, MP15, MP16, MP22 and MP23 are indicated by wide hatched lines.

<4-4. Example of Write Operation Sequence>

FIG. 53 is a diagram illustrating a write sequence of the semiconductor memory device 1 according to the fourth embodiment. In the description of FIG. 53, description of the same or similar configurations as those of FIG. 1 to FIG. 52 may be omitted.

The write sequence of the semiconductor memory device 1 according to the fourth embodiment will be described with reference to FIG. 53. In the primary write operation, one execution of a fifth EP verify operation and a fifth EP program operation to the memory cell transistor MT belonging to the first group GR1 and the second group GR2 without performing pagination for the select gate line SGDn and the word lines WLe, and one execution of a sixth EP verify operation and a sixth EP program operation to the memory cell transistor MT belonging to the first group GR1 and the second group GR2 without performing a pagination for the select gate line SGDn and the word lines WLo as a set are executed N times. That is, in the semiconductor memory device 1 according to the fourth embodiment, the EP verify operation and the EP program operation for the memory cell transistors MT belonging to the word lines WLe and the EP verify operation and the EP program operation for the memory cell transistors MT belonging to the word lines WLo are executed by selecting the same select gate line SGDn without performing paginations. In the semiconductor memory device 1 according to the fourth embodiment, at least this point is different from the semiconductor memory device 1 according to the first embodiment.

The fifth EP verify operation and the fifth EP program operation are, for example, STEP1E shown in FIG. 45, and the sixth EP verify operation and the sixth EP program operation are, for example, STEP1F shown in FIG. 45. The select gate line SGDn is, for example, SGD0.

In the secondary write operation, the verify operation and the program operation related to the secondary write operation are executed N times for the memory cell transistors MT belonging to the select gate line SGDn, the word lines WLe, the first group GR1, and the second group GR2. In the verify operation and the program operation related to the secondary write operation, for example, the select gate line SGDn is SGD0 and corresponds to "5" of the secondary write operation illustrated in FIG. 46.

In the tertiary write operation, the verify operation and the program operation related to the tertiary write operation are executed N times for the memory cell transistors MT belonging to the select gate line SGDn, the word lines WLe, the first group GR1, and the second group GR2. In the verify operation and the program operation related to the tertiary write operation, for example, the select gate line SGDn is SGD0 and corresponds to "22" of the tertiary write operation illustrated in FIG. 45.

Note that, in the EP verify operation of the primary write operation of the semiconductor memory device 1 according to the fourth embodiment, the negative voltage (the voltage VNEG) may be supplied to the word lines WLo (for example, WLo3, WLo4, WLo5) of the three layers opposed to the word lines WLe (for example, WLe4) to be written, similar to the three-layer cutoff example shown in the EP verify operation of the primary write operation of the semiconductor memory device 1 according to the first embodiment. In addition, in the EP verify operation of the primary write operation of the semiconductor memory device 1 according to the third embodiment, the negative voltage (the voltage VNEG) may be supplied to the word lines WLo (for example, WLo4, WLo5) of two layers opposed to the word lines WLe (for example, WLe4) to be written, similar to the case of the two-layer cutoff illustrated in the EP verify operation of the primary write operation of the semiconductor memory device 1 according to the second embodiment.

In this case, the order of the primary write operation, the secondary write operation, and the tertiary write operation shown in FIG. 46 is adjusted as appropriate.

5 Embodiment

The semiconductor memory device 1 according to a fifth embodiment differs from the primary write operation of the semiconductor memory device 1 according to the third embodiment in that the execution of the respective steps of STEP1 to STEP6 of the primary write operation of the semiconductor memory device 1 according to the third embodiment is set as one set, and executed N times. Specifically, in the semiconductor memory device 1 according to the fifth embodiment, each of STEP1 to STEP6 of the primary write operation of the semiconductor memory device 1 according to the third embodiment corresponds to STEP1E, STEP2E, STEP3E, STEP4E, STEP5E, and STEP6E, and STEP 1E, STEP2E, STEP3E, STEP4E, STEP5E, and STEP6E are executed in this order. Since the operations in STEP1E to STEP6E of the primary write operation of the semiconductor memory device 1 according to the fifth embodiment are the same as STEP1 to STEP6 of the primary write operation of the semiconductor memory device 1 according to the third embodiment, explanations of STEP1E to STEP6E of the primary write operation of the semiconductor memory device 1 according to the fifth embodiment are omitted. Descriptions of the semiconductor memory device 1 according to the fifth embodiment mainly describe differences from the semiconductor memory devices 1 according to the first to fourth embodiments.

<5-1. Overview of Write Operation>

An example of the primary write operation of the semiconductor memory device 1 according to the fifth embodiment will be described with reference to FIG. 54. In the descriptions of FIG. 54, the descriptions of the same or similar configurations as those of FIG. 1 to FIG. 53 may be omitted.

As shown in FIG. 54, in the semiconductor memory device 1 according to the fifth embodiment, the execution of each step from STEP1E to STEP6E is set once as one set (a sixteenth set), and the sixteenth set is executed N times.

As shown in FIG. 54, in the primary write operation of the semiconductor memory device 1 according to the fifth embodiment, the primary write operation (STEP4E to STEP6E) is executed on the memory cell transistors MT belonging to the word lines WLo, the first group GR1, and the second group GR2 after the primary write operation (STEP1E to STEP3E) is executed on the memory cell transistors MT belonging to the word lines WLe, the first group GR1, and the second group GR2. That is, the write operation of the semiconductor memory device 1 according to the fifth embodiment may alternate between collectively executing the primary write operation for the memory cell transistors MT belonging to the even-numbered word lines WLe, and collectively executing the primary write operation for the memory cell transistors MT belonging to the odd-numbered word lines WLo without the page division being executed. In the semiconductor memory device 1 according to the fifth embodiment, it is possible to operate at a higher speed than the case where the primary write operation of the memory cell transistors belonging to the even-numbered word lines WLe or the odd-numbered word lines WLo is not collectively executed without executing page division.

<5-2. Example of Write Operation Order>

FIG. 55 is a diagram illustrating a write order of the semiconductor memory device 1 according to the fifth embodiment. The same as FIG. 29 in which the write order of the semiconductor memory device 1 according to the first embodiment is shown, the numerical values described in the items of FIG. 55 indicate the order in which the write operation is executed. That is, the write operation is executed in the order of "1"→"2"→"3"→"4"→"5". As in FIG. 29, the operation in the order of the parentheses in FIG. 55 is the same as the operation in the order without the parentheses.

First, operations of "1" to "8" will be described with reference to FIG. 55. "1" and "2" denote an order of an operation in which STEP1E to STEP6E (the primary write operation) described in "5-1. Overview of write operation" corresponding to STEP1 to STEP6 (the primary write operation) described in "3-1-1. STEP1", "3-1-2. STEP2", "3-1-3. STEP3", "3-1-4. STEP4", "3-1-5. STEP5", and "3-1-6. STEP6" are executed, and "3" to "8" denote an order of the operation in which the secondary write operation is executed.

In "1", the select gate lines SGD0, SGD2 and SGD4 are supplied with the voltage VSGVFY or VSG in this order and selected, so that the select gate line SGD1, the select gate line SGD3, and the select gate line SGD5 are supplied with the voltage VSGVFY or VSG in this order and selected after the primary write operation (the EP verify operation and the EP program operation) to the memory cell transistors MT belonging to the word line WLo7 and the four bit lines BL0 to BL3 is executed, and then the primary write operation (the EP verify operation and the EP program operation) to the memory cell transistors MT belonging to the word line WLo7 and the four bit lines BL0 to BL3 is executed (the sixteenth set) N times. By "1", the primary write operation to the memory cell transistors MT belonging to the word line WL7 is completed.

In "2", an operation similar to "1" is executed on the memory cell transistors MT belonging to the word line WLe6 and the word line WLo6. The primary write operation to the memory cell transistors MT belonging to the word line WL6 is completed by "2".

In "3", the secondary write operation (the verify operation and the program operation related to the secondary write operation) to the memory cell transistors MT belonging to the select gate line SGD0, the word line WLe7, and the four bit lines BL0 to BL3 and the secondary write operation (the verify operation and the program operation related to the secondary write operation) to the memory cell transistors MT belonging to the select gate line SGD0, the word line WLe7, and the four bit lines BL0 to BL3 are executed.

In "4", an operation in which the select gate line SGD0 of "3" is replaced with the select gate line SGD2 is executed. In "5", an operation in which the select gate line SGD0 of "3" is replaced with the select gate line SGD4 is executed. In "6", an operation in which the select gate line SGD0 of "3" is replaced with the select gate line SGD1 is executed. In "7", an operation in which the select gate line SGD0 of "3" is replaced with the select gate line SGD3 is executed. In "8", an operation in which the select gate line SGD0 of "3" is replaced with the select gate line SGD5 is executed. The secondary write operation to the memory cell transistors MT belonging to the word line WL7 is completed by "3" to "8".

In the fifth embodiment, after the primary write operation is executed on the memory cell transistors MT belonging to the word lines (for example, WL6) below the desired word line (for example, WL7), the secondary write operation is executed on the memory cell transistor MT belonging to the desired word line.

Next, the primary write operation will be described. In "9", the same operation as "1" is executed for the word line WL5 which is different from the word line WL7. In "22", the same operation as "9" is executed for the word line WL4 which is different from the word line WL5. In "35", the same operation as "9" is executed for the word line WL3 which is different from the word line WL5. Similar to the primary write operation for the word lines WL5 to WL3, the primary write operation is also executed for the word lines WL2 to WL0.

Next, the secondary write operation will be described. Similar to "3", "6", "4", "7", "5", and "8", in "10", "13", "11", "14", "12", and "15", the secondary write operation is executed on the memory cell transistors MT belonging to the select gate lines SGD (SGD0 to SGD5) in the respective operations for the word line WL6. Similar to "10", "13", "11", "14", "12", and "15", in "23", "26", "24", "27", "25", and "28", the secondary write operation is executed on the memory cell transistors MT belonging to select gate lines SGD (SGD0 to SGD5) in the respective operations for the word line WL5. Similar to "10", "13", "11", "14", "12", and "15", in "36", "39", "37", "40", "38", and "41", the secondary write operation is executed on the memory cell transistors MT belonging to the select gate lines SGD (SGD0 to SGD5) in the respective operations for the word line WL4. Similar to the secondary write operation for the word lines WL6 to WL4, the secondary write operation is also executed for the word lines WL3 to WL0.

Next, the order of the tertiary write operation (the verify operation and the program operation of the tertiary write operation) will be described. The tertiary write operation of the desired word line is executed after the secondary write operation of the desired word line is completed and the secondary write operation of the lower layer of the desired word line is completed. Specifically, after the secondary write operations ("3", "6", "4", "7", "5", "8", and "9") of the memory cell transistors MT belonging to the word line WL7 are completed and the secondary write operations ("10", "13", "11", "14", "12", and "15") of the memory cell transistors MT belonging to the word line WL6 which are the lower layers of the word line WL7 are completed, the tertiary write operations ("16", "19", "17", "20", "18", and "21") of the memory cell transistors MT belonging to the word line WL7 are executed. Similarly, in "29", "32", "30", "33", "31", and "34", the tertiary write operation is executed on the memory cell transistors MT belonging to the word line WL6 and the select gate lines SGD (SGD0 to SGD5) in the respective operations. In "42", "45", "43", "46", "44", and "47", the tertiary write operation is executed on the memory cell transistors MT belonging to the word line WL5 and the select gate lines SGD (SGD0 to SGD5) in each operation. Similar to the tertiary write operation for the word lines WL7 to WL5, the tertiary write operation is also executed for the word lines WL4 to WL0.

Sixth Embodiment

Figure 56:
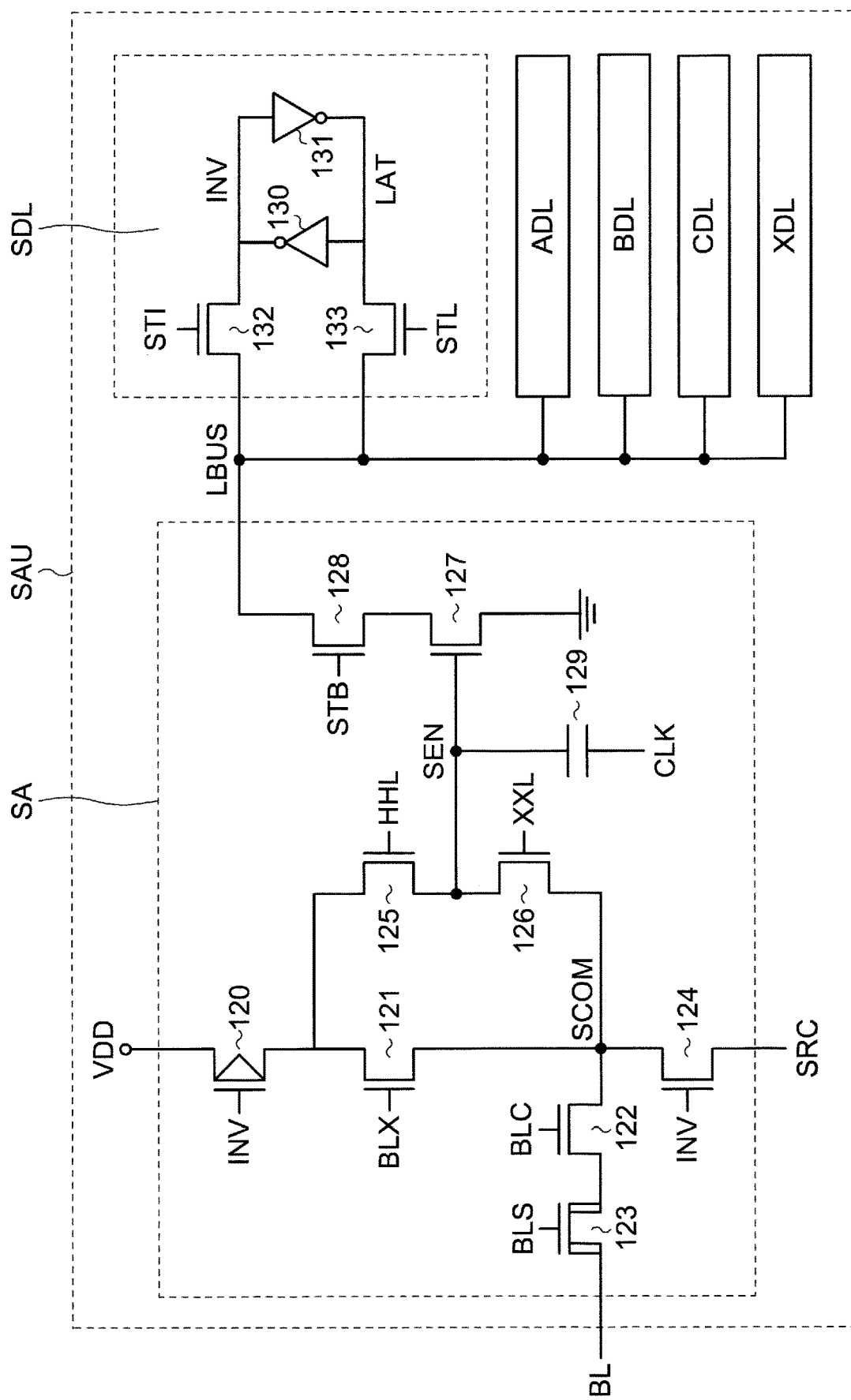
FIG. 56 is a circuit diagram illustrating an example of a circuit configuration of a sense amplifier unit according to a sixth embodiment.

In a sixth embodiment, an example of the sense amplifier module 70 described in "1-1-2. Configuration of Semiconductor Memory Device" will be described in detail. The sense amplifier module 70 includes a plurality of sense amplifier units SAU each associated with the bit lines BL0 to BL (L−1). FIG. 56 illustrates one example of the circuit of one sense amplifier unit SAU. In the descriptions of the sense amplifier unit SAU, descriptions of the same or similar configurations as those in FIG. 1 to FIG. 55 may be omitted.

For example, the sense amplifier unit SAU can temporarily store the data corresponding to the threshold voltage read out from the corresponding bit lines BL. In addition, the sense amplifier unit SAU can execute a logical operation using temporarily stored data. The semiconductor memory device 1 can execute the read operation and the write operation using the sense amplifier unit SAU.

As illustrated in FIG. 56, the sense amplifier unit SAU includes a sense amplifier unit SA, and latching circuits SDL, ADL, BDL, CDL, and XDL. The sense amplifier unit SA, the latch circuits SDL, ADL, BDL, CDL, and XDL are connected by a bus LBUS so as to be able to transmit and receive data to and from each other. The sense amplifier unit SA is connected between a power supply line and a node SRC. The node SRC is supplied with a voltage smaller than the voltage supplied to the power line. The power supply line is a voltage supply line that supplies a high-level (High Level) voltage to the sense amplifier unit SA. The node SRC is a node that supplies a low level (Low Level) voltage to the sense amplifier unit SA. The sense amplifier unit SA operates by supplying the voltage to the power supply line and the node SRC. The power supply line and the node SRC may be configured to supply voltages to elements other than the sense amplifier unit SA in the sense amplifier unit SAU. The high level voltage is, for example, the voltage VDD, and the low level voltage is, for example, the voltage VSS.

For example, in the read operation, the sense amplifier unit SA senses the read data DAT (the threshold voltage) read to the corresponding bit line BL, and determines whether the data corresponding to the threshold voltage is "0" or "1". The sense amplifier unit SA includes, for example, a p-channel MOS transistor 120, n-channel MOS transistors 121 to 128, and a capacitor 129.

For example, when the read data DAT is data read in response to the EP verify operation, the sense amplifier unit SA senses the read data DAT and determines whether the threshold voltage is "0" or "1". For example, when the read data DAT is "0", it is determined that the desired threshold voltage has been reached, and the sense amplifier unit SA determines that the read data DAT has been "written" and temporarily holds the determination result that the read data has been "written" in, for example, the latch circuits SDL, ADL, BDL, CDL and XDL. Further, for example, when the read data DAT is "1", it is determined that the desired threshold voltage has not been reached, and the sense amplifier unit SA determines that the read data DAT is "not written" and temporarily holds the determination result that the read data is "not written" in, for example, the latch circuits SDL, ADL, BDL, CDL and XDL.

One end of the transistor 120 is connected to the power supply line, and a gate of the transistor 120 is connected to a node INV in the latch circuit SDL. One end of the transistor 121 is connected to the other end of the transistor 120, the other end of the transistor 121 is connected to a node SCOM, and a control signal BLX is input to a gate of the transistor 121. One end of the transistor 122 is connected to the node SCOM, and a control signal BLC is input to a gate of the transistor 122. The transistor 123 is a high breakdown voltage MOS transistor, and one end of the transistor 123 is connected to the other end of the transistor 122, the other end of the transistor 123 is connected to the corresponding bit line BL, and a gate of the transistor 123 receives a control signal BLS.

One end of the transistor 124 is connected to the node SCOM, the other end of the transistor 124 is connected to the node SRC, and a gate of the transistor 124 is connected to the node INV. One end of the transistor 125 is connected to the other end of the transistor 120, the other end of the transistor 125 is connected to the node SEN, and a control signal HHL is input to a gate of the transistor 125. One end of the transistor 126 is connected to a node SEN, the other end of the transistor 126 is connected to the node SCOM, and a control signal XXL is input to a gate of the transistor 126.

One end of the transistor 127 is grounded, and a gate of the transistor 127 is connected to the node SEN. One end of the transistor 128 is connected to the other end of the transistor 127, the other end of the transistor 128 is connected to the bus LBUS, and a control signal STB is input to the gate of the transistor 128. One end of the capacitor 129 is connected to the node SEN, and the other end of the capacitor 129 receives a clock CLK. For example, the clock CLK is supplied with the voltage VSS.

Control signals BLX, BLC, BLS, HHL, XXL, STI, STL and STB are generated, for example, by the sequencer 24. The voltage VDD, which is an internal power supply voltage of the semiconductor memory device 1, for example, is supplied to the power supply line connected to one end of the transistor 120, and the voltage VSS, which is a ground voltage of the semiconductor memory device 1, for example, is supplied to the node SRC.

The latch circuits SDL, ADL, BDL, CDL and XDL temporarily hold the read data DAT. The latch circuit XDL is connected to, for example, the register 25, and is used to input and output data between the sense amplifier unit SAU and the input/output circuit 22.

The latching circuit SDL includes, for example, inverters 130 and 131 and n-channel MOS transistors 132 and 133. An input node of the inverter 130 is connected to a node LAT, and an output node of the inverter 130 is connected to the node INV. An input node of the inverter 131 is connected to the node INV, and an output node of the inverter 131 is connected to the node LAT. One end of the transistor 132 is connected to the node INV, the other end of the transistor 132 is connected to the bus LBUS, and the control signal STI is input to a gate of the transistor 132. One end of the transistor 133 is connected to the node LAT, the other end of the transistor 133 is connected to the bus LBUS, and the control signal STL is input to a gate of the transistor 133. For example, data held in the node LAT corresponds to data held in the latch circuit SDL, and data held in the node INV corresponds to inverted data of data held in the node LAT. Circuit configurations of the latch circuit ADL, BDL, CDL and XDL are, for example, the same as a circuit configuration of the latch circuit SDL and therefore will not be described.

As described in "1-1-8. Threshold Distribution of Memory Cell Transistor MT", "1-1-9. Threshold Voltage Distribution of Erase Status", and the like, the EP program operation in the primary write operation is executed alternately with the EP verify operation, and the program voltage is stepwise increased by AVPGM every time the EP program operation is executed. For example, in the memory system 3, a stepwise increase is referred to as "step-up", and AVPGM is referred to as a step-up voltage. Further, as described in the "1-1-10. The Primary Write Operation" and the like, in the primary write operation, the primary write operation for the memory cell transistors MTo belonging to the odd-numbered word lines WLo (for example, WLo4) and the primary write operation for the memory cell transistors MTe belonging to the even-numbered word lines WLe (for example, WLe4) are alternately executed.

For example, in the EP verify operation for the memory cell transistors MTo belonging to the odd-numbered word lines WLo, the latch circuit ADL may store a result determined as "written" before step-up, a result determined as "not written" before step-up, a result determined as "written" after step-up, and a result determined as "not written" after step-up. In addition, the latch circuit BDL may store a result of determined as "written" before step-up, a result of determined as "not written" before step-up, a result of determined as "written" after step-up, a result of determined as "written" after step-up, and a result of determined as "not written" after step-up in the EP verify operation for the memory cell transistors MTe belonging to the even-numbered word lines WLe.

That is, since the sense amplifier unit SAU includes a plurality of latch circuits, the determination results before and after the step-up of the threshold voltage of the memory cell transistors MTo belonging to the odd-numbered word lines WLo and the determination results before and after the step-up of the threshold voltage of the memory cell transistors MTe belonging to the even-numbered word lines WLe can be held in the latch circuits. As a result, since the result of the determination that "written" is not reset, the determination result before the step-up in the memory cell transistors MTo can be taken over after the step-up.

Further, in the memory system 3, the primary write operation is executed a plurality of times and the data held in the latching circuits SDL, ADL, BDL, CDL and XDL may be reset each time the primary write operation is executed. In this case, the determination result of the threshold voltage of the memory cell transistors MTo belonging to the odd-numbered word lines WLo and the determination result of the threshold voltage of the memory cell transistors MTe belonging to the even-numbered word lines WLe are constantly updated, and the updated data is stored in the latch circuits. Therefore, the determination result for the odd-numbered word lines WLo and the determination result for the even-numbered word lines WLe do not need to be held in individual latching circuits. As a result, the amount of use of the latch circuit can be reduced, and in some cases, the number of latch circuits can be reduced.

In the sense amplifier unit SAU, timings at which the sense amplifier units SAU determine data to correspond to the threshold voltages read out to the bit lines BL are based on timings at which the control signal STB is asserted. In the semiconductor memory device 1, "the sequencer 24 asserts the control signal STB" corresponds to the sequencer 24 changing the control signal STB from the "L" level to the "H" level.

The configuration of the sense amplifier unit SAU is not limited to the configuration and the function described with reference to FIG. 56. For example, in the sense amplifier unit SAU, the transistor 128 to which the control STB is input may be a p-channel MOS transistor. Here, "the sequencer 24 asserts the control signal STB" corresponds to the sequencer 24 changing the control signal STB from the "H" level to the "L" level.

In addition, the number of latch circuits included in the sense amplifier unit SAU can be designed to be any number. The number of latch circuits is designed based on, for example, the number of bits of data held by one memory cell transistor MT. Further, a plurality of bit lines BL may be connected to one sense amplifier unit SAU via selectors.

In the above embodiments, in the case where the same notations are used, the word "same" may include a case where an error within the range of the design is included.

While several embodiments of the non-volatile semiconductor memory device of the present disclosure have been described above, these embodiments have been presented by way of example and are not intended to limit the scope of the invention. The novel embodiments described herein may be embodied in a variety of other forms and various omissions, substitutions and changes in the form of the embodiments described herein may be made without departing from the spirit of the inventions. These embodiments and variations thereof are included in the scope and spirit of the invention, and are included in the scope of the invention described in the claims and equivalents thereof.

What is claimed is:

1. A semiconductor memory device comprising:
a plurality of bit lines arranged in a first direction and each extending in a second direction crossing the first direction, the plurality of bit lines including a first bit line;
a first word line provided in a first layer extending in the first direction and the second direction;
a second word line provided in the first layer and controlled independently of the first word line;
a third word line extending in the first direction and the second direction and provided in a second layer adjacent to the first layer;
a fourth word line provided in the second layer and controlled independently of the third word line;
a fifth word line extending in the first direction and the second direction and provided in a third layer adjacent to the first layer on a side opposite to a side adjacent to the second layer;
a sixth word line provided in the third layer and controlled independently of the fifth word line;
a first memory cell facing the first word line;
a second memory cell facing the second word line;
a third memory cell facing the third word line;
a fourth memory cell facing the fourth word line;
a fifth memory cell facing the fifth word line;
a sixth memory cell facing the sixth word line;
a first memory pillar sandwiched between the first word line and the second word line, sandwiched between the third word line and the fourth word line, sandwiched between the fifth word line and the sixth word line, including the first memory cell, the second memory cell, the third memory cell, the fourth memory cell, the fifth memory cell and the sixth memory cell, electrically connected to the first bit line and extending in a third direction crossing the first direction and the second direction;
a first selection transistor electrically connected in series to the third memory cell, the first memory cell, and the fifth memory cell;
a second select transistor electrically connected in series to the fourth memory cell, the second memory cell, and the sixth memory cell;

a first select gate line stacked in the third direction, extending in the first direction, and electrically connected to the first select transistor;

a second select gate line stacked in the third direction, extending in the first direction, and electrically connected to the second select transistor; and a sequencer configured to execute an erase operation to set a threshold voltage in an erased state to be equal to or higher than a minimum voltage supplied during a reading operation for the first to sixth memory cells, a primary write operation after the erase operation, a secondary write operation after the primary write operation and a tertiary write operation after the secondary write operation;

wherein the sequencer executes the erase operation on the first to sixth memory cells, to enable execution of the primary write operation for the first memory cell and the primary write operation for the second memory cell at different timings, to enable execution of the primary write operation for the third memory cell and the primary write operation for the fourth memory cell at different timings, and to enable execution of the primary write operation for the fifth memory cell and the primary write operation for the sixth memory cell at different timings.

2. The semiconductor memory device according to claim 1, wherein the sequencer executes alternately the primary write operation for the first memory cell and the primary write operation for the second memory cell, to enable alternate execution of the primary write operation for the third memory cell and the primary write operation for the fourth memory cell, and to enable alternate execution of the primary write operation for the fifth memory cell and the primary write operation for the sixth memory cell.

3. The semiconductor memory device according to claim 2, wherein the plurality of bit lines further includes a second bit line, the semiconductor memory device further comprises:

a second memory pillar extending in the third direction and electrically connected to the second bit line;

a third select gate line stacked in the third direction and extending in the first direction;

a seventh memory cell facing the first word line;

an eighth memory cell facing the second word line;

a ninth memory cell facing the third word line;

a tenth memory cell facing the fourth word line;

an eleventh memory cell facing the fifth word line;

a twelfth memory cell facing the sixth word line;

a third select transistor electrically connected to the second select gate line and electrically connected in series to the tenth memory cell, the eighth memory cell and the twelfth memory cell and a fourth select transistor electrically connected to the third select gate line and electrically connected in series to the ninth memory cell, the seventh memory cell and the eleventh memory cell, wherein the second memory pillar, which is sandwiched between the first word line and the second word line, sandwiched between the third word line and the fourth word line and sandwiched between the fifth word line and the sixth word line, includes the seventh memory cell, the eighth memory cell, the ninth memory cell, the tenth memory cell, the eleventh memory cell, the twelfth memory cell, the third select transistor and the fourth select transistor, and the sequencer executes the erase operation on the seventh to the twelfth memory cell, executes alternately the primary write operation for the seventh memory cell and the primary write operation for the eighth memory cell, to enable alternate execution of the primary write operation for the ninth memory cell and the primary write operation for the tenth memory cell, and to enable alternate execution of the primary write operation for the eleventh memory cell and the primary write operation for the twelfth memory cell.

4. The semiconductor memory device according to claim 3, wherein the primary write operation includes a verify operation and a program operation, and the sequencer controls the primary write operation, the secondary write operation, and the tertiary write operation to be executable as a series of operations after completing the erase operation.

5. The semiconductor memory device according to claim 4, wherein the sequencer executes the secondary write operation on the first memory cell after executing the primary write operation on the first memory cell and the second memory cell.

6. The semiconductor memory device according to claim 5, wherein after executing the primary write operation on the fifth memory cell, the sixth memory cell, the third memory cell, and the fourth memory cell, the sequencer applies a negative voltage to the second word line, the fourth word line and the sixth word line, applies a first voltage to the first word line and executes the verify operation on the first memory cell, and applies a second voltage to the second to sixth word lines, applies a third voltage to the first word line, and is configured to execute the tertiary write operation on the first memory cell after executing the secondary write operation on the first memory cell.

7. The semiconductor memory device according to claim 5, wherein after executing the primary write operation on the fifth memory cell and the sixth memory cell, the sequencer applies a negative voltage to the second word line and the sixth word line, applies the first voltage to the first word line, and executes the verify operation on the first memory cell, and applies the second voltage to the second word line to the sixth word line, applies the third voltage to the first word line, executes the secondary write operation on the first memory cell, and is configured to execute the tertiary write operation on the first memory cell.

8. The semiconductor memory device according to claim 2, wherein the sequencer controls to execute the secondary write operation on the memory cells facing the word lines provided in the first layer after executing the primary write operation on the memory cells facing the word lines provided in the third layer and the first layer.

9. The semiconductor memory device according to claim 2, wherein the sequencer controls the primary write operation on each of the first memory cell and the second memory cell while controlling the first select gate line.

10. The semiconductor memory device according to claim 1, wherein
after executing the primary write operation on the fifth memory cell and the sixth memory cell,
the sequencer applies a negative voltage to the second word line, the fourth word line and the sixth word line, applies the first voltage to the first word line, and executes the verify operation on the first memory cell,
the sequencer is configured to execute the primary write operation by executing the program operation on the third memory cell after executing the verify operation, and
the sequencer is configured to execute the secondary operation on the sixth memory cell after executing the primary write operation.

11. The semiconductor memory device according to claim 1, further comprising
a sense amplifier module electrically connected to the first bit line and including a first latch circuit and a second latch circuit,
wherein
the primary write operation includes a verify operation and a program operation,
the first latch circuit is capable of holding a threshold voltage read from the first memory cell in the first verify operation and the second verify operation following the first verify operation, and
the second latch circuit is capable of holding a threshold voltage read from the second memory cell.

12. The semiconductor memory device according to claim 1, further comprising
a sense amplifier module electrically connected to the first bit line and including a latch circuit,
wherein
the primary write operation includes a verify operation and a program operation,
the latch circuit is capable of holding both a threshold voltage read from the first memory cell and a threshold voltage read from the second memory cell in the primary verify operation and the second verify operation following the first verify operation, and
before the latch circuit holds the threshold voltage read from the first memory cell and the threshold voltage read from the second memory cell in in the second verify operation, the sequencer resets the threshold voltage read from the first memory cell and held in the latch circuit and the threshold voltage read from the second memory cell and held in the latch circuit in the first verify operation.

13. The semiconductor memory device according to claim 3, wherein
the primary write operation includes a verify operation and a program operation, and
the sequencer executes the verify operation before executing the program operation.

* * * * *